US010930866B2

(12) United States Patent
Xia et al.

(10) Patent No.: US 10,930,866 B2
(45) Date of Patent: Feb. 23, 2021

(54) ORGANIC ELECTROLUMINESCENT MATERIALS AND DEVICES

(71) Applicant: Universal Display Corporation, Ewing, NJ (US)

(72) Inventors: Chuanjun Xia, Lawrenceville, NJ (US); Jui-Yi Tsai, Newtown, PA (US); Beatriz Eguillor Armendariz, Saragossa (ES); Miguel A. Esteruelas Rodrigo, Saragossa (ES); Roberto Gomez Alabau, Saragossa (ES); Montserrat Olivan Esco, Saragossa (ES); Enrique Onate Rodriguez, Saragossa (ES)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 16/784,609

(22) Filed: Feb. 7, 2020

(65) Prior Publication Data

US 2020/0176694 A1 Jun. 4, 2020

Related U.S. Application Data

(63) Continuation of application No. 15/594,046, filed on May 12, 2017, now abandoned, which is a continuation of application No. 13/950,591, filed on Jul. 25, 2013, now abandoned.

(51) Int. Cl.
| | |
|---|---|
| *C07F 15/00* | (2006.01) |
| *H01L 51/00* | (2006.01) |
| *C09K 11/06* | (2006.01) |
| *C09K 11/02* | (2006.01) |
| *H01L 51/50* | (2006.01) |

(52) U.S. Cl.
CPC ........ *H01L 51/0088* (2013.01); *C07F 15/002* (2013.01); *C09K 11/025* (2013.01); *C09K 11/06* (2013.01); *H01L 51/0054* (2013.01); *H01L 51/0058* (2013.01); *H01L 51/0067* (2013.01); *H01L 51/0072* (2013.01); *H01L 51/0074* (2013.01); *C09K 2211/1007* (2013.01); *C09K 2211/1044* (2013.01); *C09K 2211/1088* (2013.01); *C09K 2211/185* (2013.01); *H01L 51/5016* (2013.01)

(58) Field of Classification Search
CPC ............ H01L 51/0088; H01L 51/0054; H01L 51/0058; H01L 51/0067; H01L 51/0072; H01L 51/0074; H01L 51/5016; C07F 15/002; C09K 11/025; C09K 11/06; C09K 2211/1007; C09K 2211/1044; C09K 2211/1088; C09K 2211/185
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

R. Alabau et al., 33 Organometallics, 5582-5596 (2014) (Year: 2014).*
M. Baya et al., 26 Organometallics, 6556-6563 (2007) (Year: 2007).*
European Search Report and Preliminary Opinion dated Nov. 18, 2014 for corresponding EP Application No. 14178251.6.
Kellen Chen et al., Osmium Complexes with Tridentate 6-Pyrazol-3-yl 2,2'-Bipyridine Ligands: Coarse Tuning of Phosphorescence from the Red to the Near-Infrared Region, Chem. Asian J. Jan. 8, 2007, vol. 2, Issue 1, pp. 155-163.
Collin, Jean-Paul et al., "Synthesis of Functionalized Asymmetrical Bis(terpyridine)osmium(II) Complexes under Mild Conditions", Inorg. Chem. 1990, 29, 5009-5010.

(Continued)

*Primary Examiner* — Alexander R Pagano
(74) *Attorney, Agent, or Firm* — Duane Morris LLP

(57) ABSTRACT

A method of making an osmium(II) complex having Formula I, $L^1$-Os-$L^2$, wherein $L^1$ and $L^2$ are independently a biscarbene tridentate ligand, wherein $L^1$ and $L^2$ can be same or different is disclosed. The method includes (a) reacting a precursor of ligand $L^1$ with an osmium precursor to form an intermediate product, wherein the osmium precursor having the formula $OsH_x(PR_3)_y$, wherein x is an integer from 2 to 6 and y is an integer from 2 to 5, and R is selected from the group consisting of aryl, alkyl and cycloalkyl; and (b) reacting a precursor of ligand $L^2$ with said intermediate product.

16 Claims, 4 Drawing Sheets

(56) References Cited

U.S. PATENT DOCUMENTS

| | | |
|---|---|---|
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 8,563,737 B2 * | 10/2013 | Tsai ................ C07F 7/0812 548/103 |
| 9,748,504 B2 * | 8/2017 | Xia ................ H01L 51/0088 |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 * | 11/2005 | Walters ............ H01L 51/0088 428/690 |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0092854 A1 * | 4/2009 | Walters .............. C07F 15/002 428/691 |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0115322 A1 | 5/2009 | Walters et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2011/0057559 A1 | 3/2011 | Xia |
| 2011/0062858 A1 | 3/2011 | Yersin et al. |
| 2012/0215000 A1 * | 8/2012 | Tsai ................ C07F 3/003 546/4 |
| 2012/0223634 A1 * | 9/2012 | Xia ................ H01L 51/0094 313/504 |
| 2012/0228583 A1 * | 9/2012 | Wu ................ C07F 15/0033 257/40 |
| 2013/0082245 A1 * | 4/2013 | Kottas ............ H01L 51/0087 257/40 |
| 2014/0084261 A1 * | 3/2014 | Brooks ............ H01L 51/0074 257/40 |
| 2014/0138653 A1 * | 5/2014 | Tsai ................ C09K 11/06 257/40 |
| 2015/0028290 A1 * | 1/2015 | Xia ................ H01L 51/0067 257/40 |
| 2015/0129840 A1 * | 5/2015 | Tsai ................ H01L 51/0088 257/40 |
| 2015/0194612 A1 * | 7/2015 | Tsai ................ C09K 11/06 257/40 |
| 2015/0214494 A1 * | 7/2015 | Xia ................ C07F 15/0033 257/40 |
| 2015/0236276 A1 * | 8/2015 | Boudreault ........ H01L 51/0085 257/40 |
| 2015/0249223 A1 * | 9/2015 | Szigethy ............ H01L 51/0058 257/40 |
| 2015/0280146 A1 * | 10/2015 | Xia ................ H01L 51/0088 257/40 |
| 2016/0141522 A1 * | 5/2016 | Ma ................ H01L 51/0072 257/40 |
| 2016/0181529 A1 * | 6/2016 | Tsai ................ H01L 51/009 257/40 |
| 2016/0218303 A1 * | 7/2016 | Kwong ............ C09K 11/025 |
| 2016/0233424 A1 * | 8/2016 | Kwong ............ C09K 11/025 |
| 2016/0240799 A1 * | 8/2016 | Tsai ................ C09K 11/06 |
| 2017/0040554 A1 * | 2/2017 | Brooks ............ C09K 11/025 |
| 2018/0370999 A1 * | 12/2018 | Tsai ................ H01L 51/0072 |
| 2019/0214583 A1 * | 7/2019 | Ji ................ H01L 51/0054 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| JP | 2009532431 | 9/2009 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 04107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2007115970 | 10/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009046266 | 4/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |

(56) References Cited

FOREIGN PATENT DOCUMENTS

| WO | 2009100991 | 8/2009 |
|---|---|---|
| WO | 2012116234 | 8/2012 |

OTHER PUBLICATIONS

Office Action dated Mar. 10, 2020 in corresponding Korean Patent Application No. 10-2014-0078833.
Adachi, Chihaya et al., "Organic Electroluminescent Device Having a Hole Conductor as an Emitting Layer," Appl. Phys. Lett., 55(15): 1489-1491 (1989).
Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 1, 4-6 (1999).
Gao, Zhibiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato) beryllium as an Emitter, " Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7)1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic LIght-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).

(56) References Cited

OTHER PUBLICATIONS

Wang, Y. et al., "Highly Efficient Electroluminescent Materials Based on Fluorinated Organometallic Iridium Compounds," Appl. Phys. Lett., 79(4):449-451 (2001).

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

Notice of Reasons for Rejection dated Nov. 21, 2017 for corresponding JP Application No. 2014-150441.

* cited by examiner

ORGANIC ELECTROLUMINESCENT MATERIALS AND DEVICES

CROSS-REFERENCE TO RELATED APPLICATIONS

This application is a continuation of U.S. application Ser. No. 15/594,046, filed May 12, 2017, which is a continuation of U.S. application Ser. No. 13/950,591, filed Jul. 25, 2013, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to compounds for use as emitters and devices, such as organic light emitting diodes, including the same. More particularly, the compounds disclosed herein are novel heteroleptic bistridentate osmium carbene complexes and a novel synthetic method to make both homoleptic and heteroleptic bistridentate osmium carbene complexes.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

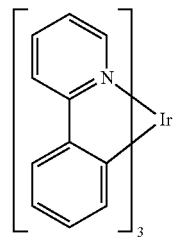

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an aspect of the present disclosure, a method of making an osmium(II) complex having Formula I $L^1$-Os-$L^2$, wherein $L^1$ and $L^2$ are independently a biscarbene tridentate ligand, wherein $L^1$ and $L^2$ can be same or different is disclosed. The method comprises: (a) reacting a precursor of ligand $L^1$ with an osmium precursor to form an intermediate product, wherein the osmium precursor having the formula $OsH_x(PR_3)_y$, wherein x is an integer from 2 to 6 and y is an integer from 2 to 5, and R is selected from the group consisting of aryl, alkyl and cycloalkyl; and (b) reacting a precursor of ligand $L^2$ with said intermediate product.

In one embodiment of the method, $L^1$ and $L^2$ are monoanionic ligands. In some embodiments, $L^1$ and $L^2$ are independently selected from ligands having Formula II:

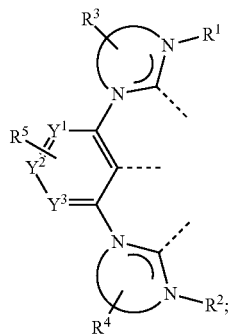

wherein $Y^1$, $Y^2$ and $Y^3$ comprise C or N; wherein $R^3$ and $R^4$ may represent mono-, or di-substitutions, or no substitution; wherein $R^5$ may represent mono-, di-, or tri-substitutions, or no substitution; wherein $R^1$, $R^2$, $R^3$, $R^4$ and $R^5$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; wherein any two adjacent substituents of $R^1$, $R^2$, $R^3$, $R^4$ and $R^5$ are optionally joined to form a ring; and wherein the dash lines show the connection points to osmium.

According to an embodiment, a compound having the structure according to Formula I as defined herein is disclosed.

According to another aspect of the present disclosure, a first device comprising a first organic light emitting device is disclosed. The first organic light emitting device comprises an anode; a cathode; and an organic layer, disposed between the anode and the cathode. The organic layer can comprise a compound having the structure according to Formula I The novel compounds, heteroleptic bistridentate osmium carbene complexes, and a novel synthetic method to make both homoleptic and heteroleptic bistridentate osmium carbene complexes disclosed herein are useful as emitters in organic light emitting devices. The inventors have discovered that the incorporation of these ligands can narrow the emission spectrum and improve device efficiency.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
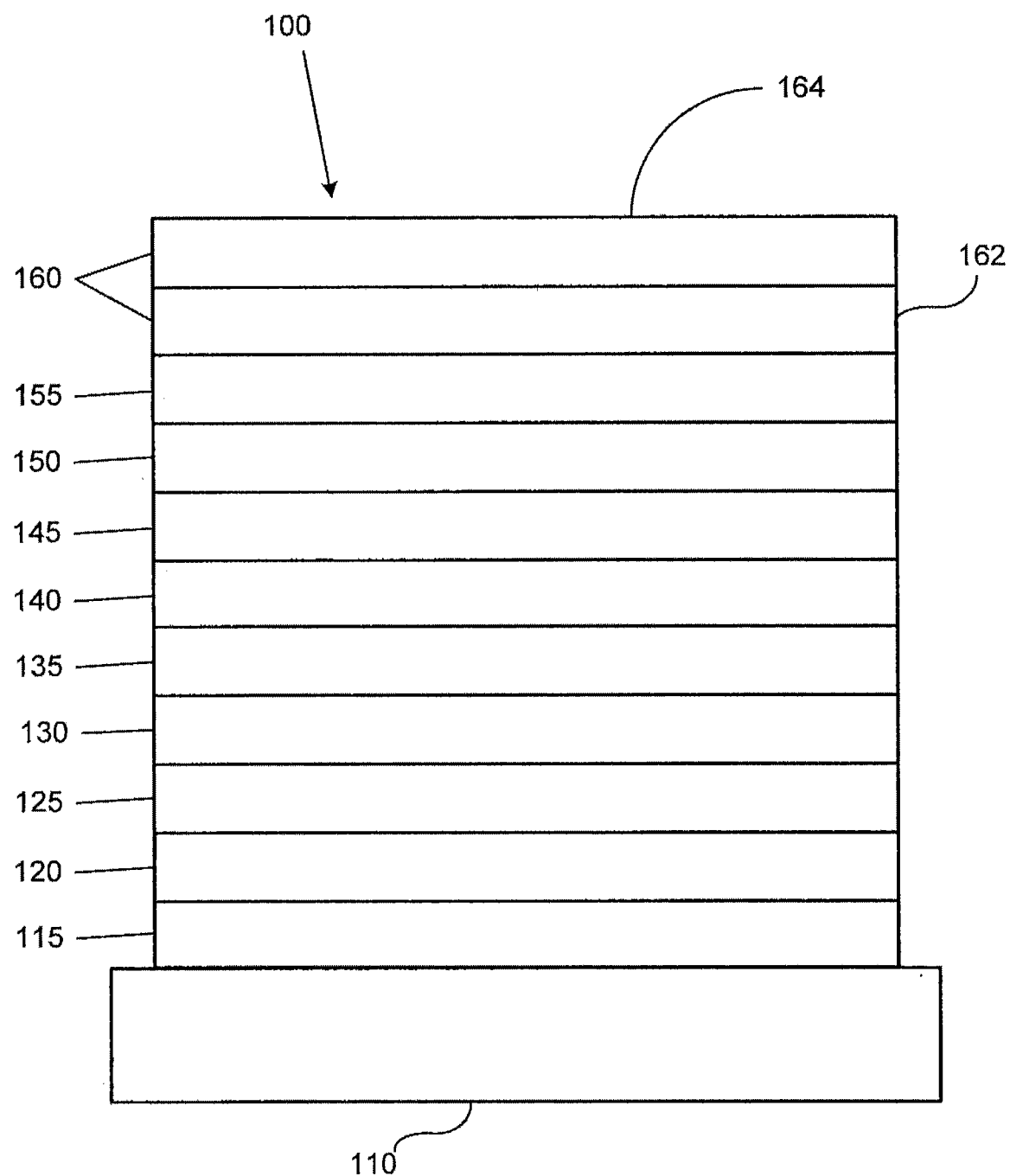
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/01741.16, which is incorporated by reference in its entirety.

Figure 2:
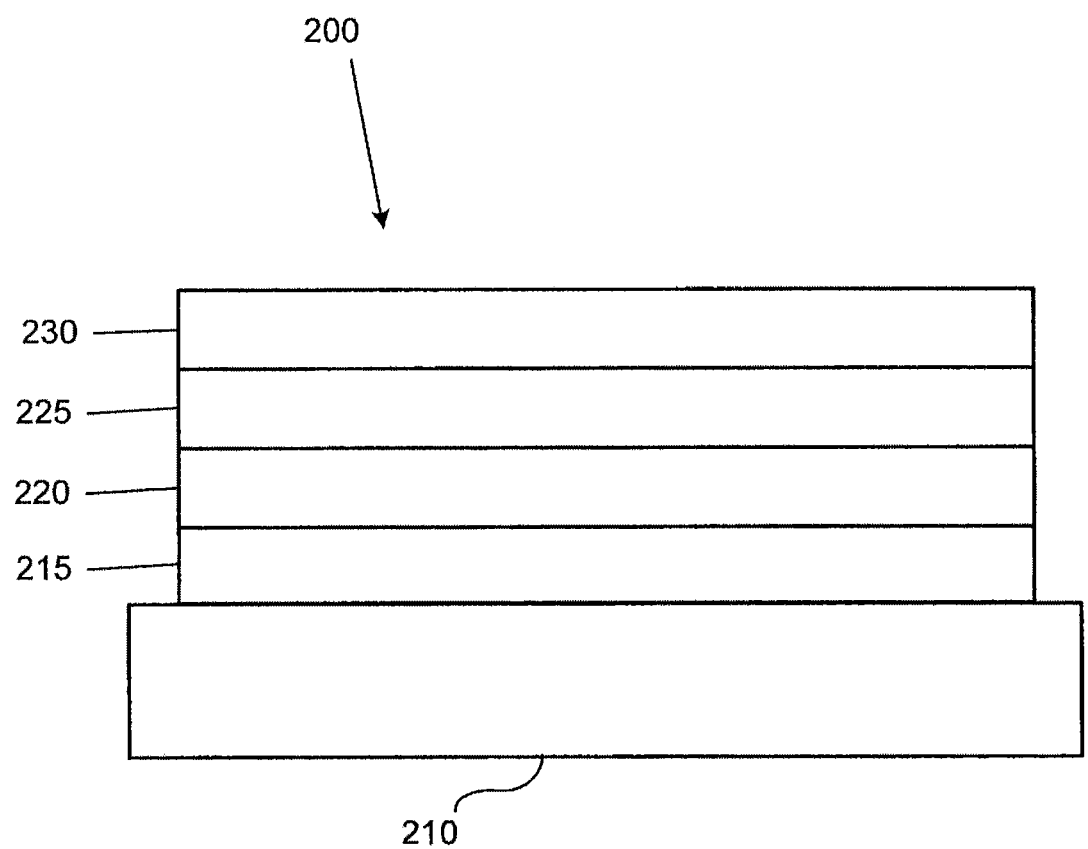
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/

US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

As used herein, "substituted" indicates that a substituent other than H is bonded to the relevant carbon. Thus, where $R^2$ is monosubstituted, then one $R^2$ must be other than H. Similarly, where $R^3$ is disubstituted, then two of $R^3$ must be other than H. Similarly, where $R^2$ is unsubstituted $R^2$ is hydrogen for all available positions.

In the present disclosure, novel heteroleptic bistridentate Os(II) complexes and a novel method for synthesizing both homoleptic and heteroleptic bistridentate Os(II) complexes is provided. Heteroleptic osmium complexes provide great freedom of tuning emission color, electrochemical energy levels, and improving evaporation properties.

Osmium (II) complexes have been investigated for OLED applications. The octahedral ligand arrangement of the Os(II) complexes resembles that of Ir(III) complexes. Os(II) complexes generally exhibit low oxidation potential, i.e. shallow HOMO energy level than Ir(III) complexes. The inventors have discovered that bistridentate Os(II) carbene complexes offer performance advantages for OLED applications. Without being bound to a theory, the inventors believe that the rigid nature of the tridentate ligands are providing narrow emission line widths and short excited state lifetimes, which can result in better color purity and longer device lifetime, making them suitable for display applications.

US2005260449 and WO2009046266 disclosed bistridentate Os(II) complexes. Examples of homoleptic Os(II) complexes were provided. The two tridentate ligands binding to Os(II) metal are identical. It may be beneficial to incorporate two different ligands to Os(II) metal to form a heterlopetic complex. For example, the thermal properties, electrochemical properties, and photophysical properties can be tuned by selecting two proper ligands. It offers more flexibility for materials design than two identical ligands.

The synthesis of homoleptic complexes, however, has been challenging; let alone the heteroleptic complexes. The synthesis method used in WO2009046266 generated very low yield, typically 2-5%. In a later application, US2012215000, the yield was significantly improved to over 30% using a new osmium precursor. In theory, both of these methods should work for synthesis of heteroleptic bistridentate Os(II) complexes by introducing two different ligands at the complexation stage and isolating the desired heteroleptic complex from the reaction mixture. The synthesis will be extremely inefficient and impractical.

The inventors have developed a new stepwise complexation method. This method is suitable for making both homoleptic and heteroleptic bistridentate Os(II) complexes. As shown in the scheme below, an osmium precursor was first reacted with a bistridentate ligand to generate an intermediate that has one tridentate ligand coordinated to the metal. The intermediate was then treated with another tridentate ligand to generate the final complex. Depending on the structure of the second ligand, homoleptic or heteroleptic complexes can be synthesized. In addition, the yield was improved. One example of the inventive synthetic method is shown below:

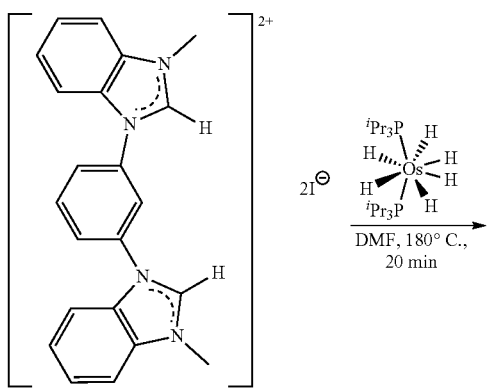

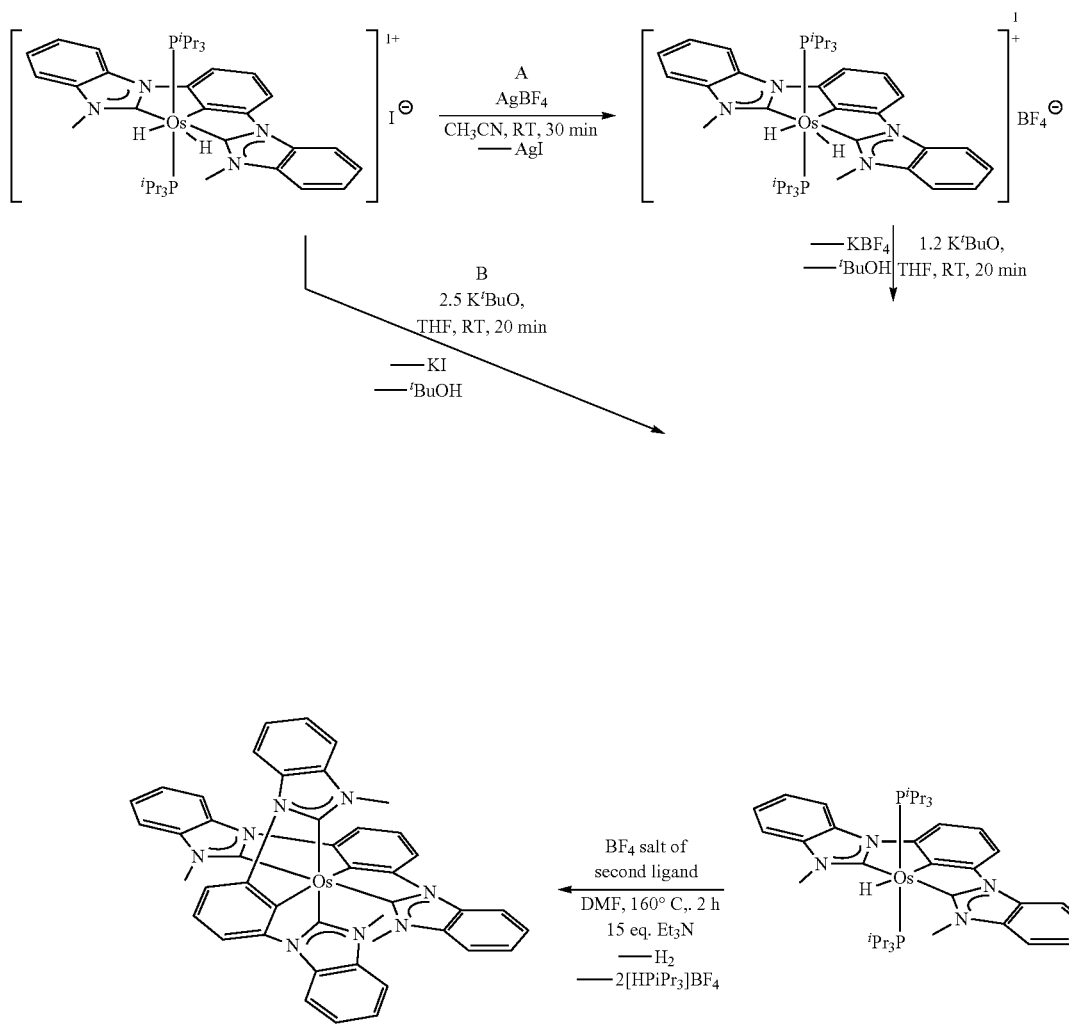

In describing the novel synthesis method of the inventors, all reactions were carried out with rigorous exclusion of air using Schlenk-tube techniques. Solvents, except DMF and acetonitrile that were dried and distilled under argon, were obtained oxygen- and water-free from an MBraun solvent purification apparatus. $^1$H, $^{31}$P{$^1$H}, $^{19}$F and $^{13}$C{$^1$H} NMR spectra were recorded on Bruker 300 ARX, Bruker Avance 300 MHz, and Bruker Avance 400 MHz instruments. Chemical shifts (expressed in parts per million) are referenced to residual solvent peaks ($^1$H, $^{13}$C{$^1$H}) or external 85% $H_3PO_4$ ($^{31}$P{$^1$H}), or external $CFCl_3$ ($^{19}$F). Coupling constants J and N are given in hertz. Attenuated total reflection infrared spectra (ATR-IR) of solid samples were run on a Perkin-Elmer Spectrum 100 FT-IR spectrometer. C, H, and N analyses were carried out in a Perkin-Elmer 2400 CHNS/O analyzer. High-resolution electrospray mass spectra were acquired using a MicroTOF-Q hybrid quadrupole time-of-flight spectrometer (Bruker Daltonics, Bremen, Germany). $OsH_6(P^iPr_3)_2$ was prepared by the method published in Aracama, M.; Esteruelas, M. A.; Lahoz, F. J.; López, J. A.; Meyer, U.; Oro, L. A.; Werner, H. *Inorg. Chem.* 1991, 30, 288.

Preparation of Dihydride-BF4

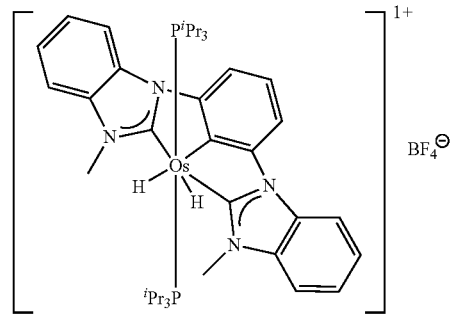

A solution of $OsH_6(P^iPr_3)_2$ (261 mg, 0.505 mmol) in dimethylformamide (DMF) (5 mL) was treated with 1,3-bis[(1-methyl)benzylimidazolium-3-yl]benzene diiodide (300 mg, 0.505 mmol). The resulting mixture was refluxed for 20 min, getting a very dark solution. After cooling at room temperature the solvent was removed in vacuo, affording a dark residue. The residue was dissolved in acetonitrile (10 mL)

and AgBF$_4$ (98.3 mg, 0.505 mmol) was added. After stirring protected from the light for 30 min the resulting suspension was filtered through Celite to remove the silver salts. The solution thus obtained was evaporated to ca. 0.5 mL and diethyl ether (10 mL) was added to afford a beige solid, that was washed with further portions of diethyl ether (2×2 mL) and dried in vacuo. Yield: 240 mg (50%). Analytical Calculation for C$_{40}$H$_{61}$BF$_4$N$_4$OsP$_2$: C, 51.28; H, 6.56; N, 5.98. Found: C, 51.55; H, 6.70; N, 5.62. HRMS (electrospray, m/z): calcd for C$_{40}$H$_{61}$N$_4$OsP$_2$ [M]$^+$: 851.3983; found: 851.4036. IR (cm$^{-1}$): v(Os—H) 2104 (w), v(BF$_4$) 1080-1000 (vs). $^1$H NMR (300 MHz, CD$_3$CN, 298K): δ 8.31 (m, 2H, CH bzm), 7.98 (d, J$_{H-H}$=7.9, 2H, CH Ph), 7.70 (m, 2H, CH bzm), 7.57 (t, J$_{H-H}$=7.9, 1H, CH Ph), 7.54-7.50 (m, 4H, CH bzm), 4.32 (s, 6H, CH$_3$), 1.54 (m, 6H, PCH(CH$_3$)$_2$), 0.67 (dvt, J$_{HH}$=6.2, N=13.2, 36H, PCH(CH$_3$)$_2$), −6.25 (t, J$_{H-P}$=13.6, 2H, Os—H). $^{13}$C{$^1$H} NMR (75.42 MHz, CD$_3$CN, 293K): δ 189.4 (t, J$_{C-P}$=7.5, NCN), 161.3 (Os—C), 146.9 (s, C Ph), 137.3 (s, C Bzm), 132.8 (s, C Bzm), 124.9 (s, CH Bzm), 124.5 (s, CH Bzm), 124.2 (s, CH Ph), 112.8 (s, CH Bzm), 111.9 (s, CH Bzm), 109.2 (s, CH Ph), 38.9 (s, CH$_3$), 29.3 (t, N=27, PCH(CH$_3$)$_2$), 18.5 (s, PCH(CH$_3$)$_2$). $^{31}$P{$^1$H} NMR (121.4 MHz, CD$_3$CN, 293K): δ 4.5 (s).

Preparation of Complex Monohydride, Shown Below

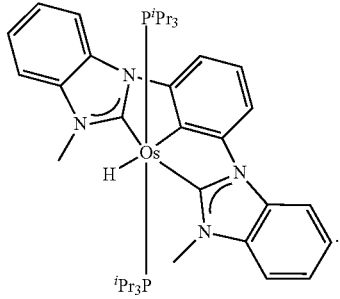

Figure 3:
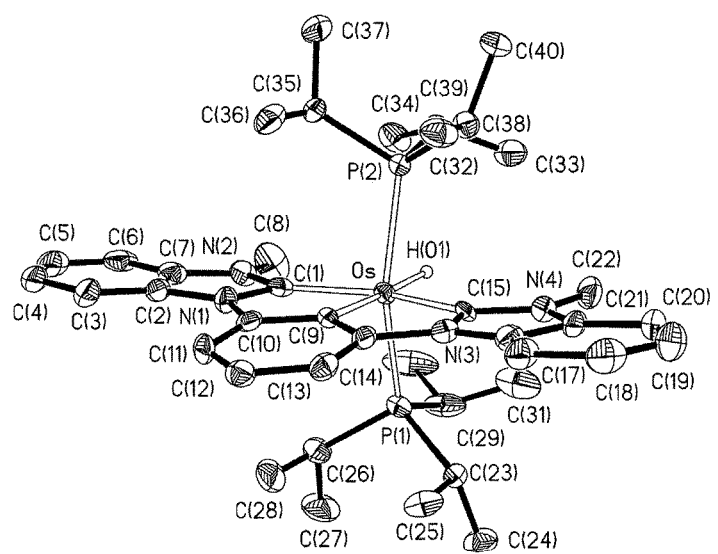
FIG. 3 shows molecular diagram of complex monohydride with X-ray diffraction analysis characterization.

This monohydride compound can be prepared by using two different methods. Method (A): A solution of OsH$_6$(P$^i$Pr$_3$)$_2$ (261 mg, 0.505 mmol) in DMF (5 mL) was treated with 1,3-bis[(1-methyl)benzylimidazolium-3-yl]benzene diiodide (300 mg, 0.505 mmol). The resulting mixture was refluxed for 20 min, getting a very dark solution. After cooling at room temperature the solvent was removed in vacuo, affording a dark residue. The dark residue was dissolved in 10 mL of tetrahydrofuran (THF) and K$^t$BuO (142 mg, 1.263 mmol) was added to the solution. After stirring at room temperature for 10 min the resulting suspension was filtered through Celite to remove the potassium salts. The solution thus obtained was evaporated to dryness to afford a yellow residue. Addition of pentane afforded a yellow solid, which was washed with pentane (1×2 mL) and dried in vacuo to obtain a yellow solid. Yield: 378 mg (88%). Method (B): A solution of dihydride-BF4 (200 mg, 0.213 mmol) in THF (5 mL) was treated with K$^t$BuO (28.6 mg, 0.255 mmol). After stirring at room temperature for 10 min the resulting suspension was filtered through Celite to remove the potassium salts. The solution thus obtained was evaporated to dryness to afford a yellow residue. Addition of pentane afforded a yellow solid, which was washed with pentane (1×2 mL) and dried in vacuo obtain a yellow solid. Yield: 163 mg (90%). Anal. Calcd. for C$_{40}$H$_{60}$N$_4$OsP$_2$: C, 56.58; H, 7.12; N, 6.60. Found: C, 56.00; H, 6.69; N, 6.76. HRMS (electrospray, m/z): calcd. For [M+H]$^+$ 851.3983; found: 851.3979. IR (cm$^{-1}$): v(Os—H) 1889 (w). $^1$H NMR (300 MHz, C$_6$D$_6$, 298K): δ 8.17 (d, J$_{H-H}$=7.7, 2H, CH Ph), 8.06 (d, J$_{H-H}$=7.7, 2H, CH bzm), 7.60 (t, J$_{H-H}$=7.7, 1H, CH Ph), 7.20 (td, J$_{H-H}$=7.9, J$_{H-H}$=1.0, 2H, CH bzm), 7.14-7.03 (m, 4H CH bzm), 3.92 (s, 6H, CH$_3$), 1.55 (m, 6H, PCH (CH$_3$)$_2$), 0.67 (dvt, J$_{HH}$=6.9, N=12.3, 36H, PCH(CH$_3$)$_2$), −9.55 (t, J$_{H-P}$=33.6, 1H, Os—H). $^{13}$C{$^1$H} NMR (75.42 MHz, C$_6$D$_6$, 293K): δ 197.6 (t, J$_{C-P}$=9.2, Os—NCN), 173.2 (t, J$_{C-P}$=2.9, Os—C), 148.4 (s, CPh), 137.3 (s, C Bzm), 134.4 (s, C Bzm), 121.5 (s, CH Bzm), 121.2 (s, CH Bzm), 117.9 (s, CH Ph), 109.6 (s, CH Bzm), 108.5 (s, CH Bzm), 105.8 (s, CH Ph), 37.9 (s, CH$_3$), 31.0 (t, N=24.2, PCH (CH$_3$)$_2$), 19.7 (s, PCH(CH$_3$)$_2$). $^{31}$P{$^1$H} NMR (121.4 MHz, C$_6$D$_6$, 293K): δ 20.6 (s, doublet under off resonance conditions). FIG. 3 shows the molecular structure of complex monohydride with the X-ray diffraction analysis characterization. Selected bond lengths (Å) and angles (°) were: Os—P(1)=2.3512(18), Os—P(2)=2.3529(17), Os—C(1)=2.052(6), Os—C(9)=2.036(3), Os—C(15)=2.035(6); P(1)-Os—P(2)=152.86(6), C(1)-Os—C(9)=75.5(2), C(9)-Os—C(15)=75.4(2), C(1)-Os(C15)=150.9(2).

Preparation of Complex Monohydride-CF$_3$:

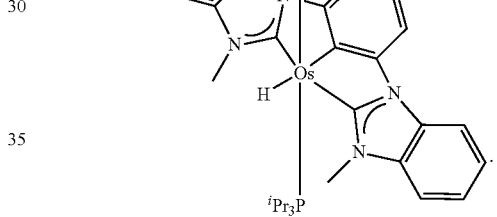

Method (A): A solution of dihydride-CF$_3$—BF4 (200 mg, 0.2 mmol) in THF (5 mL) was treated with K$^t$BuO (26.8 mg, 0.24 mmol). After stirring at room temperature for 10 min the resulting suspension was filtered through Celite to remove the potassium salts. The solution thus obtained was evaporated to dryness to afford a yellow residue. Addition of pentane afforded a yellow solid, which was washed with pentane (1×2 mL) and dried in vacuo obtain a yellow solid. Yield: 240 mg (50%). Anal. Calcd. for C$_{41}$H$_{59}$F$_3$N$_4$OsP$_2$: C, 53.69; H, 6.48; N, 6.11. Found: C, 53.20; H, 6.33; N, 6.18; IR (cm$^{-1}$): v(Os—H) 1842 (w). $^1$H NMR (300 MHz, C$_6$D$_6$, 298K): δ 8.53 (s, 2H, CH Ph-CF$_3$), 8.18 (m, 2H, CH bzm), 7.15-6.98 (m, 6H, CH bzm), 3.86 (s, 6H, CH$_3$), 1.49 (m, 6H, PCH(CH$_3$)$_2$), 0.60 (dvt, J$_{HH}$=6.6, N=12.9, 36H, PCH(CH$_3$)$_2$), −9.29 (t, J$_{H-P}$=34.0, 1H, Os—H). $^{13}$C{$^1$H} NMR (75.42 MHz, C$_6$D$_6$, 293K): δ 197.4 (t, J$_{C-P}$=9.0, Os—NCN), 173.2 (t, J$_{C-P}$=3.6, Os—C), 148.0 (s, C Ph), 137.2 (s, C Bzm), 133.9 (s, C Bzm), 128.2 (q, J$_{C-F}$=270.0, CF$_3$), 122.0 (s, CH Bzm), 121.7 (s, CH Bzm), 118.9 (q, J$_{C-F}$=30.8, C—CF$_3$), 109.8 (s, CH Bzm), 108.7 (s, CH Bzm), 102.0 (q, J$_{C-F}$=4.0 CH Ph), 37.9 (s, CH$_3$), 30.9 (t, N=24.8, PCH(CH$_3$)$_2$), 19.5 (s, PCH(CH$_3$)$_2$). $^{31}$P{$^1$H} NMR (121.4 MHz, C$_6$D$_6$, 293K): δ 21.4 (s, doublet under off resonance conditions). $^{19}$F NMR 282 MHz, C$_6$D$_6$, 293K): δ −60.10 (CF$_3$). Method (B): A solution of OsH$_6$(P$^i$Pr$_3$)$_2$ (235 mg, 0.455 mmol) in DMF (5 mL) was treated with 1,3-bis [(1-methyl)benzylimidazolium-3-yl]-5-trifluoromethyl-benzene diiodide (300 mg, 0.455 mmol). The resulting mixture was refluxed for 20 min, getting a very dark solution. After cooling at room temperature the solvent was removed in vacuo, affording a dark residue. The addition of 4 mL of toluene caused the precipitation of a brown solid that was washed with further portions of diethyl ether (2×4 mL). The brown solid was dissolved in THF (10 mL) and K$^t$BuO (102 mg, 0.906 mmol) was added. After stirring for 20 min the resulting suspension was filtered through Celite to remove the iodide salts. The solution thus obtained was evaporated to dryness and pentane (4 mL) was added to afford an orange solid that was washed with further portions of pentane (1×3 mL) and dried in vacuo. This orange solid was suspended in diethyl ether (10 mL) and treated with HBF$_4$:Et$_2$O (93 μL, 0.680 mmol) getting a white suspension. This solid was decanted, washed with further portions of diethyl ether (2×4 mL) and dried in vacuo. Yield: 405 mg (89%) Anal. Calcd. for C$_{41}$H$_{60}$BF$_7$N$_4$OsP$_2$: C, 49.00; H, 6.02; N, 5.58. Found: C, 49.21; H, 5.79; N, 5.69. HRMS (electrospray, m/z): calcd for [M]+: 919.3857; found: 919.4035. IR (cm$^{-1}$): ν(Os—H) 2097 (w), ν(BF$_4$) 1080-1000 (vs). $^1$H NMR (300 MHz, CD$_3$CN, 298K): δ 9.60 (m, 2H, CH bzm), 9.41 (s, 2H, CH Ph), 8.96 (m, 2H, CH bzm), 8.80 (m, 4H, CH bzm), 5.57 (s, 6H, CH$_3$), 2.80 (m, 6H, CH$_P$), 1.91 (dvt, 36H, J$_{HH}$=7.1, N=13.5, CH$_{3-P}$), -4.70 (t, 2H, J$_{H-P}$=13.5, H$_{hyd}$); $^{13}$C{$^1$H} NMR (75.42 MHz, CD$_3$CN, 293K): δ 189.6 (t, J$_{C-P}$=7.5, NCN), 169.6 (t, J$_{C-P}$=5.7, Os—C), 146.7 (s, C Ph), 137.4 (s, C Bzm), 132.6 (s, C Bzm), 126.7 (q, J$_{C-P}$=270, CF$_3$), 126.3 (q, J$_{C-F}$=28.6, CCF$_3$), 125.4 (s, CH Bzm), 125.1 (s, CH Bzm), 113.2 (s, CH Bzm), 112.3 (s, CH Bzm), 105.6 (q, J$_{C-F}$=3.9, CH Ph), 39.1 (s, CH$_3$), 29.5 (t, N=13.5, PCH (CH$_3$)$_2$), 19.6 (s, PCH(CH$_3$)$_2$). $^{31}$P{$^1$H} NMR (121.4 MHz, CD$_3$CN, 293K): δ 5.2 (s). $^{19}$F{$^1$H} NMR (282 MHz, CD$_3$CN, 293K): δ -60.21 (s, CF$_3$); -151.7 (broad signal, BF$_4$)

Preparation of Complex A

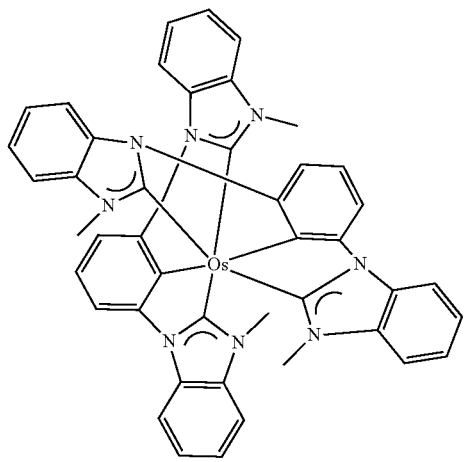

Figure 4:
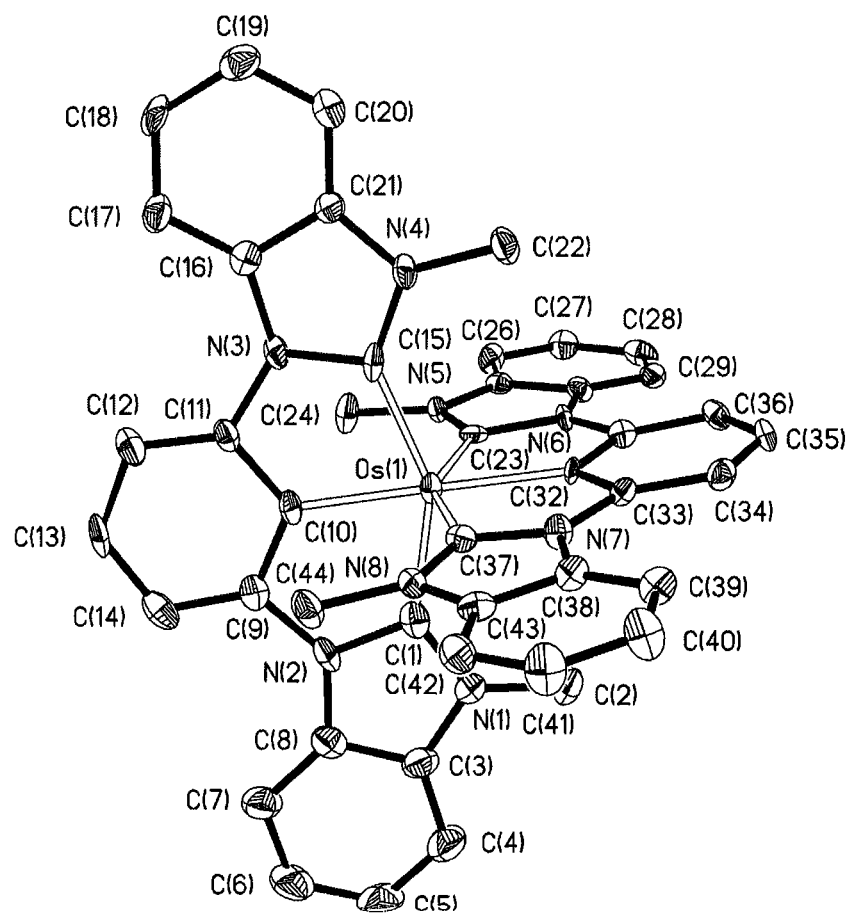
FIG. 4 shows molecular diagram of Complex A with X-ray diffraction analysis characterization.

Monohydride (250 mg, 0.294 mmol) and 1,3-bis[(1-methyl)benzylimidazolium-3-yl]benzene ditetrafluoroborate (181 mg, 0.353 mmol) were dissolved in 5 mL of DMF and triethyl amine (0.6 mL, 4.4 mmol) was added to the solution. The resulting mixture was refluxed for 1.5 h and then it was cooled to room temperature. The solvent was evaporated under vacuum to afford a brown residue. Addition of acetonitrile afforded a bright yellow solid that was washed with acetonitrile (1×2 mL) and dried in vacuo. Yield: 153 mg (60%). HRMS (electrospray, m/z): calcd for C$_{44}$H$_{34}$N$_8$Os [M]+: 867.2562; found: 867.2597. $^1$H NMR (300 MHz, C$_6$D$_6$, 293K): δ 8.29 (d, J$_{H-H}$=7.7, 4H, CH Ph), 8.18 (d, J$_{H-H}$=7.9, 4H, CH bzm), 7.81 (t, J$_{H-H}$=7.7, 2H, CH Ph), 7.08 (td, J$_{H-H}$=7.9, J$_{H-H}$=1.0, 4H, CH bzm), 6.80 (td, J$_{H-H}$=7.9, J$_{H-H}$=1.0, 4H, CH bzm), 6.18 (d, J$_{H-H}$=7.9, 4H, CH bzm), 2.25 (s, 12H, CH$_3$). $^{13}$C{$^1$H} NMR (75.42 MHz, C$_6$D$_6$, 293K): δ 192.6 (s, Os—NCN), 171.1 (s, Os—C), 146.8 (s, CPh), 137.2 (s, C Bzm), 133.4 (s, C Bzm), 121.43 (s, CH Bzm), 121.03 (s, CH Bzm), 117.8 (s, CH Ph), 109.9 (s, CH Bzm), 109.0 (s, CH Bzm), 106.4 (s, CH Ph), 32.7 (s, CH$_3$). FIG. 4 shows molecular diagram of Complex A with X-ray diffraction analysis characterization. The structure has two chemically equivalent but crystallographically independent molecul as in the asymmetric unit. Selected bond lengths (Å) and angles (°): Os(1)-C(10)=2.048(7), 2.057(7), Os(1)-C(32)=2.045(7), 2.049(8), Os(1)-C(15)=2.026(8), 2.032(8), Os(1)-C(1)=2.042(8), 2.037(7), Os(1)-C(23)=2.049(7), 2.037(8), Os(1)-C(37)=2.043(7), 2.051(8); C(15)-Os(1)-C(1)=149.6(3), 149.9(3), C(23)-Os(1)-C(37)=150.0(3), 150.6 (3), C(10)-Os(1)-C(32) 177.8(3), 178.6(3).

Preparation of Complex A-CF$_3$

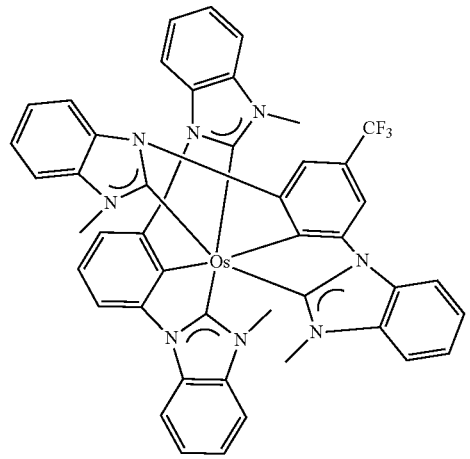

Monohydride (250 mg, 0.294 mmol) and 1,3-bis[(1-methyl)benzylimidazolium-3-yl]-5-trifluoromethyl-benzene ditetrafluoroborate (170 mg, 0.294 mmol) were dissolved in 5 mL of DMF and triethyl amine (0.6 mL, 4.4 mmol) was added to the solution. The resulting mixture was refluxed for 1.5 h and then it was cooled to room temperature. The solvent was evaporated under vacuum to afford a brown residue. Addition of acetonitrile afforded a bright yellow solid that was washed with acetonitrile (1×2 mL) and dried in vacuo. Yield: 147 mg (53%). HRMS (electrospray, m/z): calcd for C$_{45}$H$_{33}$F$_3$N$_8$Os [M]+: 934.2392; found: 934.2398. $^1$H NMR (300 MHz, C$_6$D$_6$, 293K): δ 8.75 (s, 2H, CH Ph-CF$_3$), 8.24 (d, J$_{H-H}$=7.8, 2H, CH Ph), 8.16 (d, J$_{H-H}$=7.8, 2H, CH bzm), 8.14 (d, J$_{H-H}$=7.8, 2H, CH bzm), 7.78 (t, J$_{H-H}$=7.8, 1H, CH Ph), 7.08 (t, J$_{H-H}$=7.8, 2H, CH bzm), 6.99 (t, J$_{H-H}$=7.8, 2H, CH bzm), 6.81 (t, J$_{H-H}$=7.9, 2H, CH bzm), 6.78 (t, J$_{H-H}$=7.9, 2H, CH bzm), 6.21 (d, J$_{H-H}$=7.8, 2H, CH bzm), 6.14 (d, J$_{H-H}$=7.8, 2H, CH bzm), 2.22 (s, 6H, CH$_3$), 2.11 (s, 6H, CH$_3$). $^{13}$C{$^1$H} NMR (100.63 MHz, C$_6$D$_6$, 293K): δ 192.4 (s, Os—NCN), 192.1 (s, Os—NCN), 179.0 (s, Os—C), 170.1 (s, Os—C), 146.7 (s, C Ph), 146.5 (s, C Ph), 137.2 (s, C Bzm), 137.1 (s, C Bzm), 133.4 (s, C Bzm), 133.2 (s, C Bzm), 128.4 (q, $J_{C-F}$=270.4 Hz, CF$_3$) 122.0 (s, CH Bzm), 121.8 (s, CH Bzm), 121.7 (s, CH Bzm), 121.4 (s, CH Bzm), 119.0 (q, $J_{C-F}$=30.7 Hz, CCF$_3$) 118.5 (s, CH Ph), 110.14 (s, CH Bzm), 110.08 (s, CH Bzm), 109.30 (s, CH Bzm), 109.28 (s, CH Bzm), 107.0 (s, CH Ph), 103.1 (q, $J_{C-F}$=3.8 Hz, CH Ph), 32.8 (s, CH$_3$), 32.7 (s, CH$_3$). $^{19}$F NMR (282 MHz, C$_6$D$_6$, 293K): δ −57.1 (CF$_3$).

According to an aspect of the present disclosure, a method of making an osmium(II) complex having Formula I L$^1$-Os-L$^2$, wherein L$^1$ and L$^2$ are independently a biscarbene tridentate ligand, wherein L$^1$ and L$^2$ can be same or different is disclosed. The method comprises: (a) reacting a precursor of ligand L$^1$ with an osmium precursor to form an intermediate product, wherein the osmium precursor having the formula OsH$_x$(PR$_3$)$_y$, wherein x is an integer from 2 to 6 and y is an integer from 2 to 5, and R is selected from the group consisting of aryl, alkyl and cycloalkyl; and (b) reacting a precursor of ligand L$^2$ with said intermediate product.

In one embodiment of the method, L$^1$ and L$^2$ are mono-anionic ligands. In some embodiments, L$^1$ and L$^2$ are independently selected from ligands having Formula II:

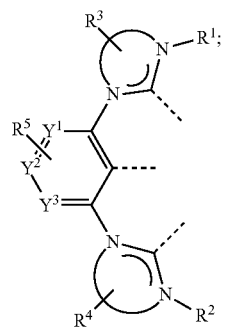

wherein Y$^1$, Y$^2$ and Y$^3$ comprise C or N; wherein R$^3$ and R$^4$ may represent mono-, or di-substitutions, or no substitution; wherein R$^5$ may represent mono-, di-, or tri-substitutions, or no substitution; wherein R$^1$, R$^2$, R$^3$, R$^4$ and R$^5$ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; wherein any two adjacent substituents of R$^1$, R$^2$, R$^3$, R$^4$ and R$^5$ are optionally joined to form a ring; and wherein the dash lines show the connection points to osmium.

In one embodiment of the method, Y$^1$, Y$^2$ and Y$^3$ comprise C. In one embodiment, Y$^1$ and Y$^3$ comprise C, and Y$^2$ is N. In one embodiment, Y$^1$ and Y$^3$ are N, and Y$^2$ comprise C. In one embodiment, R$^1$ and R$^2$ are independently selected from the group consisting of alkyl, cycloalkyl, aryl, heteroaryl, and partially or fully deuterated variants thereof. In one embodiment, R$^1$ and R$^2$ are independently selected from the group consisting of methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, cyclopentyl, cyclohexyl, partially or fully deuterated variants thereof, and combinations thereof.

In one embodiment of the method, the osmium precursor having the formula OsH$_6$(PR$_3$)$_2$. In another embodiment, R in the osmium precursor having the formula OsH$_x$(PR$_3$)$_y$ is selected from the group consisting of methyl, ethyl, propyl, 1-methylethyl, butyl, 1-methylpropyl, 2-methylpropyl, 1,1-dimethylethyl, cyclohexyl, phenyl, 2,6-dimethylphenyl, and 2-methylphenyl. In other embodiment, R is 1-methylethyl.

In another embodiment, the ligands having Formula II are selected from the group consisting of:

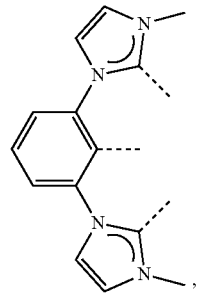

L$^{101}$

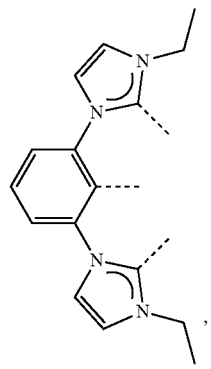

L$^{102}$

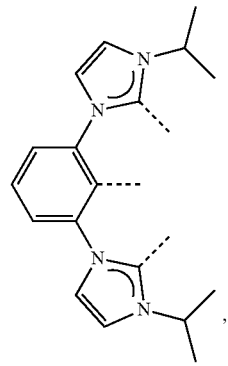

L$^{103}$

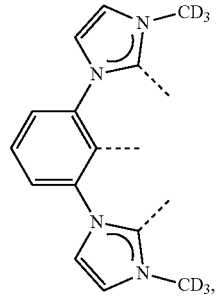

L$^{104}$

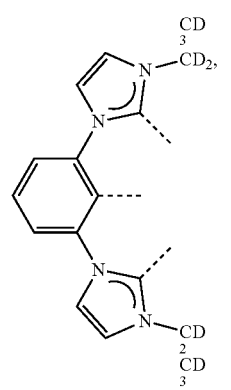 L105
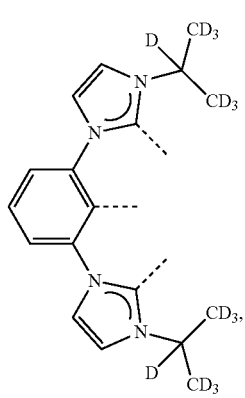 L106
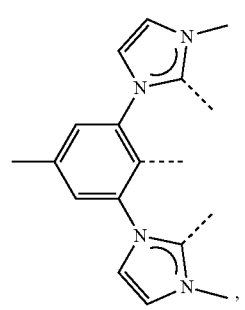 L107
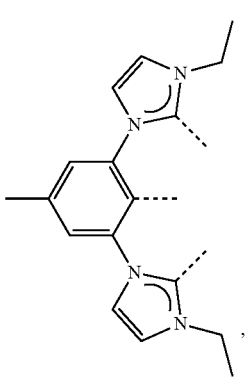 L108
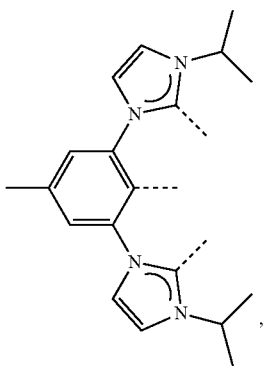 L109
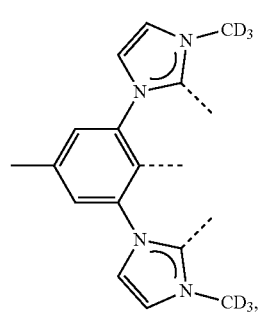 L110
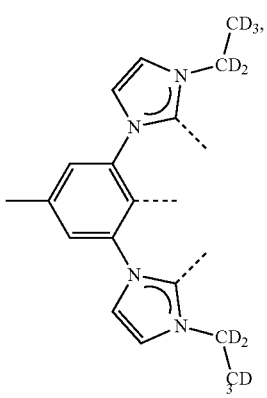 L111
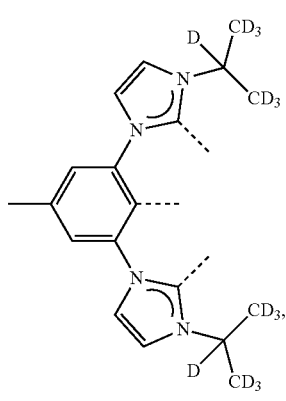 L112

L113 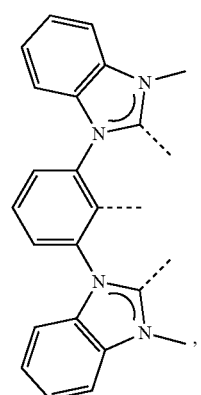
L114 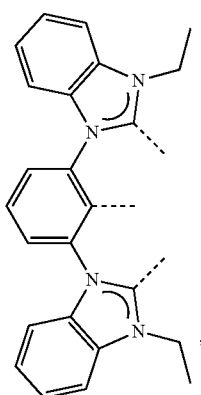
L115 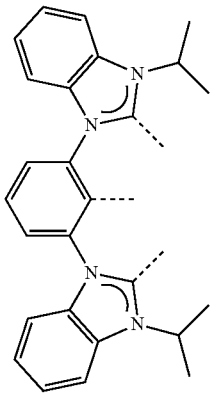
L116 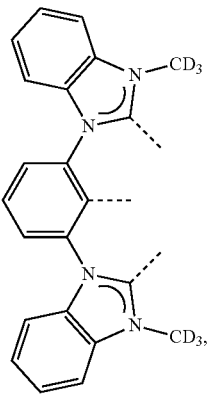
L117 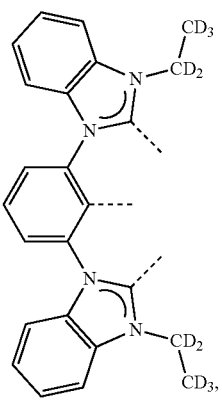
L118 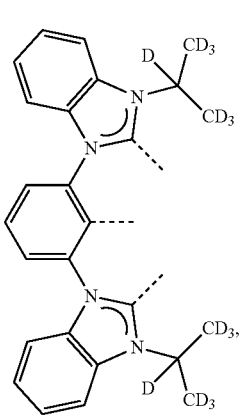
L119 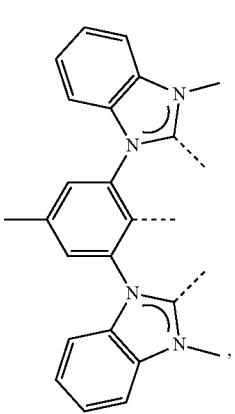
L120 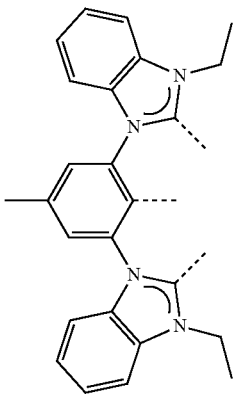

-continued
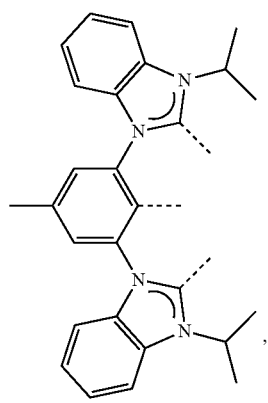
L121
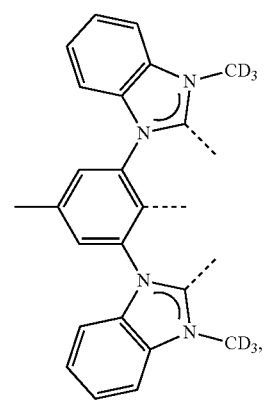
L122
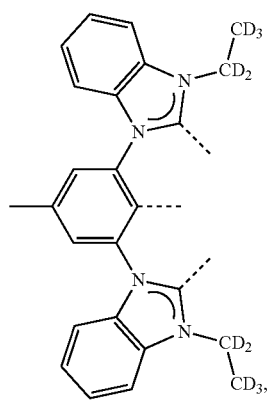
L123
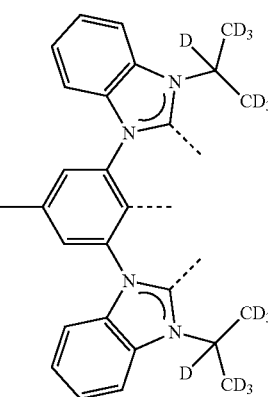
L124
-continued
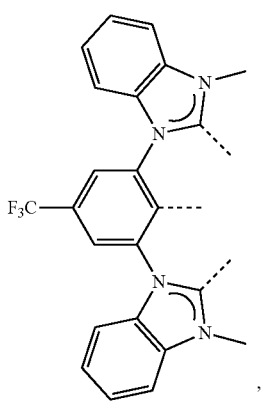
L125
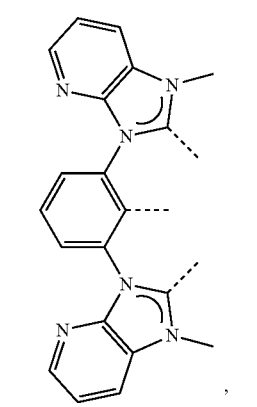
L126
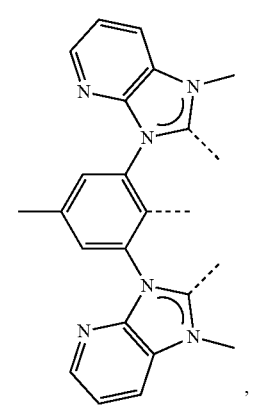
L127
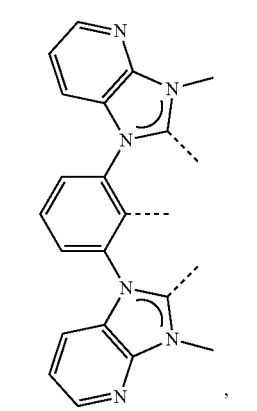
L128

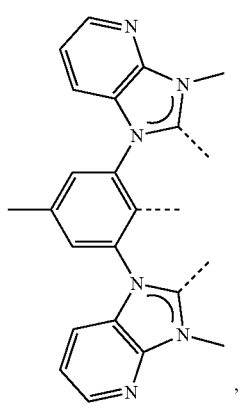 L129
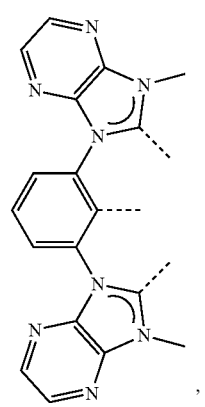 L130
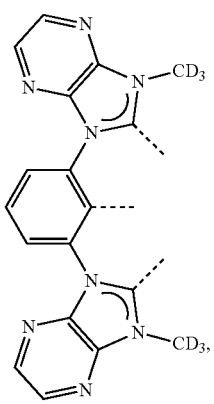 L131
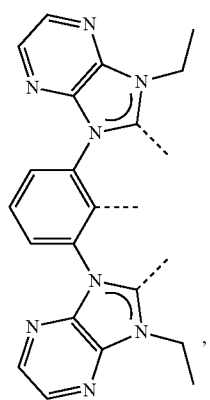 L132
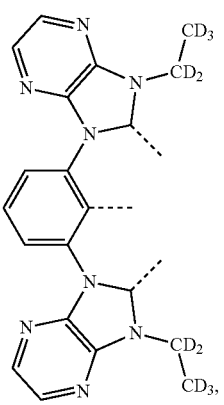 L133
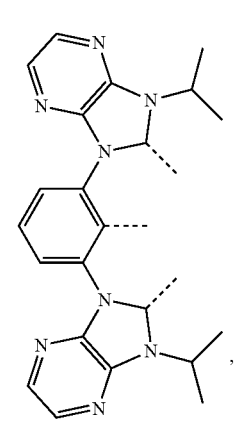 L134
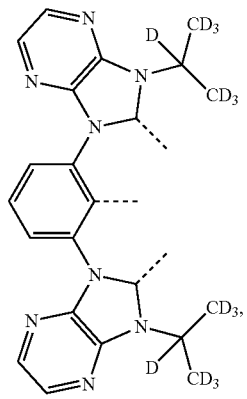 L135
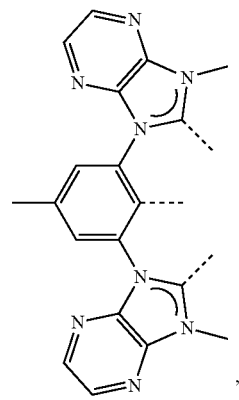 L136

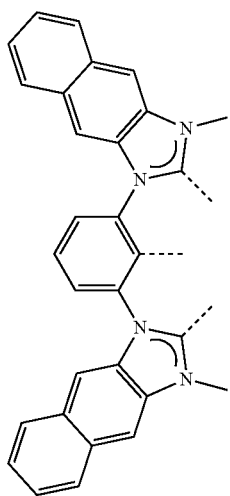 L137
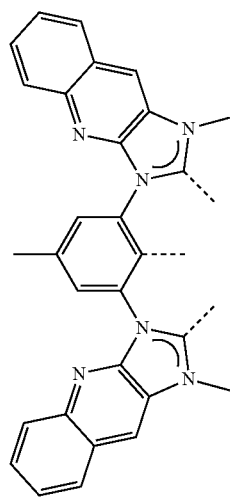 L140
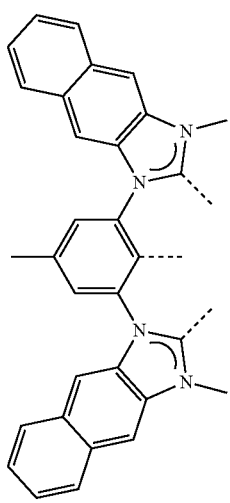 L138
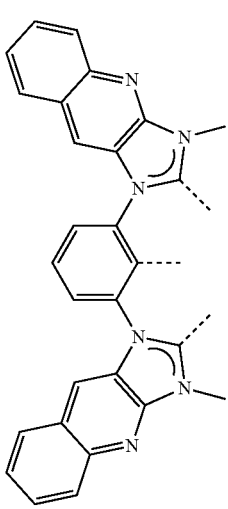 L141
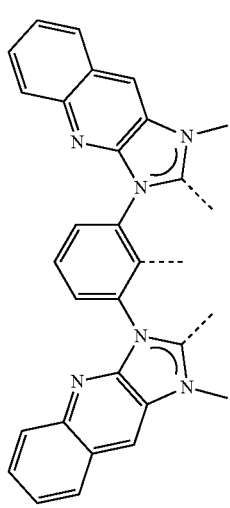 L139
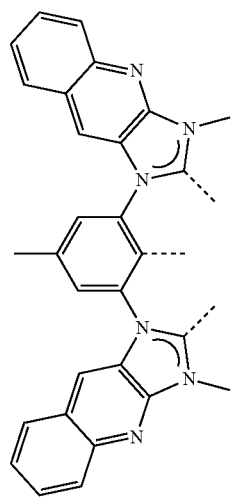 L142

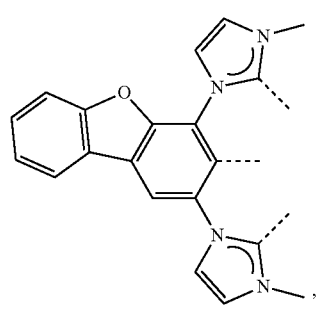 L¹⁴³
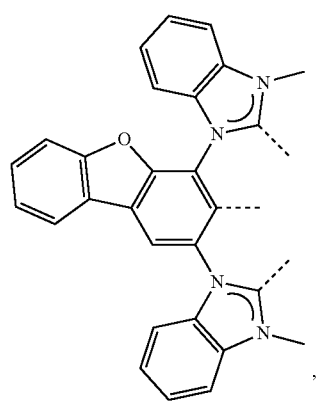 L¹⁴⁴
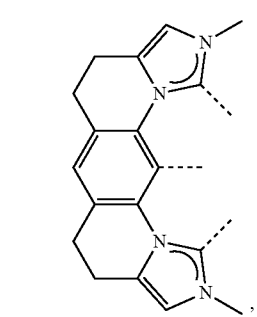 L¹⁴⁵
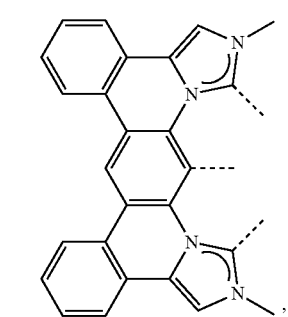 L¹⁴⁶
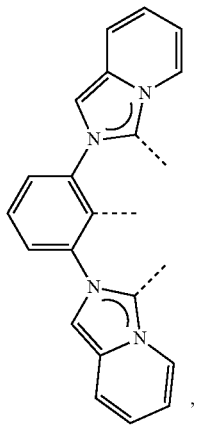 L¹⁴⁷
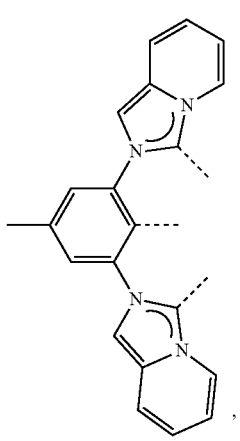 L¹⁴⁸
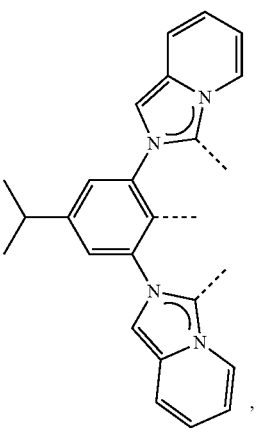 L¹⁴⁹

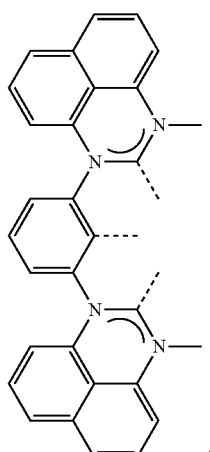 L¹⁵⁰
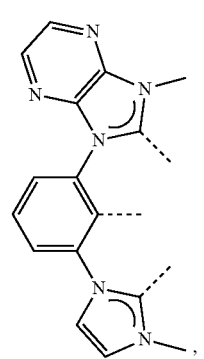 L¹⁵¹
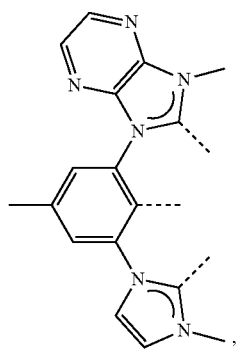 L¹⁵²
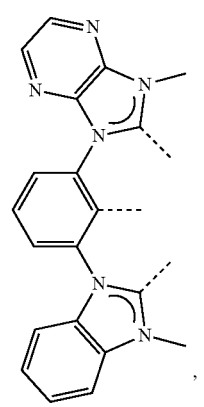 L¹⁵³
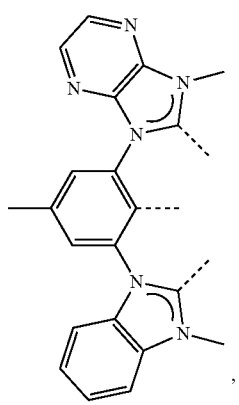 L¹⁵⁴
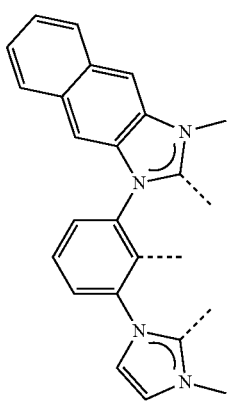 L¹⁵⁵
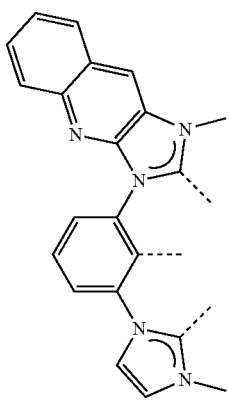 L¹⁵⁶

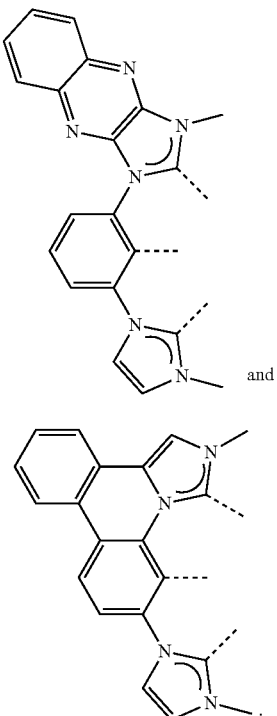

According to an embodiment, a compound having a structure according to Formula I, $L^1$-Os-$L^2$ is provided, wherein $L^1$ and $L^2$ are different; wherein $L^1$ and $L^2$ are independently selected from ligands having Formula II,

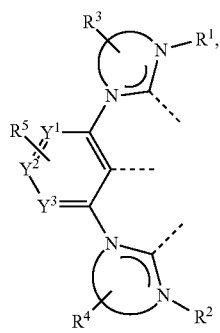

In Formula II, $Y^1$, $Y^2$ and $Y^3$ comprise C or N; wherein $R^3$ and $R^4$ may represent mono-, or di-substitutions, or no substitution; wherein $R^5$ may represent mono-, di-, or tri-substitutions, or no substitution; wherein $R^1$ and $R^2$ are independently selected from the group consisting of alkyl and cycloalkyl; wherein $R^3$, $R^4$ and $R^5$ are independently selected from the group consisting of hydrogen, deuterium, halide, alkyl, cycloalkyl, aralkyl, alkoxy, aryloxy, amino, silyl, alkenyl, cycloalkenyl, heteroalkenyl, alkynyl, aryl, heteroaryl, and combinations thereof; wherein any two adjacent substituents of $R^1$, $R^2$, $R^3$, $R^4$ and $R^5$ are optionally joined to condense into a fused ring; and wherein the dash lines show the connection points to osmium.

In an embodiment of the compound $Y^1$, $Y^2$ and $Y^3$ comprise C. In one embodiment of the compound, $Y^1$ and $Y^3$ comprise C, and $Y^2$ is N. In some embodiments, $Y^1$ and $Y^3$ are N, and $Y^2$ comprise C. In one embodiment, $R^1$ and $R^2$ are independently selected from the group consisting of alkyl, cycloalkyl, aryl, heteroaryl, and partially or fully deuterated variants thereof. In one embodiment, $R^1$ and $R^2$ are independently selected from the group consisting of methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, cyclopentyl, cyclohexyl, partially or fully deuterated variants thereof, and combinations thereof.

In some embodiments of the compound, $L^1$ and $L^2$ are independently selected from ligands having Formula III:

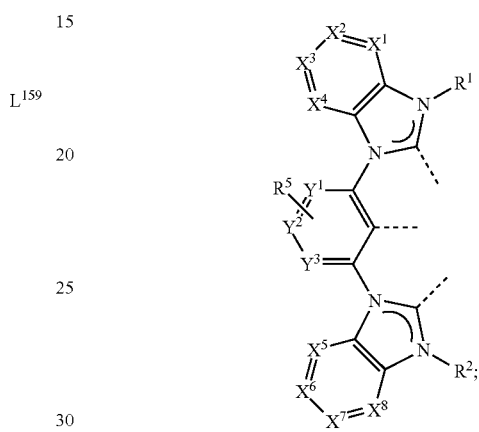

wherein $X^1$, $X^2$, $X^3$, $X^4$, $X^5$, $X^6$, $X^7$ and $X^8$ comprise C or N. In one embodiment, $X^1$, $X^2$, $X^3$, $X^4$, $X^5$, $X^6$, $X^7$ and $X^8$ comprise C.

In some embodiments, the ligands having Formula II are selected from the group consisting of: $L^{101}$ to $L^{159}$ defined herein.

In some embodiments, the compound having a structure according to Formula I, $L^1$-Os-$L^2$ is selected from the group consisting of Compounds 1 to 1159 defined in Table 1 below:

TABLE 1

| Compound Number | $L^1$ | $L^2$ |
|---|---|---|
| 1. | $L^{101}$ | $L^{102}$ |
| 2. | $L^{101}$ | $L^{103}$ |
| 3. | $L^{101}$ | $L^{104}$ |
| 4. | $L^{101}$ | $L^{105}$ |
| 5. | $L^{101}$ | $L^{106}$ |
| 6. | $L^{101}$ | $L^{107}$ |
| 7. | $L^{101}$ | $L^{108}$ |
| 8. | $L^{101}$ | $L^{109}$ |
| 9. | $L^{101}$ | $L^{110}$ |
| 10. | $L^{101}$ | $L^{111}$ |
| 11. | $L^{101}$ | $L^{112}$ |
| 12. | $L^{101}$ | $L^{113}$ |
| 13. | $L^{101}$ | $L^{114}$ |
| 14. | $L^{101}$ | $L^{115}$ |
| 15. | $L^{101}$ | $L^{116}$ |
| 16. | $L^{101}$ | $L^{117}$ |
| 17. | $L^{101}$ | $L^{118}$ |
| 18. | $L^{101}$ | $L^{119}$ |
| 19. | $L^{101}$ | $L^{120}$ |
| 20. | $L^{101}$ | $L^{121}$ |
| 21. | $L^{101}$ | $L^{122}$ |
| 22. | $L^{101}$ | $L^{123}$ |
| 23. | $L^{101}$ | $L^{124}$ |
| 24. | $L^{101}$ | $L^{125}$ |

TABLE 1-continued

| Compound Number | L¹ | L² |
|---|---|---|
| 25. | $L^{101}$ | $L^{126}$ |
| 26. | $L^{101}$ | $L^{127}$ |
| 27. | $L^{101}$ | $L^{128}$ |
| 28. | $L^{101}$ | $L^{129}$ |
| 29. | $L^{101}$ | $L^{130}$ |
| 30. | $L^{101}$ | $L^{131}$ |
| 31. | $L^{101}$ | $L^{132}$ |
| 32. | $L^{101}$ | $L^{133}$ |
| 33. | $L^{101}$ | $L^{134}$ |
| 34. | $L^{101}$ | $L^{135}$ |
| 35. | $L^{101}$ | $L^{136}$ |
| 36. | $L^{101}$ | $L^{137}$ |
| 37. | $L^{101}$ | $L^{138}$ |
| 38. | $L^{101}$ | $L^{139}$ |
| 39. | $L^{101}$ | $L^{140}$ |
| 40. | $L^{101}$ | $L^{141}$ |
| 41. | $L^{101}$ | $L^{142}$ |
| 42. | $L^{101}$ | $L^{143}$ |
| 43. | $L^{101}$ | $L^{144}$ |
| 44. | $L^{101}$ | $L^{145}$ |
| 45. | $L^{101}$ | $L^{146}$ |
| 46. | $L^{101}$ | $L^{147}$ |
| 47. | $L^{101}$ | $L^{148}$ |
| 48. | $L^{101}$ | $L^{149}$ |
| 49. | $L^{101}$ | $L^{150}$ |
| 50. | $L^{101}$ | $L^{151}$ |
| 51. | $L^{101}$ | $L^{152}$ |
| 52. | $L^{101}$ | $L^{153}$ |
| 53. | $L^{101}$ | $L^{154}$ |
| 54. | $L^{101}$ | $L^{155}$ |
| 55. | $L^{101}$ | $L^{156}$ |
| 56. | $L^{101}$ | $L^{157}$ |
| 57. | $L^{101}$ | $L^{158}$ |
| 58. | $L^{101}$ | $L^{159}$ |
| 59. | $L^{102}$ | $L^{103}$ |
| 60. | $L^{102}$ | $L^{104}$ |
| 61. | $L^{102}$ | $L^{105}$ |
| 62. | $L^{102}$ | $L^{106}$ |
| 63. | $L^{102}$ | $L^{107}$ |
| 64. | $L^{102}$ | $L^{108}$ |
| 65. | $L^{102}$ | $L^{109}$ |
| 66. | $L^{102}$ | $L^{110}$ |
| 67. | $L^{102}$ | $L^{111}$ |
| 68. | $L^{102}$ | $L^{112}$ |
| 69. | $L^{102}$ | $L^{113}$ |
| 70. | $L^{102}$ | $L^{114}$ |
| 71. | $L^{102}$ | $L^{115}$ |
| 72. | $L^{102}$ | $L^{116}$ |
| 73. | $L^{102}$ | $L^{117}$ |
| 74. | $L^{102}$ | $L^{118}$ |
| 75. | $L^{102}$ | $L^{119}$ |
| 76. | $L^{102}$ | $L^{120}$ |
| 77. | $L^{102}$ | $L^{121}$ |
| 78. | $L^{102}$ | $L^{122}$ |
| 79. | $L^{102}$ | $L^{123}$ |
| 80. | $L^{102}$ | $L^{124}$ |
| 81. | $L^{102}$ | $L^{125}$ |
| 82. | $L^{102}$ | $L^{126}$ |
| 83. | $L^{102}$ | $L^{127}$ |
| 84. | $L^{102}$ | $L^{128}$ |
| 85. | $L^{102}$ | $L^{129}$ |
| 86. | $L^{102}$ | $L^{130}$ |
| 87. | $L^{102}$ | $L^{131}$ |
| 88. | $L^{102}$ | $L^{132}$ |
| 89. | $L^{102}$ | $L^{133}$ |
| 90. | $L^{102}$ | $L^{134}$ |
| 91. | $L^{102}$ | $L^{135}$ |
| 92. | $L^{102}$ | $L^{136}$ |
| 93. | $L^{102}$ | $L^{137}$ |
| 94. | $L^{102}$ | $L^{138}$ |
| 95. | $L^{102}$ | $L^{139}$ |
| 96. | $L^{102}$ | $L^{140}$ |
| 97. | $L^{102}$ | $L^{141}$ |
| 98. | $L^{102}$ | $L^{142}$ |
| 99. | $L^{102}$ | $L^{143}$ |
| 100. | $L^{102}$ | $L^{144}$ |
| 101. | $L^{102}$ | $L^{145}$ |
| 102. | $L^{102}$ | $L^{146}$ |
| 103. | $L^{102}$ | $L^{147}$ |
| 104. | $L^{102}$ | $L^{148}$ |
| 105. | $L^{102}$ | $L^{149}$ |
| 106. | $L^{102}$ | $L^{150}$ |
| 107. | $L^{102}$ | $L^{151}$ |
| 108. | $L^{102}$ | $L^{152}$ |
| 109. | $L^{102}$ | $L^{153}$ |
| 110. | $L^{102}$ | $L^{154}$ |
| 111. | $L^{102}$ | $L^{155}$ |
| 112. | $L^{102}$ | $L^{156}$ |
| 113. | $L^{102}$ | $L^{157}$ |
| 114. | $L^{102}$ | $L^{158}$ |
| 115. | $L^{102}$ | $L^{159}$ |
| 116. | $L^{103}$ | $L^{104}$ |
| 117. | $L^{103}$ | $L^{105}$ |
| 118. | $L^{103}$ | $L^{106}$ |
| 119. | $L^{103}$ | $L^{107}$ |
| 120. | $L^{103}$ | $L^{108}$ |
| 121. | $L^{103}$ | $L^{109}$ |
| 122. | $L^{103}$ | $L^{110}$ |
| 123. | $L^{103}$ | $L^{111}$ |
| 124. | $L^{103}$ | $L^{112}$ |
| 125. | $L^{103}$ | $L^{113}$ |
| 126. | $L^{103}$ | $L^{114}$ |
| 127. | $L^{103}$ | $L^{115}$ |
| 128. | $L^{103}$ | $L^{116}$ |
| 129. | $L^{103}$ | $L^{117}$ |
| 130. | $L^{103}$ | $L^{118}$ |
| 131. | $L^{103}$ | $L^{119}$ |
| 132. | $L^{103}$ | $L^{120}$ |
| 133. | $L^{103}$ | $L^{121}$ |
| 134. | $L^{103}$ | $L^{122}$ |
| 135. | $L^{103}$ | $L^{123}$ |
| 136. | $L^{103}$ | $L^{124}$ |
| 137. | $L^{103}$ | $L^{125}$ |
| 138. | $L^{103}$ | $L^{126}$ |
| 139. | $L^{103}$ | $L^{127}$ |
| 140. | $L^{103}$ | $L^{128}$ |
| 141. | $L^{103}$ | $L^{129}$ |
| 142. | $L^{103}$ | $L^{130}$ |
| 143. | $L^{103}$ | $L^{131}$ |
| 144. | $L^{103}$ | $L^{132}$ |
| 145. | $L^{103}$ | $L^{133}$ |
| 146. | $L^{103}$ | $L^{134}$ |
| 147. | $L^{103}$ | $L^{135}$ |
| 148. | $L^{103}$ | $L^{136}$ |
| 149. | $L^{103}$ | $L^{137}$ |
| 150. | $L^{103}$ | $L^{138}$ |
| 151. | $L^{103}$ | $L^{139}$ |
| 152. | $L^{103}$ | $L^{140}$ |
| 153. | $L^{103}$ | $L^{141}$ |
| 154. | $L^{103}$ | $L^{142}$ |
| 155. | $L^{103}$ | $L^{143}$ |
| 156. | $L^{103}$ | $L^{144}$ |
| 157. | $L^{103}$ | $L^{145}$ |
| 158. | $L^{103}$ | $L^{146}$ |
| 159. | $L^{103}$ | $L^{147}$ |
| 160. | $L^{103}$ | $L^{148}$ |
| 161. | $L^{103}$ | $L^{149}$ |
| 162. | $L^{103}$ | $L^{150}$ |
| 163. | $L^{103}$ | $L^{151}$ |
| 164. | $L^{103}$ | $L^{152}$ |
| 165. | $L^{103}$ | $L^{153}$ |
| 166. | $L^{103}$ | $L^{154}$ |
| 167. | $L^{103}$ | $L^{155}$ |
| 168. | $L^{103}$ | $L^{156}$ |
| 169. | $L^{103}$ | $L^{157}$ |
| 170. | $L^{103}$ | $L^{158}$ |
| 171. | $L^{103}$ | $L^{159}$ |
| 172. | $L^{104}$ | $L^{105}$ |
| 173. | $L^{104}$ | $L^{106}$ |
| 174. | $L^{104}$ | $L^{107}$ |
| 175. | $L^{104}$ | $L^{108}$ |
| 176. | $L^{104}$ | $L^{109}$ |
| 177. | $L^{104}$ | $L^{110}$ |
| 178. | $L^{104}$ | $L^{111}$ |

TABLE 1-continued

| Compound Number | $L^1$ | $L^2$ |
|---|---|---|
| 179. | $L^{104}$ | $L^{112}$ |
| 180. | $L^{104}$ | $L^{113}$ |
| 181. | $L^{104}$ | $L^{114}$ |
| 182. | $L^{104}$ | $L^{115}$ |
| 183. | $L^{104}$ | $L^{116}$ |
| 184. | $L^{104}$ | $L^{117}$ |
| 185. | $L^{104}$ | $L^{118}$ |
| 186. | $L^{104}$ | $L^{119}$ |
| 187. | $L^{104}$ | $L^{120}$ |
| 188. | $L^{104}$ | $L^{121}$ |
| 189. | $L^{104}$ | $L^{122}$ |
| 190. | $L^{104}$ | $L^{123}$ |
| 191. | $L^{104}$ | $L^{124}$ |
| 192. | $L^{104}$ | $L^{125}$ |
| 193. | $L^{104}$ | $L^{126}$ |
| 194. | $L^{104}$ | $L^{127}$ |
| 195. | $L^{104}$ | $L^{128}$ |
| 196. | $L^{104}$ | $L^{129}$ |
| 197. | $L^{104}$ | $L^{130}$ |
| 198. | $L^{104}$ | $L^{131}$ |
| 199. | $L^{104}$ | $L^{132}$ |
| 200. | $L^{104}$ | $L^{133}$ |
| 201. | $L^{104}$ | $L^{134}$ |
| 202. | $L^{104}$ | $L^{135}$ |
| 203. | $L^{104}$ | $L^{136}$ |
| 204. | $L^{104}$ | $L^{137}$ |
| 205. | $L^{104}$ | $L^{138}$ |
| 206. | $L^{104}$ | $L^{139}$ |
| 207. | $L^{104}$ | $L^{140}$ |
| 208. | $L^{104}$ | $L^{141}$ |
| 209. | $L^{104}$ | $L^{142}$ |
| 210. | $L^{104}$ | $L^{143}$ |
| 211. | $L^{104}$ | $L^{144}$ |
| 212. | $L^{104}$ | $L^{145}$ |
| 213. | $L^{104}$ | $L^{146}$ |
| 214. | $L^{104}$ | $L^{147}$ |
| 215. | $L^{104}$ | $L^{148}$ |
| 216. | $L^{104}$ | $L^{149}$ |
| 217. | $L^{104}$ | $L^{150}$ |
| 218. | $L^{104}$ | $L^{151}$ |
| 219. | $L^{104}$ | $L^{152}$ |
| 220. | $L^{104}$ | $L^{153}$ |
| 221. | $L^{104}$ | $L^{154}$ |
| 222. | $L^{104}$ | $L^{155}$ |
| 223. | $L^{104}$ | $L^{156}$ |
| 224. | $L^{104}$ | $L^{157}$ |
| 225. | $L^{104}$ | $L^{158}$ |
| 226. | $L^{104}$ | $L^{159}$ |
| 227. | $L^{105}$ | $L^{106}$ |
| 228. | $L^{105}$ | $L^{107}$ |
| 229. | $L^{105}$ | $L^{108}$ |
| 230. | $L^{105}$ | $L^{109}$ |
| 231. | $L^{105}$ | $L^{110}$ |
| 232. | $L^{105}$ | $L^{111}$ |
| 233. | $L^{105}$ | $L^{112}$ |
| 234. | $L^{105}$ | $L^{113}$ |
| 235. | $L^{105}$ | $L^{114}$ |
| 236. | $L^{105}$ | $L^{115}$ |
| 237. | $L^{105}$ | $L^{116}$ |
| 238. | $L^{105}$ | $L^{117}$ |
| 239. | $L^{105}$ | $L^{118}$ |
| 240. | $L^{105}$ | $L^{119}$ |
| 241. | $L^{105}$ | $L^{120}$ |
| 242. | $L^{105}$ | $L^{121}$ |
| 243. | $L^{105}$ | $L^{122}$ |
| 244. | $L^{105}$ | $L^{123}$ |
| 245. | $L^{105}$ | $L^{124}$ |
| 246. | $L^{105}$ | $L^{125}$ |
| 247. | $L^{105}$ | $L^{126}$ |
| 248. | $L^{105}$ | $L^{127}$ |
| 249. | $L^{105}$ | $L^{128}$ |
| 250. | $L^{105}$ | $L^{129}$ |
| 251. | $L^{105}$ | $L^{130}$ |
| 252. | $L^{105}$ | $L^{131}$ |
| 253. | $L^{105}$ | $L^{132}$ |
| 254. | $L^{105}$ | $L^{133}$ |
| 255. | $L^{105}$ | $L^{134}$ |
| 256. | $L^{105}$ | $L^{135}$ |
| 257. | $L^{105}$ | $L^{136}$ |
| 258. | $L^{105}$ | $L^{137}$ |
| 259. | $L^{105}$ | $L^{138}$ |
| 260. | $L^{105}$ | $L^{139}$ |
| 261. | $L^{105}$ | $L^{140}$ |
| 262. | $L^{105}$ | $L^{141}$ |
| 263. | $L^{105}$ | $L^{142}$ |
| 264. | $L^{105}$ | $L^{143}$ |
| 265. | $L^{105}$ | $L^{144}$ |
| 266. | $L^{105}$ | $L^{145}$ |
| 267. | $L^{105}$ | $L^{146}$ |
| 268. | $L^{105}$ | $L^{147}$ |
| 269. | $L^{105}$ | $L^{148}$ |
| 270. | $L^{105}$ | $L^{149}$ |
| 271. | $L^{105}$ | $L^{150}$ |
| 272. | $L^{105}$ | $L^{151}$ |
| 273. | $L^{105}$ | $L^{152}$ |
| 274. | $L^{105}$ | $L^{153}$ |
| 275. | $L^{105}$ | $L^{154}$ |
| 276. | $L^{105}$ | $L^{155}$ |
| 277. | $L^{105}$ | $L^{156}$ |
| 278. | $L^{105}$ | $L^{157}$ |
| 279. | $L^{105}$ | $L^{158}$ |
| 280. | $L^{105}$ | $L^{159}$ |
| 281. | $L^{106}$ | $L^{107}$ |
| 282. | $L^{106}$ | $L^{108}$ |
| 283. | $L^{106}$ | $L^{109}$ |
| 284. | $L^{106}$ | $L^{110}$ |
| 285. | $L^{106}$ | $L^{111}$ |
| 286. | $L^{106}$ | $L^{112}$ |
| 287. | $L^{106}$ | $L^{113}$ |
| 288. | $L^{106}$ | $L^{114}$ |
| 289. | $L^{106}$ | $L^{115}$ |
| 290. | $L^{106}$ | $L^{116}$ |
| 291. | $L^{106}$ | $L^{117}$ |
| 292. | $L^{106}$ | $L^{118}$ |
| 293. | $L^{106}$ | $L^{119}$ |
| 294. | $L^{106}$ | $L^{120}$ |
| 295. | $L^{106}$ | $L^{121}$ |
| 296. | $L^{106}$ | $L^{122}$ |
| 297. | $L^{106}$ | $L^{123}$ |
| 298. | $L^{106}$ | $L^{124}$ |
| 299. | $L^{106}$ | $L^{125}$ |
| 300. | $L^{106}$ | $L^{126}$ |
| 301. | $L^{106}$ | $L^{127}$ |
| 302. | $L^{106}$ | $L^{128}$ |
| 303. | $L^{106}$ | $L^{129}$ |
| 304. | $L^{106}$ | $L^{130}$ |
| 305. | $L^{106}$ | $L^{131}$ |
| 306. | $L^{106}$ | $L^{132}$ |
| 307. | $L^{106}$ | $L^{133}$ |
| 308. | $L^{106}$ | $L^{134}$ |
| 309. | $L^{106}$ | $L^{135}$ |
| 310. | $L^{106}$ | $L^{136}$ |
| 311. | $L^{106}$ | $L^{137}$ |
| 312. | $L^{106}$ | $L^{138}$ |
| 313. | $L^{106}$ | $L^{139}$ |
| 314. | $L^{106}$ | $L^{140}$ |
| 315. | $L^{106}$ | $L^{141}$ |
| 316. | $L^{106}$ | $L^{142}$ |
| 317. | $L^{106}$ | $L^{143}$ |
| 318. | $L^{106}$ | $L^{144}$ |
| 319. | $L^{106}$ | $L^{145}$ |
| 320. | $L^{106}$ | $L^{146}$ |
| 321. | $L^{106}$ | $L^{147}$ |
| 322. | $L^{106}$ | $L^{148}$ |
| 323. | $L^{106}$ | $L^{149}$ |
| 324. | $L^{106}$ | $L^{150}$ |
| 325. | $L^{106}$ | $L^{151}$ |
| 326. | $L^{106}$ | $L^{152}$ |
| 327. | $L^{106}$ | $L^{153}$ |
| 328. | $L^{106}$ | $L^{154}$ |
| 329. | $L^{106}$ | $L^{155}$ |
| 330. | $L^{106}$ | $L^{156}$ |
| 331. | $L^{106}$ | $L^{157}$ |
| 332. | $L^{106}$ | $L^{158}$ |

TABLE 1-continued

| Compound Number | L¹ | L² |
|---|---|---|
| 333. | $L^{106}$ | $L^{159}$ |
| 334. | $L^{107}$ | $L^{108}$ |
| 335. | $L^{107}$ | $L^{109}$ |
| 336. | $L^{107}$ | $L^{110}$ |
| 337. | $L^{107}$ | $L^{111}$ |
| 338. | $L^{107}$ | $L^{112}$ |
| 339. | $L^{107}$ | $L^{113}$ |
| 340. | $L^{107}$ | $L^{114}$ |
| 341. | $L^{107}$ | $L^{115}$ |
| 342. | $L^{107}$ | $L^{116}$ |
| 343. | $L^{107}$ | $L^{117}$ |
| 344. | $L^{107}$ | $L^{118}$ |
| 345. | $L^{107}$ | $L^{119}$ |
| 346. | $L^{107}$ | $L^{120}$ |
| 347. | $L^{107}$ | $L^{121}$ |
| 348. | $L^{107}$ | $L^{122}$ |
| 349. | $L^{107}$ | $L^{123}$ |
| 350. | $L^{107}$ | $L^{124}$ |
| 351. | $L^{107}$ | $L^{125}$ |
| 352. | $L^{107}$ | $L^{126}$ |
| 353. | $L^{107}$ | $L^{127}$ |
| 354. | $L^{107}$ | $L^{128}$ |
| 355. | $L^{107}$ | $L^{129}$ |
| 356. | $L^{107}$ | $L^{130}$ |
| 357. | $L^{107}$ | $L^{131}$ |
| 358. | $L^{107}$ | $L^{132}$ |
| 359. | $L^{107}$ | $L^{133}$ |
| 360. | $L^{107}$ | $L^{134}$ |
| 361. | $L^{107}$ | $L^{135}$ |
| 362. | $L^{107}$ | $L^{136}$ |
| 363. | $L^{107}$ | $L^{137}$ |
| 364. | $L^{107}$ | $L^{138}$ |
| 365. | $L^{107}$ | $L^{139}$ |
| 366. | $L^{107}$ | $L^{140}$ |
| 367. | $L^{107}$ | $L^{141}$ |
| 368. | $L^{107}$ | $L^{142}$ |
| 369. | $L^{107}$ | $L^{143}$ |
| 370. | $L^{107}$ | $L^{144}$ |
| 371. | $L^{107}$ | $L^{145}$ |
| 372. | $L^{107}$ | $L^{146}$ |
| 373. | $L^{107}$ | $L^{147}$ |
| 374. | $L^{107}$ | $L^{148}$ |
| 375. | $L^{107}$ | $L^{149}$ |
| 376. | $L^{107}$ | $L^{150}$ |
| 377. | $L^{107}$ | $L^{151}$ |
| 378. | $L^{107}$ | $L^{152}$ |
| 379. | $L^{107}$ | $L^{153}$ |
| 380. | $L^{107}$ | $L^{154}$ |
| 381. | $L^{107}$ | $L^{155}$ |
| 382. | $L^{107}$ | $L^{156}$ |
| 383. | $L^{107}$ | $L^{157}$ |
| 384. | $L^{107}$ | $L^{158}$ |
| 385. | $L^{107}$ | $L^{159}$ |
| 386. | $L^{108}$ | $L^{109}$ |
| 387. | $L^{108}$ | $L^{110}$ |
| 388. | $L^{108}$ | $L^{111}$ |
| 389. | $L^{108}$ | $L^{112}$ |
| 390. | $L^{108}$ | $L^{113}$ |
| 391. | $L^{108}$ | $L^{114}$ |
| 392. | $L^{108}$ | $L^{115}$ |
| 393. | $L^{108}$ | $L^{116}$ |
| 394. | $L^{108}$ | $L^{117}$ |
| 395. | $L^{108}$ | $L^{118}$ |
| 396. | $L^{108}$ | $L^{119}$ |
| 397. | $L^{108}$ | $L^{120}$ |
| 398. | $L^{108}$ | $L^{121}$ |
| 399. | $L^{108}$ | $L^{122}$ |
| 400. | $L^{108}$ | $L^{123}$ |
| 401. | $L^{108}$ | $L^{124}$ |
| 402. | $L^{108}$ | $L^{125}$ |
| 403. | $L^{108}$ | $L^{126}$ |
| 404. | $L^{108}$ | $L^{127}$ |
| 405. | $L^{108}$ | $L^{128}$ |
| 406. | $L^{108}$ | $L^{129}$ |
| 407. | $L^{108}$ | $L^{130}$ |
| 408. | $L^{108}$ | $L^{131}$ |
| 409. | $L^{108}$ | $L^{132}$ |
| 410. | $L^{108}$ | $L^{133}$ |
| 411. | $L^{108}$ | $L^{134}$ |
| 412. | $L^{108}$ | $L^{135}$ |
| 413. | $L^{108}$ | $L^{136}$ |
| 414. | $L^{108}$ | $L^{137}$ |
| 415. | $L^{108}$ | $L^{138}$ |
| 416. | $L^{108}$ | $L^{139}$ |
| 417. | $L^{108}$ | $L^{140}$ |
| 418. | $L^{108}$ | $L^{141}$ |
| 419. | $L^{108}$ | $L^{142}$ |
| 420. | $L^{108}$ | $L^{143}$ |
| 421. | $L^{108}$ | $L^{144}$ |
| 422. | $L^{108}$ | $L^{145}$ |
| 423. | $L^{108}$ | $L^{146}$ |
| 424. | $L^{108}$ | $L^{147}$ |
| 425. | $L^{108}$ | $L^{148}$ |
| 426. | $L^{108}$ | $L^{149}$ |
| 427. | $L^{108}$ | $L^{150}$ |
| 428. | $L^{108}$ | $L^{151}$ |
| 429. | $L^{108}$ | $L^{152}$ |
| 430. | $L^{108}$ | $L^{153}$ |
| 431. | $L^{108}$ | $L^{154}$ |
| 432. | $L^{108}$ | $L^{155}$ |
| 433. | $L^{108}$ | $L^{156}$ |
| 434. | $L^{108}$ | $L^{157}$ |
| 435. | $L^{108}$ | $L^{158}$ |
| 436. | $L^{108}$ | $L^{159}$ |
| 437. | $L^{109}$ | $L^{110}$ |
| 438. | $L^{109}$ | $L^{111}$ |
| 439. | $L^{109}$ | $L^{112}$ |
| 440. | $L^{109}$ | $L^{113}$ |
| 441. | $L^{109}$ | $L^{114}$ |
| 442. | $L^{109}$ | $L^{115}$ |
| 443. | $L^{109}$ | $L^{116}$ |
| 444. | $L^{109}$ | $L^{117}$ |
| 445. | $L^{109}$ | $L^{118}$ |
| 446. | $L^{109}$ | $L^{119}$ |
| 447. | $L^{109}$ | $L^{120}$ |
| 448. | $L^{109}$ | $L^{121}$ |
| 449. | $L^{109}$ | $L^{122}$ |
| 450. | $L^{109}$ | $L^{123}$ |
| 451. | $L^{109}$ | $L^{124}$ |
| 452. | $L^{109}$ | $L^{125}$ |
| 453. | $L^{109}$ | $L^{126}$ |
| 454. | $L^{109}$ | $L^{127}$ |
| 455. | $L^{109}$ | $L^{128}$ |
| 456. | $L^{109}$ | $L^{129}$ |
| 457. | $L^{109}$ | $L^{130}$ |
| 458. | $L^{109}$ | $L^{131}$ |
| 459. | $L^{109}$ | $L^{132}$ |
| 460. | $L^{109}$ | $L^{133}$ |
| 461. | $L^{109}$ | $L^{134}$ |
| 462. | $L^{109}$ | $L^{135}$ |
| 463. | $L^{109}$ | $L^{136}$ |
| 464. | $L^{109}$ | $L^{137}$ |
| 465. | $L^{109}$ | $L^{138}$ |
| 466. | $L^{109}$ | $L^{139}$ |
| 467. | $L^{109}$ | $L^{140}$ |
| 468. | $L^{109}$ | $L^{141}$ |
| 469. | $L^{109}$ | $L^{142}$ |
| 470. | $L^{109}$ | $L^{143}$ |
| 471. | $L^{109}$ | $L^{144}$ |
| 472. | $L^{109}$ | $L^{145}$ |
| 473. | $L^{109}$ | $L^{146}$ |
| 474. | $L^{109}$ | $L^{147}$ |
| 475. | $L^{109}$ | $L^{148}$ |
| 476. | $L^{109}$ | $L^{149}$ |
| 477. | $L^{109}$ | $L^{150}$ |
| 478. | $L^{109}$ | $L^{151}$ |
| 479. | $L^{109}$ | $L^{152}$ |
| 480. | $L^{109}$ | $L^{153}$ |
| 481. | $L^{109}$ | $L^{154}$ |
| 482. | $L^{109}$ | $L^{155}$ |
| 483. | $L^{109}$ | $L^{156}$ |
| 484. | $L^{109}$ | $L^{157}$ |
| 485. | $L^{109}$ | $L^{158}$ |
| 486. | $L^{109}$ | $L^{159}$ |

TABLE 1-continued

| Compound Number | $L^1$ | $L^2$ |
|---|---|---|
| 487. | $L^{110}$ | $L^{111}$ |
| 488. | $L^{110}$ | $L^{112}$ |
| 489. | $L^{110}$ | $L^{113}$ |
| 490. | $L^{110}$ | $L^{114}$ |
| 491. | $L^{110}$ | $L^{115}$ |
| 492. | $L^{110}$ | $L^{116}$ |
| 493. | $L^{110}$ | $L^{117}$ |
| 494. | $L^{110}$ | $L^{118}$ |
| 495. | $L^{110}$ | $L^{119}$ |
| 496. | $L^{110}$ | $L^{120}$ |
| 497. | $L^{110}$ | $L^{121}$ |
| 498. | $L^{110}$ | $L^{122}$ |
| 499. | $L^{110}$ | $L^{123}$ |
| 500. | $L^{110}$ | $L^{124}$ |
| 501. | $L^{110}$ | $L^{125}$ |
| 502. | $L^{110}$ | $L^{126}$ |
| 503. | $L^{110}$ | $L^{127}$ |
| 504. | $L^{110}$ | $L^{128}$ |
| 505. | $L^{110}$ | $L^{129}$ |
| 506. | $L^{110}$ | $L^{130}$ |
| 507. | $L^{110}$ | $L^{131}$ |
| 508. | $L^{110}$ | $L^{132}$ |
| 509. | $L^{110}$ | $L^{133}$ |
| 510. | $L^{110}$ | $L^{134}$ |
| 511. | $L^{110}$ | $L^{135}$ |
| 512. | $L^{110}$ | $L^{136}$ |
| 513. | $L^{110}$ | $L^{137}$ |
| 514. | $L^{110}$ | $L^{138}$ |
| 515. | $L^{110}$ | $L^{139}$ |
| 516. | $L^{110}$ | $L^{140}$ |
| 517. | $L^{110}$ | $L^{141}$ |
| 518. | $L^{110}$ | $L^{142}$ |
| 519. | $L^{110}$ | $L^{143}$ |
| 520. | $L^{110}$ | $L^{144}$ |
| 521. | $L^{110}$ | $L^{145}$ |
| 522. | $L^{110}$ | $L^{146}$ |
| 523. | $L^{110}$ | $L^{147}$ |
| 524. | $L^{110}$ | $L^{148}$ |
| 525. | $L^{110}$ | $L^{149}$ |
| 526. | $L^{110}$ | $L^{150}$ |
| 527. | $L^{110}$ | $L^{151}$ |
| 528. | $L^{110}$ | $L^{152}$ |
| 529. | $L^{110}$ | $L^{153}$ |
| 530. | $L^{110}$ | $L^{154}$ |
| 531. | $L^{110}$ | $L^{155}$ |
| 532. | $L^{110}$ | $L^{156}$ |
| 533. | $L^{110}$ | $L^{157}$ |
| 534. | $L^{110}$ | $L^{158}$ |
| 535. | $L^{110}$ | $L^{159}$ |
| 536. | $L^{111}$ | $L^{112}$ |
| 537. | $L^{111}$ | $L^{113}$ |
| 538. | $L^{111}$ | $L^{114}$ |
| 539. | $L^{111}$ | $L^{115}$ |
| 540. | $L^{111}$ | $L^{116}$ |
| 541. | $L^{111}$ | $L^{117}$ |
| 542. | $L^{111}$ | $L^{118}$ |
| 543. | $L^{111}$ | $L^{119}$ |
| 544. | $L^{111}$ | $L^{120}$ |
| 545. | $L^{111}$ | $L^{121}$ |
| 546. | $L^{111}$ | $L^{122}$ |
| 547. | $L^{111}$ | $L^{123}$ |
| 548. | $L^{111}$ | $L^{124}$ |
| 549. | $L^{111}$ | $L^{125}$ |
| 550. | $L^{111}$ | $L^{126}$ |
| 551. | $L^{111}$ | $L^{127}$ |
| 552. | $L^{111}$ | $L^{128}$ |
| 553. | $L^{111}$ | $L^{129}$ |
| 554. | $L^{111}$ | $L^{130}$ |
| 555. | $L^{111}$ | $L^{131}$ |
| 556. | $L^{111}$ | $L^{132}$ |
| 557. | $L^{111}$ | $L^{133}$ |
| 558. | $L^{111}$ | $L^{134}$ |
| 559. | $L^{111}$ | $L^{135}$ |
| 560. | $L^{111}$ | $L^{136}$ |
| 561. | $L^{111}$ | $L^{137}$ |
| 562. | $L^{111}$ | $L^{138}$ |
| 563. | $L^{111}$ | $L^{139}$ |
| 564. | $L^{111}$ | $L^{140}$ |
| 565. | $L^{111}$ | $L^{141}$ |
| 566. | $L^{111}$ | $L^{142}$ |
| 567. | $L^{111}$ | $L^{143}$ |
| 568. | $L^{111}$ | $L^{144}$ |
| 569. | $L^{111}$ | $L^{145}$ |
| 570. | $L^{111}$ | $L^{146}$ |
| 571. | $L^{111}$ | $L^{147}$ |
| 572. | $L^{111}$ | $L^{148}$ |
| 573. | $L^{111}$ | $L^{149}$ |
| 574. | $L^{111}$ | $L^{150}$ |
| 575. | $L^{111}$ | $L^{151}$ |
| 576. | $L^{111}$ | $L^{152}$ |
| 577. | $L^{111}$ | $L^{153}$ |
| 578. | $L^{111}$ | $L^{154}$ |
| 579. | $L^{111}$ | $L^{155}$ |
| 580. | $L^{111}$ | $L^{156}$ |
| 581. | $L^{111}$ | $L^{157}$ |
| 582. | $L^{111}$ | $L^{158}$ |
| 583. | $L^{111}$ | $L^{159}$ |
| 584. | $L^{112}$ | $L^{113}$ |
| 585. | $L^{112}$ | $L^{114}$ |
| 586. | $L^{112}$ | $L^{115}$ |
| 587. | $L^{112}$ | $L^{116}$ |
| 588. | $L^{112}$ | $L^{117}$ |
| 589. | $L^{112}$ | $L^{118}$ |
| 590. | $L^{112}$ | $L^{119}$ |
| 591. | $L^{112}$ | $L^{120}$ |
| 592. | $L^{112}$ | $L^{121}$ |
| 593. | $L^{112}$ | $L^{122}$ |
| 594. | $L^{112}$ | $L^{123}$ |
| 595. | $L^{112}$ | $L^{124}$ |
| 596. | $L^{112}$ | $L^{125}$ |
| 597. | $L^{112}$ | $L^{126}$ |
| 598. | $L^{112}$ | $L^{127}$ |
| 599. | $L^{112}$ | $L^{128}$ |
| 600. | $L^{112}$ | $L^{129}$ |
| 601. | $L^{112}$ | $L^{130}$ |
| 602. | $L^{112}$ | $L^{131}$ |
| 603. | $L^{112}$ | $L^{132}$ |
| 604. | $L^{112}$ | $L^{133}$ |
| 605. | $L^{112}$ | $L^{134}$ |
| 606. | $L^{112}$ | $L^{135}$ |
| 607. | $L^{112}$ | $L^{136}$ |
| 608. | $L^{112}$ | $L^{137}$ |
| 609. | $L^{112}$ | $L^{138}$ |
| 610. | $L^{112}$ | $L^{139}$ |
| 611. | $L^{112}$ | $L^{140}$ |
| 612. | $L^{112}$ | $L^{141}$ |
| 613. | $L^{112}$ | $L^{142}$ |
| 614. | $L^{112}$ | $L^{143}$ |
| 615. | $L^{112}$ | $L^{144}$ |
| 616. | $L^{112}$ | $L^{145}$ |
| 617. | $L^{112}$ | $L^{146}$ |
| 618. | $L^{112}$ | $L^{147}$ |
| 619. | $L^{112}$ | $L^{148}$ |
| 620. | $L^{112}$ | $L^{149}$ |
| 621. | $L^{112}$ | $L^{150}$ |
| 622. | $L^{112}$ | $L^{151}$ |
| 623. | $L^{112}$ | $L^{152}$ |
| 624. | $L^{112}$ | $L^{153}$ |
| 625. | $L^{112}$ | $L^{154}$ |
| 626. | $L^{112}$ | $L^{155}$ |
| 627. | $L^{112}$ | $L^{156}$ |
| 628. | $L^{112}$ | $L^{157}$ |
| 629. | $L^{112}$ | $L^{158}$ |
| 630. | $L^{112}$ | $L^{159}$ |
| 631. | $L^{113}$ | $L^{114}$ |
| 632. | $L^{113}$ | $L^{115}$ |
| 633. | $L^{113}$ | $L^{116}$ |
| 634. | $L^{113}$ | $L^{117}$ |
| 635. | $L^{113}$ | $L^{118}$ |
| 636. | $L^{113}$ | $L^{119}$ |
| 637. | $L^{113}$ | $L^{120}$ |
| 638. | $L^{113}$ | $L^{121}$ |
| 639. | $L^{113}$ | $L^{122}$ |
| 640. | $L^{113}$ | $L^{123}$ |

TABLE 1-continued

| Compound Number | $L^1$ | $L^2$ |
|---|---|---|
| 641. | $L^{113}$ | $L^{124}$ |
| 642. | $L^{113}$ | $L^{125}$ |
| 643. | $L^{113}$ | $L^{126}$ |
| 644. | $L^{113}$ | $L^{127}$ |
| 645. | $L^{113}$ | $L^{128}$ |
| 646. | $L^{113}$ | $L^{129}$ |
| 647. | $L^{113}$ | $L^{130}$ |
| 648. | $L^{113}$ | $L^{131}$ |
| 649. | $L^{113}$ | $L^{132}$ |
| 650. | $L^{113}$ | $L^{133}$ |
| 651. | $L^{113}$ | $L^{134}$ |
| 652. | $L^{113}$ | $L^{135}$ |
| 653. | $L^{113}$ | $L^{136}$ |
| 654. | $L^{113}$ | $L^{137}$ |
| 655. | $L^{113}$ | $L^{138}$ |
| 656. | $L^{113}$ | $L^{139}$ |
| 657. | $L^{113}$ | $L^{140}$ |
| 658. | $L^{113}$ | $L^{141}$ |
| 659. | $L^{113}$ | $L^{142}$ |
| 660. | $L^{113}$ | $L^{143}$ |
| 661. | $L^{113}$ | $L^{144}$ |
| 662. | $L^{113}$ | $L^{145}$ |
| 663. | $L^{113}$ | $L^{146}$ |
| 664. | $L^{113}$ | $L^{147}$ |
| 665. | $L^{113}$ | $L^{148}$ |
| 666. | $L^{113}$ | $L^{149}$ |
| 667. | $L^{113}$ | $L^{150}$ |
| 668. | $L^{113}$ | $L^{151}$ |
| 669. | $L^{113}$ | $L^{152}$ |
| 670. | $L^{113}$ | $L^{153}$ |
| 671. | $L^{113}$ | $L^{154}$ |
| 672. | $L^{113}$ | $L^{155}$ |
| 673. | $L^{113}$ | $L^{156}$ |
| 674. | $L^{113}$ | $L^{157}$ |
| 675. | $L^{113}$ | $L^{158}$ |
| 676. | $L^{113}$ | $L^{159}$ |
| 677. | $L^{114}$ | $L^{115}$ |
| 678. | $L^{114}$ | $L^{116}$ |
| 679. | $L^{114}$ | $L^{117}$ |
| 680. | $L^{114}$ | $L^{118}$ |
| 681. | $L^{114}$ | $L^{119}$ |
| 682. | $L^{114}$ | $L^{120}$ |
| 683. | $L^{114}$ | $L^{121}$ |
| 684. | $L^{114}$ | $L^{122}$ |
| 685. | $L^{114}$ | $L^{123}$ |
| 686. | $L^{114}$ | $L^{124}$ |
| 687. | $L^{114}$ | $L^{125}$ |
| 688. | $L^{114}$ | $L^{126}$ |
| 689. | $L^{114}$ | $L^{127}$ |
| 690. | $L^{114}$ | $L^{128}$ |
| 691. | $L^{114}$ | $L^{129}$ |
| 692. | $L^{114}$ | $L^{130}$ |
| 693. | $L^{114}$ | $L^{131}$ |
| 694. | $L^{114}$ | $L^{132}$ |
| 695. | $L^{114}$ | $L^{133}$ |
| 696. | $L^{114}$ | $L^{134}$ |
| 697. | $L^{114}$ | $L^{135}$ |
| 698. | $L^{114}$ | $L^{136}$ |
| 699. | $L^{114}$ | $L^{137}$ |
| 700. | $L^{114}$ | $L^{138}$ |
| 701. | $L^{114}$ | $L^{139}$ |
| 702. | $L^{114}$ | $L^{140}$ |
| 703. | $L^{114}$ | $L^{141}$ |
| 704. | $L^{114}$ | $L^{142}$ |
| 705. | $L^{114}$ | $L^{143}$ |
| 706. | $L^{114}$ | $L^{144}$ |
| 707. | $L^{114}$ | $L^{145}$ |
| 708. | $L^{114}$ | $L^{146}$ |
| 709. | $L^{114}$ | $L^{147}$ |
| 710. | $L^{114}$ | $L^{148}$ |
| 711. | $L^{114}$ | $L^{149}$ |
| 712. | $L^{114}$ | $L^{150}$ |
| 713. | $L^{114}$ | $L^{151}$ |
| 714. | $L^{114}$ | $L^{152}$ |
| 715. | $L^{114}$ | $L^{153}$ |
| 716. | $L^{114}$ | $L^{154}$ |
| 717. | $L^{114}$ | $L^{155}$ |
| 718. | $L^{114}$ | $L^{156}$ |
| 719. | $L^{114}$ | $L^{157}$ |
| 720. | $L^{114}$ | $L^{158}$ |
| 721. | $L^{114}$ | $L^{159}$ |
| 722. | $L^{115}$ | $L^{116}$ |
| 723. | $L^{115}$ | $L^{117}$ |
| 724. | $L^{115}$ | $L^{118}$ |
| 725. | $L^{115}$ | $L^{119}$ |
| 726. | $L^{115}$ | $L^{120}$ |
| 727. | $L^{115}$ | $L^{121}$ |
| 728. | $L^{115}$ | $L^{122}$ |
| 729. | $L^{115}$ | $L^{123}$ |
| 730. | $L^{115}$ | $L^{124}$ |
| 731. | $L^{115}$ | $L^{125}$ |
| 732. | $L^{115}$ | $L^{126}$ |
| 733. | $L^{115}$ | $L^{127}$ |
| 734. | $L^{115}$ | $L^{128}$ |
| 735. | $L^{115}$ | $L^{129}$ |
| 736. | $L^{115}$ | $L^{130}$ |
| 737. | $L^{115}$ | $L^{131}$ |
| 738. | $L^{115}$ | $L^{132}$ |
| 739. | $L^{115}$ | $L^{133}$ |
| 740. | $L^{115}$ | $L^{134}$ |
| 741. | $L^{115}$ | $L^{135}$ |
| 742. | $L^{115}$ | $L^{136}$ |
| 743. | $L^{115}$ | $L^{137}$ |
| 744. | $L^{115}$ | $L^{138}$ |
| 745. | $L^{115}$ | $L^{139}$ |
| 746. | $L^{115}$ | $L^{140}$ |
| 747. | $L^{115}$ | $L^{141}$ |
| 748. | $L^{115}$ | $L^{142}$ |
| 749. | $L^{115}$ | $L^{143}$ |
| 750. | $L^{115}$ | $L^{144}$ |
| 751. | $L^{115}$ | $L^{145}$ |
| 752. | $L^{115}$ | $L^{146}$ |
| 753. | $L^{115}$ | $L^{147}$ |
| 754. | $L^{115}$ | $L^{148}$ |
| 755. | $L^{115}$ | $L^{149}$ |
| 756. | $L^{115}$ | $L^{150}$ |
| 757. | $L^{115}$ | $L^{151}$ |
| 758. | $L^{115}$ | $L^{152}$ |
| 759. | $L^{115}$ | $L^{153}$ |
| 760. | $L^{115}$ | $L^{154}$ |
| 761. | $L^{115}$ | $L^{155}$ |
| 762. | $L^{115}$ | $L^{156}$ |
| 763. | $L^{115}$ | $L^{157}$ |
| 764. | $L^{115}$ | $L^{158}$ |
| 765. | $L^{115}$ | $L^{159}$ |
| 766. | $L^{116}$ | $L^{117}$ |
| 767. | $L^{116}$ | $L^{118}$ |
| 768. | $L^{116}$ | $L^{119}$ |
| 769. | $L^{116}$ | $L^{120}$ |
| 770. | $L^{116}$ | $L^{121}$ |
| 771. | $L^{116}$ | $L^{122}$ |
| 772. | $L^{116}$ | $L^{123}$ |
| 773. | $L^{116}$ | $L^{124}$ |
| 774. | $L^{116}$ | $L^{125}$ |
| 775. | $L^{116}$ | $L^{126}$ |
| 776. | $L^{116}$ | $L^{127}$ |
| 777. | $L^{116}$ | $L^{128}$ |
| 778. | $L^{116}$ | $L^{129}$ |
| 779. | $L^{116}$ | $L^{130}$ |
| 780. | $L^{116}$ | $L^{131}$ |
| 781. | $L^{116}$ | $L^{132}$ |
| 782. | $L^{116}$ | $L^{133}$ |
| 783. | $L^{116}$ | $L^{134}$ |
| 784. | $L^{116}$ | $L^{135}$ |
| 785. | $L^{116}$ | $L^{136}$ |
| 786. | $L^{116}$ | $L^{137}$ |
| 787. | $L^{116}$ | $L^{138}$ |
| 788. | $L^{116}$ | $L^{139}$ |
| 789. | $L^{116}$ | $L^{140}$ |
| 790. | $L^{116}$ | $L^{141}$ |
| 791. | $L^{116}$ | $L^{142}$ |
| 792. | $L^{116}$ | $L^{143}$ |
| 793. | $L^{116}$ | $L^{144}$ |
| 794. | $L^{116}$ | $L^{145}$ |

TABLE 1-continued

| Compound Number | $L^1$ | $L^2$ |
|---|---|---|
| 795. | $L^{116}$ | $L^{146}$ |
| 796. | $L^{116}$ | $L^{147}$ |
| 797. | $L^{116}$ | $L^{148}$ |
| 798. | $L^{116}$ | $L^{149}$ |
| 799. | $L^{116}$ | $L^{150}$ |
| 800. | $L^{116}$ | $L^{151}$ |
| 801. | $L^{116}$ | $L^{152}$ |
| 802. | $L^{116}$ | $L^{153}$ |
| 803. | $L^{116}$ | $L^{154}$ |
| 804. | $L^{116}$ | $L^{155}$ |
| 805. | $L^{116}$ | $L^{156}$ |
| 806. | $L^{116}$ | $L^{157}$ |
| 807. | $L^{116}$ | $L^{158}$ |
| 808. | $L^{116}$ | $L^{159}$ |
| 809. | $L^{117}$ | $L^{118}$ |
| 810. | $L^{117}$ | $L^{119}$ |
| 811. | $L^{117}$ | $L^{120}$ |
| 812. | $L^{117}$ | $L^{121}$ |
| 813. | $L^{117}$ | $L^{122}$ |
| 814. | $L^{117}$ | $L^{123}$ |
| 815. | $L^{117}$ | $L^{124}$ |
| 816. | $L^{117}$ | $L^{125}$ |
| 817. | $L^{117}$ | $L^{126}$ |
| 818. | $L^{117}$ | $L^{127}$ |
| 819. | $L^{117}$ | $L^{128}$ |
| 820. | $L^{117}$ | $L^{129}$ |
| 821. | $L^{117}$ | $L^{130}$ |
| 822. | $L^{117}$ | $L^{131}$ |
| 823. | $L^{117}$ | $L^{132}$ |
| 824. | $L^{117}$ | $L^{133}$ |
| 825. | $L^{117}$ | $L^{134}$ |
| 826. | $L^{117}$ | $L^{135}$ |
| 827. | $L^{117}$ | $L^{136}$ |
| 828. | $L^{117}$ | $L^{137}$ |
| 829. | $L^{117}$ | $L^{138}$ |
| 830. | $L^{117}$ | $L^{139}$ |
| 831. | $L^{117}$ | $L^{140}$ |
| 832. | $L^{117}$ | $L^{141}$ |
| 833. | $L^{117}$ | $L^{142}$ |
| 834. | $L^{117}$ | $L^{143}$ |
| 835. | $L^{117}$ | $L^{144}$ |
| 836. | $L^{117}$ | $L^{145}$ |
| 837. | $L^{117}$ | $L^{146}$ |
| 838. | $L^{117}$ | $L^{147}$ |
| 839. | $L^{117}$ | $L^{148}$ |
| 840. | $L^{117}$ | $L^{149}$ |
| 841. | $L^{117}$ | $L^{150}$ |
| 842. | $L^{117}$ | $L^{151}$ |
| 843. | $L^{117}$ | $L^{152}$ |
| 844. | $L^{117}$ | $L^{153}$ |
| 845. | $L^{117}$ | $L^{154}$ |
| 846. | $L^{117}$ | $L^{155}$ |
| 847. | $L^{117}$ | $L^{156}$ |
| 848. | $L^{117}$ | $L^{157}$ |
| 849. | $L^{117}$ | $L^{158}$ |
| 850. | $L^{117}$ | $L^{159}$ |
| 851. | $L^{118}$ | $L^{119}$ |
| 852. | $L^{118}$ | $L^{120}$ |
| 853. | $L^{118}$ | $L^{121}$ |
| 854. | $L^{118}$ | $L^{122}$ |
| 855. | $L^{118}$ | $L^{123}$ |
| 856. | $L^{118}$ | $L^{124}$ |
| 857. | $L^{118}$ | $L^{125}$ |
| 858. | $L^{118}$ | $L^{126}$ |
| 859. | $L^{118}$ | $L^{127}$ |
| 860. | $L^{118}$ | $L^{128}$ |
| 861. | $L^{118}$ | $L^{129}$ |
| 862. | $L^{118}$ | $L^{130}$ |
| 863. | $L^{118}$ | $L^{131}$ |
| 864. | $L^{118}$ | $L^{132}$ |
| 865. | $L^{118}$ | $L^{133}$ |
| 866. | $L^{118}$ | $L^{134}$ |
| 867. | $L^{118}$ | $L^{135}$ |
| 868. | $L^{118}$ | $L^{136}$ |
| 869. | $L^{118}$ | $L^{137}$ |
| 870. | $L^{118}$ | $L^{138}$ |
| 871. | $L^{118}$ | $L^{139}$ |
| 872. | $L^{118}$ | $L^{140}$ |
| 873. | $L^{118}$ | $L^{141}$ |
| 874. | $L^{118}$ | $L^{142}$ |
| 875. | $L^{118}$ | $L^{143}$ |
| 876. | $L^{118}$ | $L^{144}$ |
| 877. | $L^{118}$ | $L^{145}$ |
| 878. | $L^{118}$ | $L^{146}$ |
| 879. | $L^{118}$ | $L^{147}$ |
| 880. | $L^{118}$ | $L^{148}$ |
| 881. | $L^{118}$ | $L^{149}$ |
| 882. | $L^{118}$ | $L^{150}$ |
| 883. | $L^{118}$ | $L^{151}$ |
| 884. | $L^{118}$ | $L^{152}$ |
| 885. | $L^{118}$ | $L^{153}$ |
| 886. | $L^{118}$ | $L^{154}$ |
| 887. | $L^{118}$ | $L^{155}$ |
| 888. | $L^{118}$ | $L^{156}$ |
| 889. | $L^{118}$ | $L^{157}$ |
| 890. | $L^{118}$ | $L^{158}$ |
| 891. | $L^{118}$ | $L^{159}$ |
| 892. | $L^{119}$ | $L^{120}$ |
| 893. | $L^{119}$ | $L^{121}$ |
| 894. | $L^{119}$ | $L^{122}$ |
| 895. | $L^{119}$ | $L^{123}$ |
| 896. | $L^{119}$ | $L^{124}$ |
| 897. | $L^{119}$ | $L^{125}$ |
| 898. | $L^{119}$ | $L^{126}$ |
| 899. | $L^{119}$ | $L^{127}$ |
| 900. | $L^{119}$ | $L^{128}$ |
| 901. | $L^{119}$ | $L^{129}$ |
| 902. | $L^{119}$ | $L^{130}$ |
| 903. | $L^{119}$ | $L^{131}$ |
| 904. | $L^{119}$ | $L^{132}$ |
| 905. | $L^{119}$ | $L^{133}$ |
| 906. | $L^{119}$ | $L^{134}$ |
| 907. | $L^{119}$ | $L^{135}$ |
| 908. | $L^{119}$ | $L^{136}$ |
| 909. | $L^{119}$ | $L^{137}$ |
| 910. | $L^{119}$ | $L^{138}$ |
| 911. | $L^{119}$ | $L^{139}$ |
| 912. | $L^{119}$ | $L^{140}$ |
| 913. | $L^{119}$ | $L^{141}$ |
| 914. | $L^{119}$ | $L^{142}$ |
| 915. | $L^{119}$ | $L^{143}$ |
| 916. | $L^{119}$ | $L^{144}$ |
| 917. | $L^{119}$ | $L^{145}$ |
| 918. | $L^{119}$ | $L^{146}$ |
| 919. | $L^{119}$ | $L^{147}$ |
| 920. | $L^{119}$ | $L^{148}$ |
| 921. | $L^{119}$ | $L^{149}$ |
| 922. | $L^{119}$ | $L^{150}$ |
| 923. | $L^{119}$ | $L^{151}$ |
| 924. | $L^{119}$ | $L^{152}$ |
| 925. | $L^{119}$ | $L^{153}$ |
| 926. | $L^{119}$ | $L^{154}$ |
| 927. | $L^{119}$ | $L^{155}$ |
| 928. | $L^{119}$ | $L^{156}$ |
| 929. | $L^{119}$ | $L^{157}$ |
| 930. | $L^{119}$ | $L^{158}$ |
| 931. | $L^{119}$ | $L^{159}$ |
| 932. | $L^{120}$ | $L^{121}$ |
| 933. | $L^{120}$ | $L^{122}$ |
| 934. | $L^{120}$ | $L^{123}$ |
| 935. | $L^{120}$ | $L^{124}$ |
| 936. | $L^{120}$ | $L^{125}$ |
| 937. | $L^{120}$ | $L^{126}$ |
| 938. | $L^{120}$ | $L^{127}$ |
| 939. | $L^{120}$ | $L^{128}$ |
| 940. | $L^{120}$ | $L^{129}$ |
| 941. | $L^{120}$ | $L^{130}$ |
| 942. | $L^{120}$ | $L^{131}$ |
| 943. | $L^{120}$ | $L^{132}$ |
| 944. | $L^{120}$ | $L^{133}$ |
| 945. | $L^{120}$ | $L^{134}$ |
| 946. | $L^{120}$ | $L^{135}$ |
| 947. | $L^{120}$ | $L^{136}$ |
| 948. | $L^{120}$ | $L^{137}$ |

TABLE 1-continued

| Compound Number | L$^1$ | L$^2$ |
|---|---|---|
| 949. | L$^{120}$ | L$^{138}$ |
| 950. | L$^{120}$ | L$^{139}$ |
| 951. | L$^{120}$ | L$^{140}$ |
| 952. | L$^{120}$ | L$^{141}$ |
| 953. | L$^{120}$ | L$^{142}$ |
| 954. | L$^{120}$ | L$^{143}$ |
| 955. | L$^{120}$ | L$^{144}$ |
| 956. | L$^{120}$ | L$^{145}$ |
| 957. | L$^{120}$ | L$^{146}$ |
| 958. | L$^{120}$ | L$^{147}$ |
| 959. | L$^{120}$ | L$^{148}$ |
| 960. | L$^{120}$ | L$^{149}$ |
| 961. | L$^{120}$ | L$^{150}$ |
| 962. | L$^{120}$ | L$^{151}$ |
| 963. | L$^{120}$ | L$^{152}$ |
| 964. | L$^{120}$ | L$^{153}$ |
| 965. | L$^{120}$ | L$^{154}$ |
| 966. | L$^{120}$ | L$^{155}$ |
| 967. | L$^{120}$ | L$^{156}$ |
| 968. | L$^{120}$ | L$^{157}$ |
| 969. | L$^{120}$ | L$^{158}$ |
| 970. | L$^{120}$ | L$^{159}$ |
| 971. | L$^{121}$ | L$^{122}$ |
| 972. | L$^{121}$ | L$^{123}$ |
| 973. | L$^{121}$ | L$^{124}$ |
| 974. | L$^{121}$ | L$^{125}$ |
| 975. | L$^{121}$ | L$^{126}$ |
| 976. | L$^{121}$ | L$^{127}$ |
| 977. | L$^{121}$ | L$^{128}$ |
| 978. | L$^{121}$ | L$^{129}$ |
| 979. | L$^{121}$ | L$^{130}$ |
| 980. | L$^{121}$ | L$^{131}$ |
| 981. | L$^{121}$ | L$^{132}$ |
| 982. | L$^{121}$ | L$^{133}$ |
| 983. | L$^{121}$ | L$^{134}$ |
| 984. | L$^{121}$ | L$^{135}$ |
| 985. | L$^{121}$ | L$^{136}$ |
| 986. | L$^{121}$ | L$^{137}$ |
| 987. | L$^{121}$ | L$^{138}$ |
| 988. | L$^{121}$ | L$^{139}$ |
| 989. | L$^{121}$ | L$^{140}$ |
| 990. | L$^{121}$ | L$^{141}$ |
| 991. | L$^{121}$ | L$^{142}$ |
| 992. | L$^{121}$ | L$^{143}$ |
| 993. | L$^{121}$ | L$^{144}$ |
| 994. | L$^{121}$ | L$^{145}$ |
| 995. | L$^{121}$ | L$^{146}$ |
| 996. | L$^{121}$ | L$^{147}$ |
| 997. | L$^{121}$ | L$^{148}$ |
| 998. | L$^{121}$ | L$^{149}$ |
| 999. | L$^{121}$ | L$^{150}$ |
| 1000. | L$^{121}$ | L$^{151}$ |
| 1001. | L$^{121}$ | L$^{152}$ |
| 1002. | L$^{121}$ | L$^{153}$ |
| 1003. | L$^{121}$ | L$^{154}$ |
| 1004. | L$^{121}$ | L$^{155}$ |
| 1005. | L$^{121}$ | L$^{156}$ |
| 1006. | L$^{121}$ | L$^{157}$ |
| 1007. | L$^{121}$ | L$^{158}$ |
| 1008. | L$^{121}$ | L$^{159}$ |
| 1009. | L$^{122}$ | L$^{123}$ |
| 1010. | L$^{122}$ | L$^{124}$ |
| 1011. | L$^{122}$ | L$^{125}$ |
| 1012. | L$^{122}$ | L$^{126}$ |
| 1013. | L$^{122}$ | L$^{127}$ |
| 1014. | L$^{122}$ | L$^{128}$ |
| 1015. | L$^{122}$ | L$^{129}$ |
| 1016. | L$^{122}$ | L$^{130}$ |
| 1017. | L$^{122}$ | L$^{131}$ |
| 1018. | L$^{122}$ | L$^{132}$ |
| 1019. | L$^{122}$ | L$^{133}$ |
| 1020. | L$^{122}$ | L$^{134}$ |
| 1021. | L$^{122}$ | L$^{135}$ |
| 1022. | L$^{122}$ | L$^{136}$ |
| 1023. | L$^{122}$ | L$^{137}$ |
| 1024. | L$^{122}$ | L$^{138}$ |
| 1025. | L$^{122}$ | L$^{139}$ |
| 1026. | L$^{122}$ | L$^{140}$ |
| 1027. | L$^{122}$ | L$^{141}$ |
| 1028. | L$^{122}$ | L$^{142}$ |
| 1029. | L$^{122}$ | L$^{143}$ |
| 1030. | L$^{122}$ | L$^{144}$ |
| 1031. | L$^{122}$ | L$^{145}$ |
| 1032. | L$^{122}$ | L$^{146}$ |
| 1033. | L$^{122}$ | L$^{147}$ |
| 1034. | L$^{122}$ | L$^{148}$ |
| 1035. | L$^{122}$ | L$^{149}$ |
| 1036. | L$^{122}$ | L$^{150}$ |
| 1037. | L$^{122}$ | L$^{151}$ |
| 1038. | L$^{122}$ | L$^{152}$ |
| 1039. | L$^{122}$ | L$^{153}$ |
| 1040. | L$^{122}$ | L$^{154}$ |
| 1041. | L$^{122}$ | L$^{155}$ |
| 1042. | L$^{122}$ | L$^{156}$ |
| 1043. | L$^{122}$ | L$^{157}$ |
| 1044. | L$^{122}$ | L$^{158}$ |
| 1045. | L$^{122}$ | L$^{159}$ |
| 1046. | L$^{123}$ | L$^{124}$ |
| 1047. | L$^{123}$ | L$^{125}$ |
| 1048. | L$^{123}$ | L$^{126}$ |
| 1049. | L$^{123}$ | L$^{127}$ |
| 1050. | L$^{123}$ | L$^{128}$ |
| 1051. | L$^{123}$ | L$^{129}$ |
| 1052. | L$^{123}$ | L$^{130}$ |
| 1053. | L$^{123}$ | L$^{131}$ |
| 1054. | L$^{123}$ | L$^{132}$ |
| 1055. | L$^{123}$ | L$^{133}$ |
| 1056. | L$^{123}$ | L$^{134}$ |
| 1057. | L$^{123}$ | L$^{135}$ |
| 1058. | L$^{123}$ | L$^{136}$ |
| 1059. | L$^{123}$ | L$^{137}$ |
| 1060. | L$^{123}$ | L$^{138}$ |
| 1061. | L$^{123}$ | L$^{139}$ |
| 1062. | L$^{123}$ | L$^{140}$ |
| 1063. | L$^{123}$ | L$^{141}$ |
| 1064. | L$^{123}$ | L$^{142}$ |
| 1065. | L$^{123}$ | L$^{143}$ |
| 1066. | L$^{123}$ | L$^{144}$ |
| 1067. | L$^{123}$ | L$^{145}$ |
| 1068. | L$^{123}$ | L$^{146}$ |
| 1069. | L$^{123}$ | L$^{147}$ |
| 1070. | L$^{123}$ | L$^{148}$ |
| 1071. | L$^{123}$ | L$^{149}$ |
| 1072. | L$^{123}$ | L$^{150}$ |
| 1073. | L$^{123}$ | L$^{151}$ |
| 1074. | L$^{123}$ | L$^{152}$ |
| 1075. | L$^{123}$ | L$^{153}$ |
| 1076. | L$^{123}$ | L$^{154}$ |
| 1077. | L$^{123}$ | L$^{155}$ |
| 1078. | L$^{123}$ | L$^{156}$ |
| 1079. | L$^{123}$ | L$^{157}$ |
| 1080. | L$^{123}$ | L$^{158}$ |
| 1081. | L$^{123}$ | L$^{159}$ |
| 1082. | L$^{124}$ | L$^{125}$ |
| 1083. | L$^{124}$ | L$^{126}$ |
| 1084. | L$^{124}$ | L$^{127}$ |
| 1085. | L$^{124}$ | L$^{128}$ |
| 1086. | L$^{124}$ | L$^{129}$ |
| 1087. | L$^{124}$ | L$^{130}$ |
| 1088. | L$^{124}$ | L$^{131}$ |
| 1089. | L$^{124}$ | L$^{132}$ |
| 1090. | L$^{124}$ | L$^{133}$ |
| 1091. | L$^{124}$ | L$^{134}$ |
| 1092. | L$^{124}$ | L$^{135}$ |
| 1093. | L$^{124}$ | L$^{136}$ |
| 1094. | L$^{124}$ | L$^{137}$ |
| 1095. | L$^{124}$ | L$^{138}$ |
| 1096. | L$^{124}$ | L$^{139}$ |
| 1097. | L$^{124}$ | L$^{140}$ |
| 1098. | L$^{124}$ | L$^{141}$ |
| 1099. | L$^{124}$ | L$^{142}$ |
| 1100. | L$^{124}$ | L$^{143}$ |
| 1101. | L$^{124}$ | L$^{144}$ |
| 1102. | L$^{124}$ | L$^{145}$ |

TABLE 1-continued

| Compound Number | L¹ | L² |
|---|---|---|
| 1103. | $L^{124}$ | $L^{146}$ |
| 1104. | $L^{124}$ | $L^{147}$ |
| 1105. | $L^{124}$ | $L^{148}$ |
| 1106. | $L^{124}$ | $L^{149}$ |
| 1107. | $L^{124}$ | $L^{150}$ |
| 1108. | $L^{124}$ | $L^{151}$ |
| 1109. | $L^{124}$ | $L^{152}$ |
| 1110. | $L^{124}$ | $L^{153}$ |
| 1111. | $L^{124}$ | $L^{154}$ |
| 1112. | $L^{124}$ | $L^{155}$ |
| 1113. | $L^{124}$ | $L^{156}$ |
| 1114. | $L^{124}$ | $L^{157}$ |
| 1115. | $L^{124}$ | $L^{158}$ |
| 1116. | $L^{124}$ | $L^{159}$ |
| 1117. | $L^{125}$ | $L^{126}$ |
| 1118. | $L^{125}$ | $L^{127}$ |
| 1119. | $L^{125}$ | $L^{128}$ |
| 1120. | $L^{125}$ | $L^{129}$ |
| 1121. | $L^{125}$ | $L^{130}$ |
| 1122. | $L^{125}$ | $L^{131}$ |
| 1123. | $L^{125}$ | $L^{132}$ |
| 1124. | $L^{125}$ | $L^{133}$ |
| 1125. | $L^{125}$ | $L^{134}$ |
| 1126. | $L^{125}$ | $L^{135}$ |
| 1127. | $L^{125}$ | $L^{136}$ |
| 1128. | $L^{125}$ | $L^{137}$ |
| 1129. | $L^{125}$ | $L^{138}$ |
| 1130. | $L^{125}$ | $L^{139}$ |
| 1131. | $L^{125}$ | $L^{140}$ |
| 1132. | $L^{125}$ | $L^{141}$ |
| 1133. | $L^{125}$ | $L^{142}$ |
| 1134. | $L^{125}$ | $L^{143}$ |
| 1135. | $L^{125}$ | $L^{144}$ |
| 1136. | $L^{125}$ | $L^{145}$ |
| 1137. | $L^{125}$ | $L^{146}$ |
| 1138. | $L^{125}$ | $L^{147}$ |
| 1139. | $L^{125}$ | $L^{148}$ |
| 1140. | $L^{125}$ | $L^{149}$ |
| 1141. | $L^{125}$ | $L^{150}$ |
| 1142. | $L^{125}$ | $L^{151}$ |
| 1143. | $L^{125}$ | $L^{152}$ |
| 1144. | $L^{125}$ | $L^{153}$ |
| 1145. | $L^{125}$ | $L^{154}$ |
| 1146. | $L^{125}$ | $L^{155}$ |
| 1147. | $L^{125}$ | $L^{156}$ |
| 1148. | $L^{125}$ | $L^{157}$ |
| 1149. | $L^{125}$ | $L^{158}$ |
| 1150. | $L^{125}$ | $L^{159}$ |

In one embodiment, a first device comprising a first organic light emitting device is disclosed. The first organic light emitting device comprises an anode; a cathode; and an organic layer, disposed between the anode and the cathode, comprising a compound having the structure according to Formula I, $L^1$-Os-$L^2$; wherein $L^1$ and $L^2$ are different; wherein $L^1$ and $L^2$ are independently selected from ligands having Formula II:

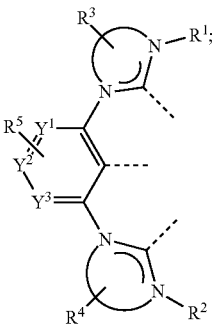

wherein $Y^1$, $Y^2$ and $Y^3$ comprise C or N; wherein $R^3$ and $R^4$ may represent mono-, or di-substitutions, or no substitution; wherein $R^5$ may represent mono-, di-, or tri-substitutions, or no substitution; wherein $R^1$ and $R^2$ are independently selected from the group consisting of alkyl and cycloalkyl; wherein $R^3$, $R^4$ and $R^5$ are independently selected from the group consisting of hydrogen, deuterium, halide, alkyl, cycloalkyl, aralkyl, alkoxy, aryloxy, amino, silyl, alkenyl, cycloalkenyl, heteroalkenyl, alkynyl, aryl, heteroaryl, and combinations thereof; wherein any two adjacent substituents of $R^1$, $R^2$, $R^3$, $R^4$ and $R^5$ are optionally joined to condense into a fused ring; and wherein the dash lines show the connection points to osmium.

In one embodiment of the first device, $Y^1$, $Y^2$ and $Y^3$ comprise C. In one embodiment, $Y^1$, $Y^2$ and $Y^3$ are N. In one embodiment, $R^1$ and $R^2$ are independently selected from the group consisting of methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, cyclopentyl, cyclohexyl, partially or fully deuterated variants thereof, and combinations thereof.

In some embodiments of the first device, $L^1$ and $L^2$ are independently selected from ligands having Formula III:

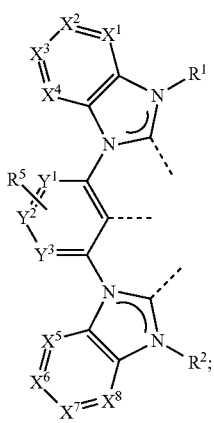

wherein $X^1$, $X^2$, $X^3$, $X^4$, $X^5$, $X^6$, $X^7$ and $X^8$ comprise C or N. In some embodiments, $X^1$, $X^2$, $X^3$, $X^4$, $X^5$, $X^6$, $X^7$ and $X^8$ comprise C.

In some embodiments of the first device, the ligands having Formula II are selected from the group consisting of $L^{101}$ to $L^{159}$ defined herein.

In some embodiments of the first device, the first emitting compound is selected from the group consisting of Compounds 1 to 1159 defined in Table 1.

The first device can be one or more of a consumer product, an organic light-emitting device, and/or a lighting panel.

The organic layer in the organic light emitting device can be an emissive layer and the compound can be an emissive dopant in some embodiments, while the compound can be a non-emissive dopant in other embodiments.

The organic layer can also include a host. In some embodiments, the host can include a metal complex. In one embodiment, the host can be a metal 8-hydroxyquinolate. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv C-C_nH_{2n+1}$, $Ar_1$, $Ar_1$-$Ar_2$, $C_nH_{2n}$—$Ar_1$, or no substitution. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof.

The host can be a compound selected from the group consisting of carbazole, dibenzothiphene, dibenzofuran, dibenzoselenophene, azacarbazole, aza-dibenzothiophene, aza-dibenzofuran, and aza-dibenzoselenophene. The "aza" designation in the fragments described above, i.e., aza-dibenzofuran, aza-dibenzonethiophene, etc., means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein. The host can include a metal complex. The host can be a specific compound selected from the group consisting of:

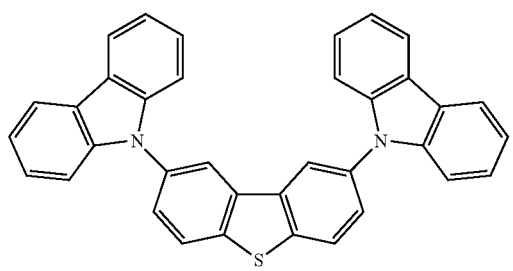
,
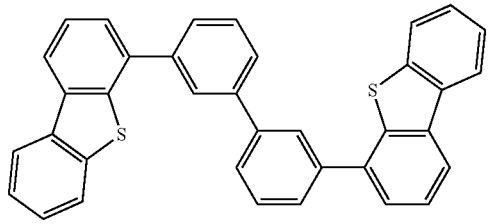
,
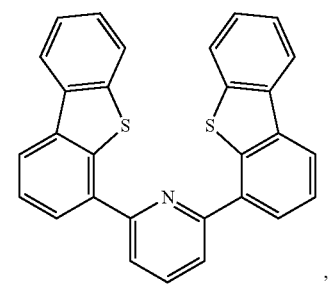
,
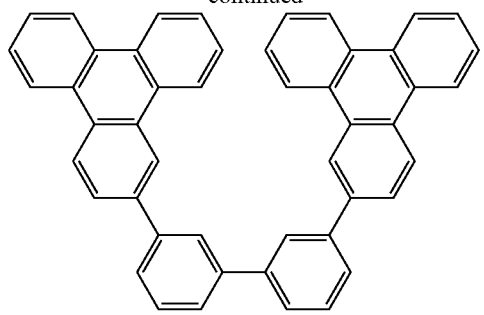
,
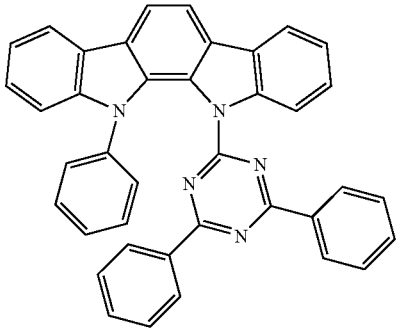
,
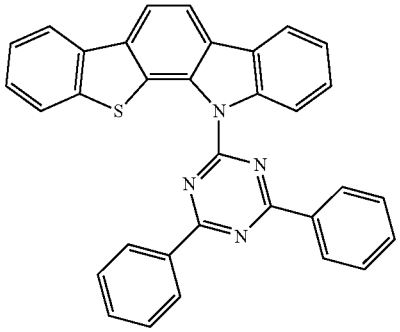
,
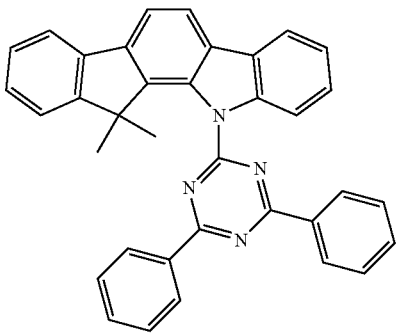
,
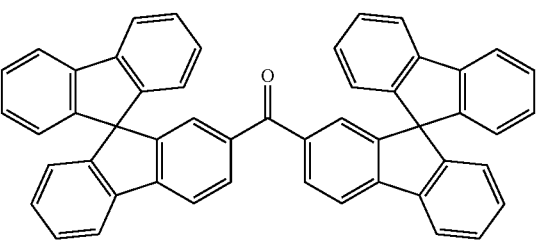
, -continued

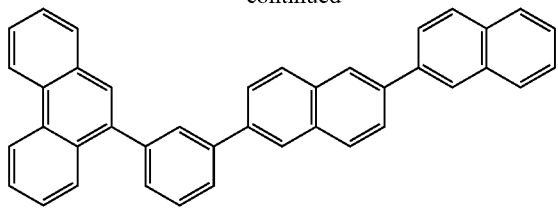

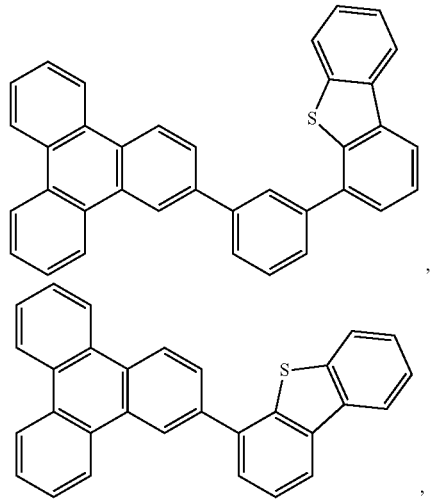

and combinations thereof.

In yet another aspect of the present disclosure, a formulation comprising the compound having a structure according to Formula I, $L^1$-Os-$L^2$, as defined herein, is disclosed. The formulation can include one or more components selected from the group consisting of a solvent, a host, a hole injection material, hole transport material, and an electron transport layer material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

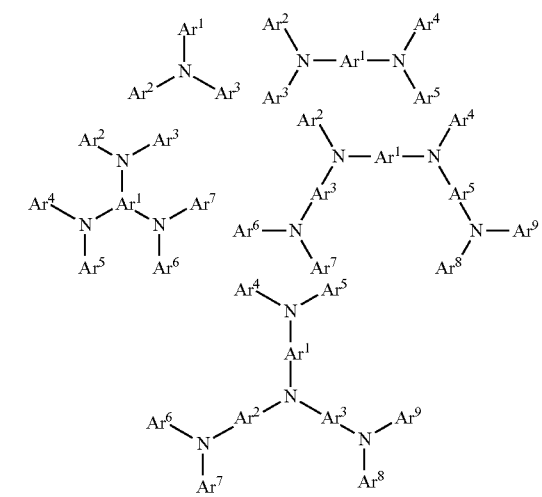

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

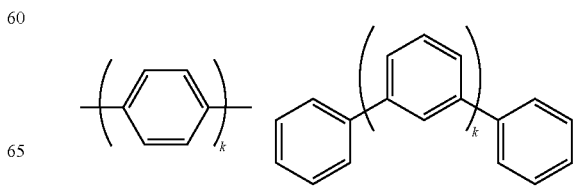

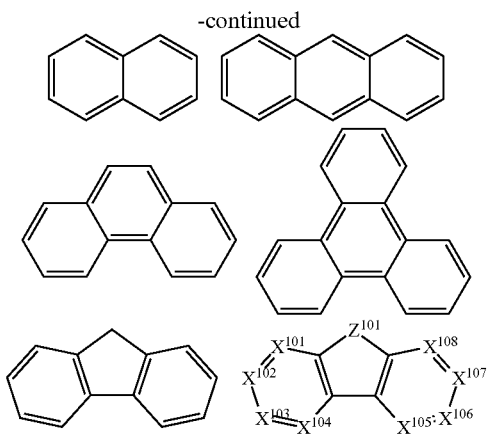

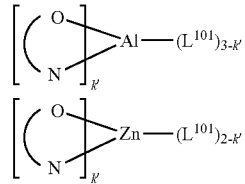

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

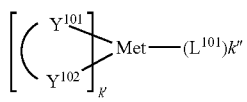

wherein Met is a metal, which can have an atomic weight greater than 40; $(Y^{101}-Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}-Y^{102})$ is a 2-phenylpyridine derivative. In another aspect, $(Y^{101}-Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

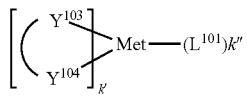

wherein Met is a metal; $(Y^{103}-Y^{104})$ is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

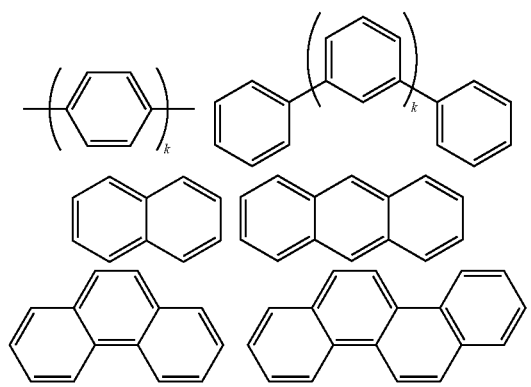

wherein (O—N) is a bidentate ligand, having metal coordinated to atoms O and N.

In another aspect, Met is selected from Ir and Pt. In a further aspect, $(Y^{103}-Y^{104})$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

-continued

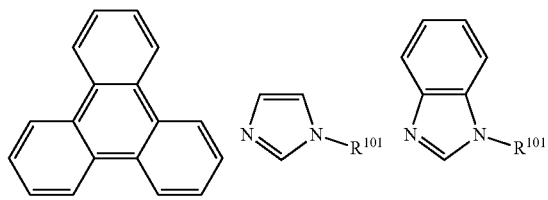
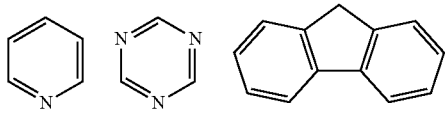
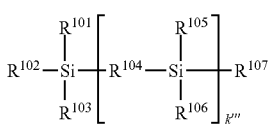
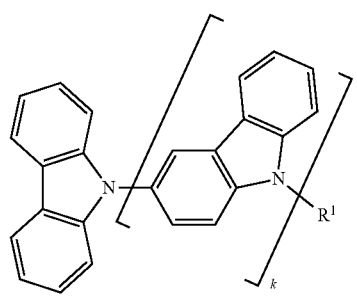
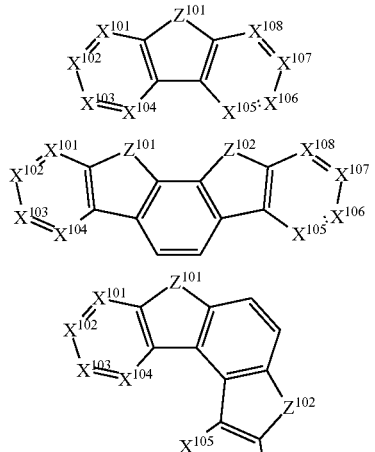
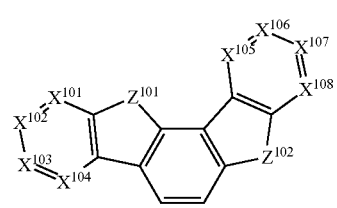
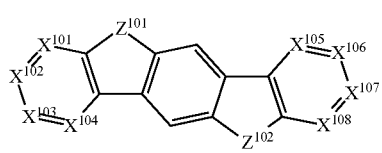

-continued

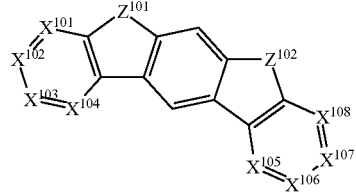

wherein $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. k is an integer from 0 to 20 or 1 to 20; k''' is an integer from 0 to 20. $X^{101}$ to $X^{108}$ is selected from C (including CH) or N. $Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

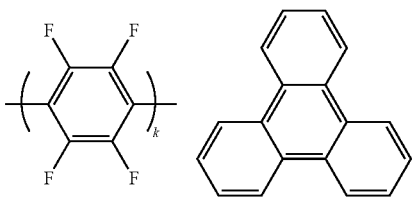
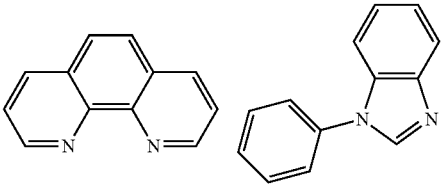
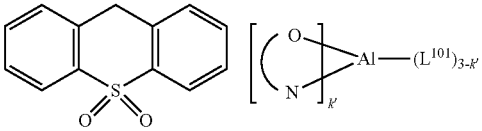

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

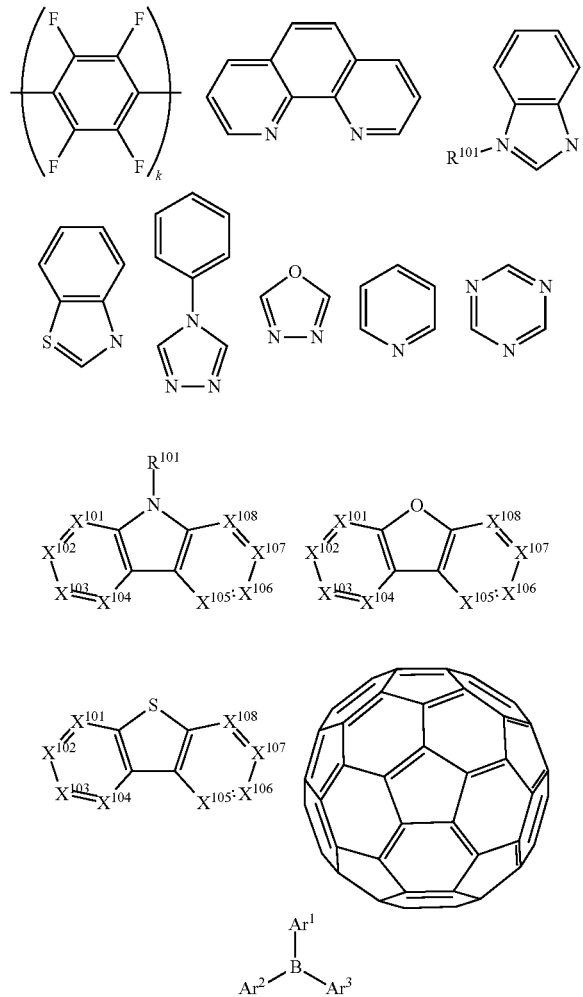

wherein $R^{101}$ is selected from the group consisting of hydrogen, deuterium, halide, alkyl, cycloalkyl, heteroalkyl, aryl-alkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

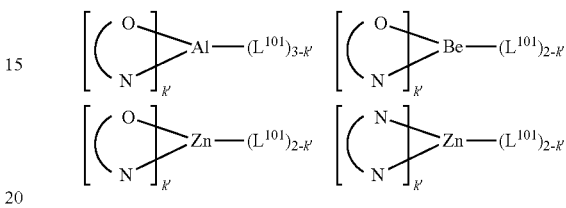

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table 2 below. Table 2 lists non-limiting classes of materials, non-limiting examples of compounds for each class, and references that disclose the materials.

TABLE 2

| MATERIAL | EXAMPLES OF MATERIAL | PUBLICATIONS |
| --- | --- | --- |
| Hole injection materials | | |
| Phthalocyanine and porphyrin compounds | | Appl. Phys. Lett. 69, 2160 (1996) |

TABLE 2-continued
| MATERIAL | EXAMPLES OF MATERIAL | PUBLICATIONS |
|---|---|---|
| Hole injection materials | | |
| Starburst triarylamines | 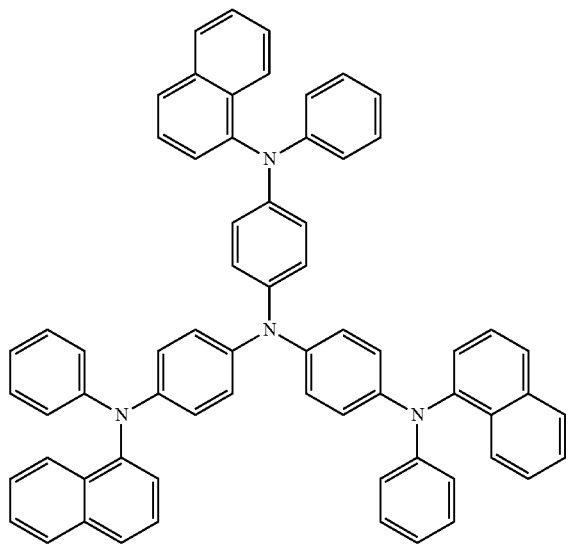 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| $CF_x$ Fluorohydrocarbon polymer |  | Appl. Phys. Lett. 78, 673 (2001) |
| Conducting polymers (e.g., PEDOT:PSS, polyaniline, polypthiophene) | 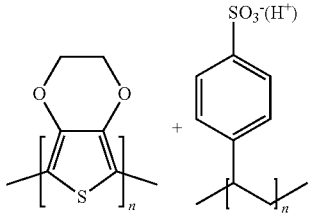 | Synth. Met. 87, 171 (1997) WO2007002683 |
| Phosphonic acid and sliane SAMs | 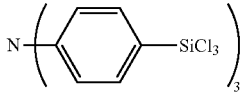 | US20030162053 |
| Triarylamine or polythiophene polymers with conductivity dopants | 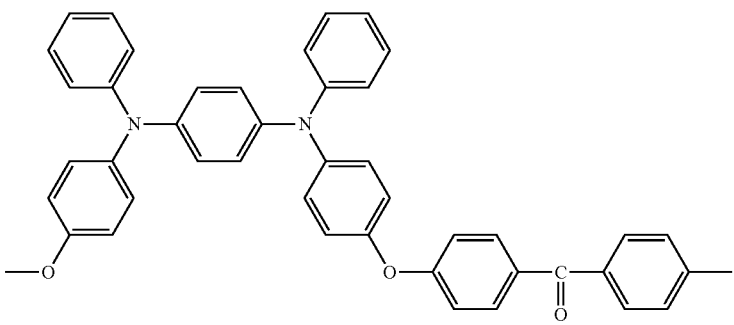 | EP1725079A1 |
and TABLE 2-continued
| MATERIAL | EXAMPLES OF MATERIAL | PUBLICATIONS |
|---|---|---|
| Hole injection materials | 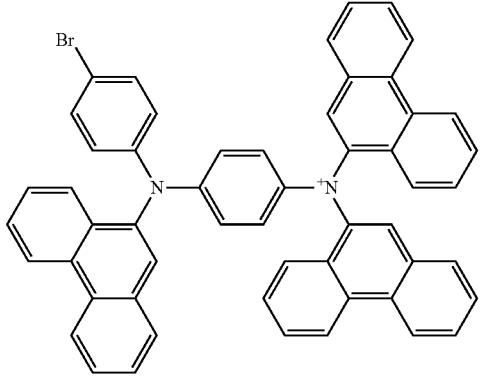 [SMILES: Brc1ccc(N(c2ccc([NH+](c3cc4ccccc4c4ccccc34)c3cc4ccccc4c4ccccc34)cc2)c2cc3ccccc3c3ccccc23)cc1] | |
| Organic compounds with conductive inorganic compounds, such as molybdenum and tungsten oxides | 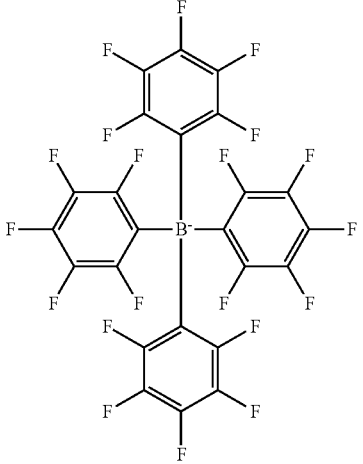 [SMILES: Fc1c(F)c(F)c([B-](c2c(F)c(F)c(F)c(F)c2F)(c2c(F)c(F)c(F)c(F)c2F)c2c(F)c(F)c(F)c(F)c2F)c(F)c1F]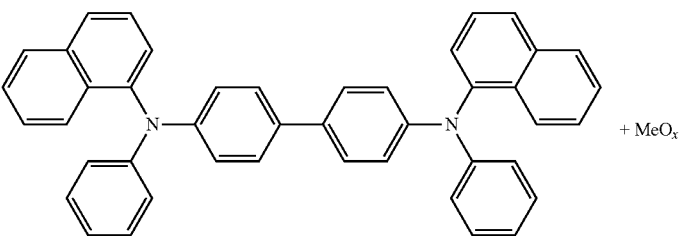 [SMILES: c1ccc(N(c2ccc(-c3ccc(N(c4ccccc4)c4cccc5ccccc45)cc3)cc2)c2cccc3ccccc23)cc1] | US20050123751<br>SID Symposium Digest, 37, 923 (2006)<br>WO2009018009 |
| n-type semiconducting organic complexes | 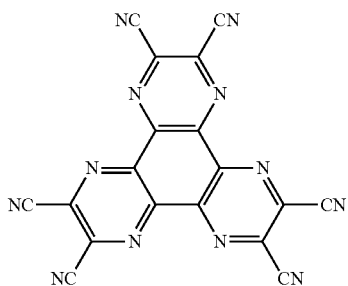 [SMILES: N#Cc1nc2c3nc(C#N)c(C#N)nc3c3nc(C#N)c(C#N)nc3c2nc1C#N] | US20020158242 |

TABLE 2-continued

| MATERIAL | EXAMPLES OF MATERIAL | PUBLICATIONS |
| --- | --- | --- |
| Hole injection materials | | |
| Metal organometallic complexes | | US20060240279 |
| Cross-linkable compounds | | US20080220265 |
| Polythiophene based polymers and copolymers | | WO 2011075644<br>EP2350216 |
| Hole transporting materials | | |
| Triarylamines<br>(e.g., TPD, α-NPD) | | Appl. Phys. Lett. 51,<br>913 (1987) |

TABLE 2-continued
| MATERIAL | EXAMPLES OF MATERIAL | PUBLICATIONS |
|---|---|---|
| Hole injection materials | 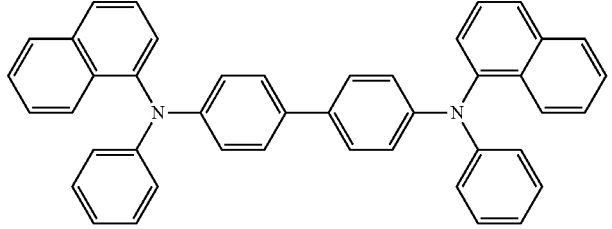 [SMILES: c1ccc(N(c2ccc(-c3ccc(N(c4ccccc4)c4cccc5ccccc45)cc3)cc2)c2cccc3ccccc23)cc1] | US5061569 |
| | 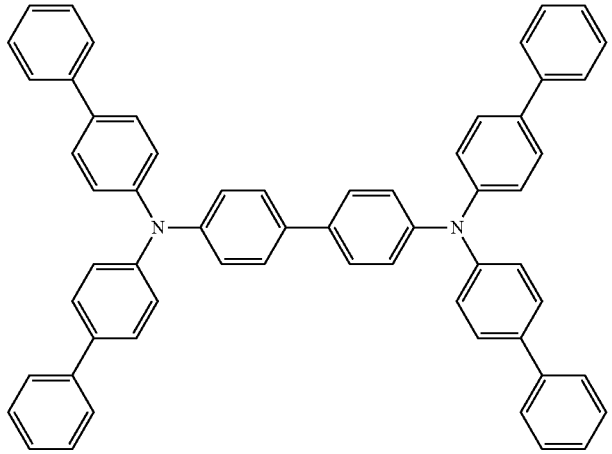 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 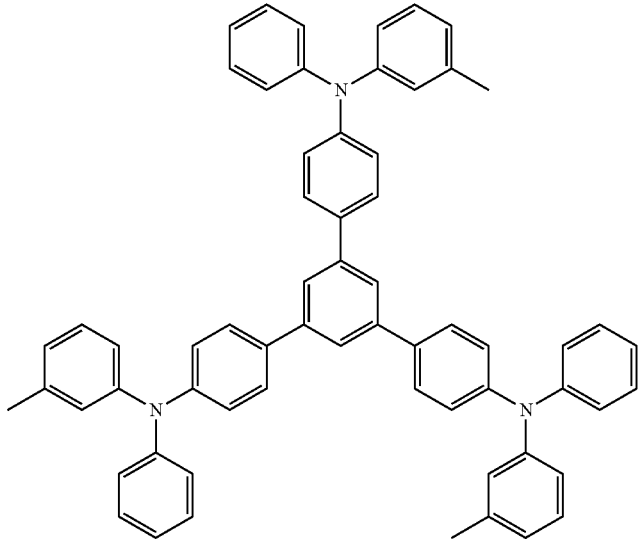 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |

TABLE 2-continued
| MATERIAL | EXAMPLES OF MATERIAL | PUBLICATIONS |
|---|---|---|
| Hole injection materials | 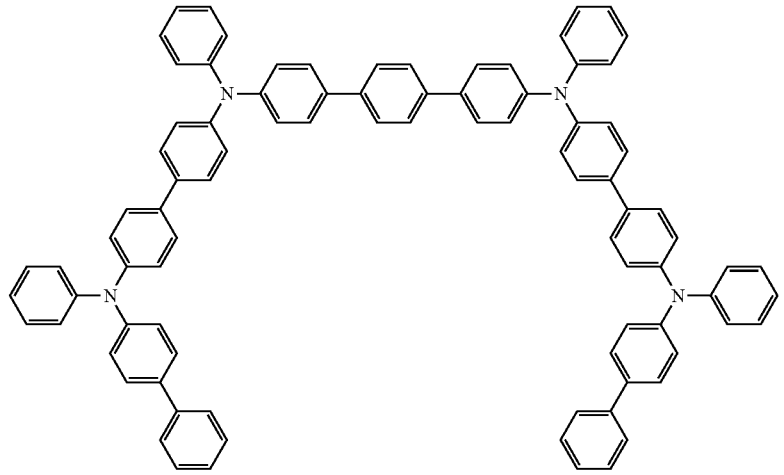 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |
|  | 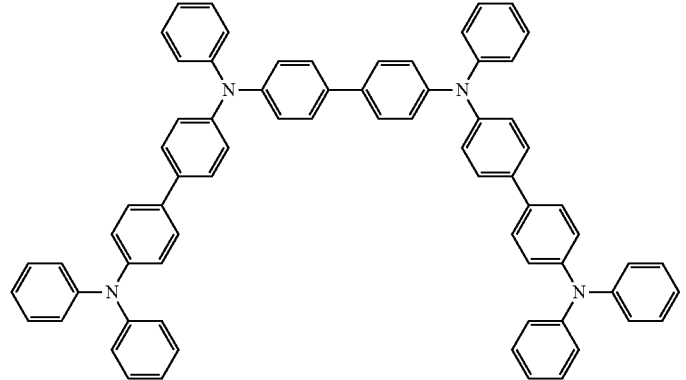 [SMILES: c1ccc(N(c2ccccc2)c2ccc(-c3ccc(N(c4ccccc4)c4ccc(-c5ccc(N(c6ccccc6)c6ccc(-c7ccc(N(c8ccccc8)c8ccccc8)cc7)cc6)cc5)cc4)cc3)cc2)cc1] | Appl. Phys. Lett. 90, 183503 (2007) |
| Triaylamine on spirofluorene core | 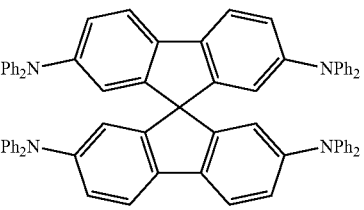 | Synth. Met. 91, 209 (1997) |
| Arylamine carbazole compounds | 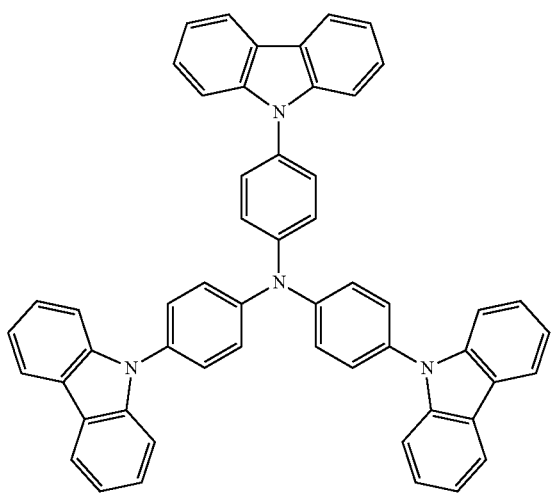 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1] | Adv. Mater. 6, 677 (1994), US20080124572 |

TABLE 2-continued
| MATERIAL | EXAMPLES OF MATERIAL | PUBLICATIONS |
| --- | --- | --- |
| Hole injection materials | | |
| Triarylamine with (di)benzothiophene/ (di)benzofuran | 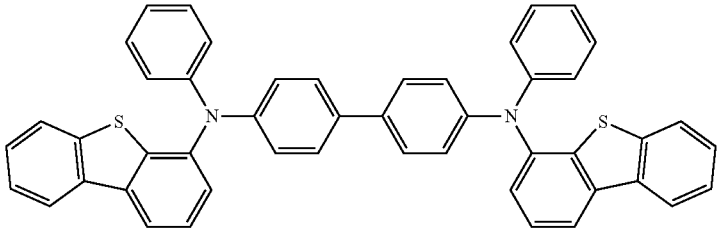 [SMILES: c1ccc(N(c2ccc(-c3ccc(N(c4ccccc4)c4cccc5c4sc4ccccc45)cc3)cc2)c2cccc3c2sc2ccccc23)cc1] | US20070278938, US20080106190 US20110163302 |
| Indolocarbazoles | 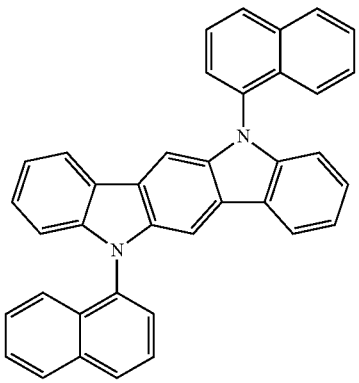 [SMILES: c1ccc2c(-n3c4ccccc4c4cc5c(cc43)c3ccccc3n5-c3cccc4ccccc34)cccc2c1] | Synth. Met. 111, 421 (2000) |
| Isoindole compounds | 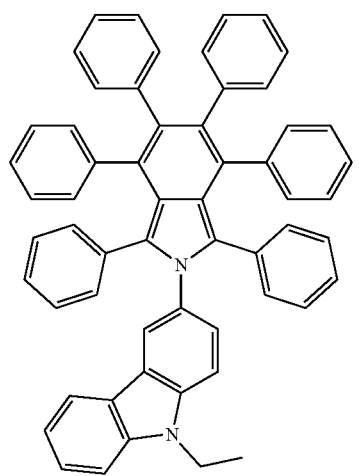 [SMILES: CCn1c2ccccc2c2cc(-n3c(-c4ccccc4)c4c(-c5ccccc5)c(-c5ccccc5)c(-c5ccccc5)c(-c5ccccc5)c4c3-c3ccccc3)ccc21] | Chem. Mater. 15, 3148 (2003) |
| Metal carbene complexes | 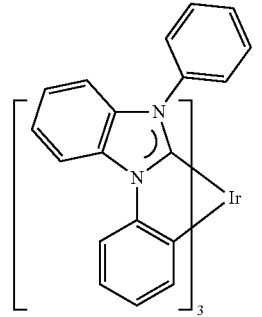 | US20080018221 |

TABLE 2-continued
| MATERIAL | EXAMPLES OF MATERIAL | PUBLICATIONS |
| --- | --- | --- |
| Hole injection materials | | |
| Phosphorescent OLED host materials | | |
| Red hosts | | |
| Arylcarbazoles | 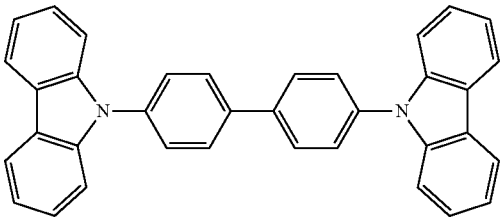 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| Metal 8-hydroxy-quinolates (e.g., Alq$_3$, BAlq) | 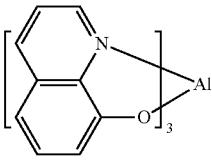 | Nature 395, 151 (1998) |
| | 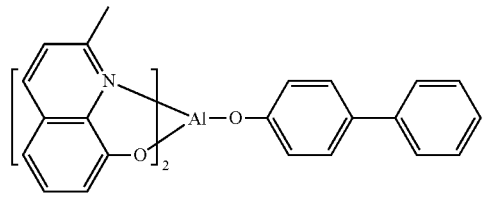 | US20060202194 |
| | 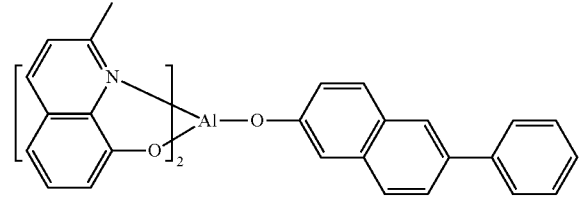 | WO2005014551 |
| | 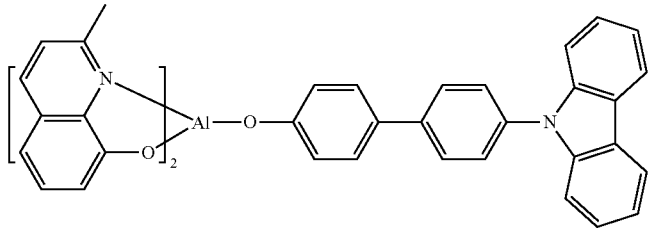 | WO2006072002 |
| Metal phenoxybenzothiazole compounds | 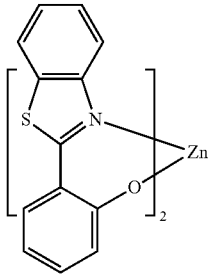 | Appl. Phys. Lett. 90, 123509 (2007) |

TABLE 2-continued
| MATERIAL | EXAMPLES OF MATERIAL | PUBLICATIONS |
|---|---|---|
| Hole injection materials | | |
| Conjugated oligomers and polymers (e.g., polyfluorene) | 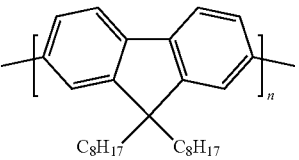 | Org. Electron. 1, 15 (2000) |
| Aromatic fused rings | 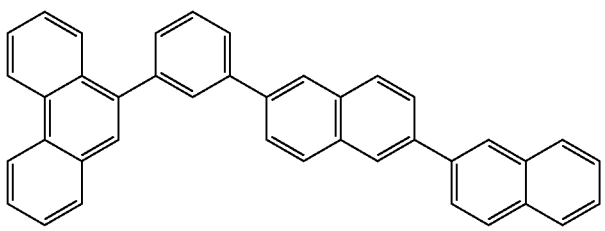 [SMILES: c1cc(-c2ccc3cc(-c4ccc5ccccc5c4)ccc3c2)cc(-c2cc3ccccc3c3ccccc23)c1] | WO2009066779, WO2009066778, WO2009063833, US20090045731, US20090045730, WO2009008311, US20090008605, US20090009065 |
| Zinc complexes | 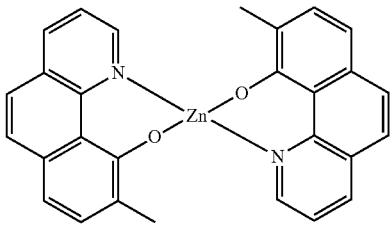 | WO2010056066 |
| Chrysene based compounds | 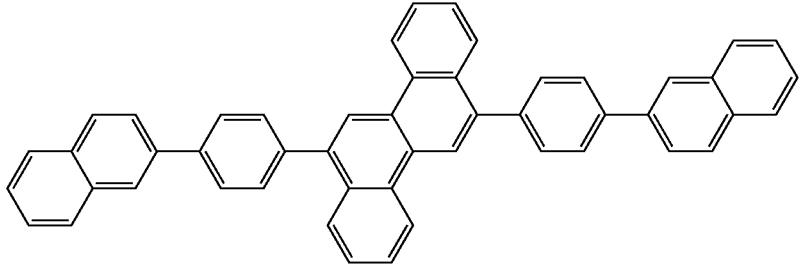 [SMILES: c1ccc2cc(-c3ccc(-c4cc5c6ccccc6c(-c6ccc(-c7ccc8ccccc8c7)cc6)cc5c5ccccc45)cc3)ccc2c1] | WO2011086863 |
| Green hosts | | |
| Arylcarbazoles | 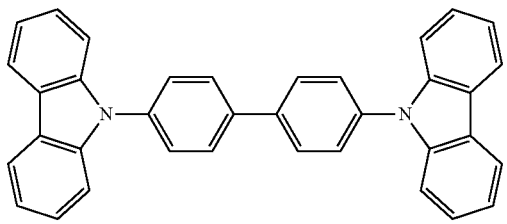 [SMILES: c1ccc2c(c1)c1ccccc1n2-c1ccc(-c2ccc(-n3c4ccccc4c4ccccc43)cc2)cc1] | Appl. Phys. Lett. 78, 1622 (2001) |
| | 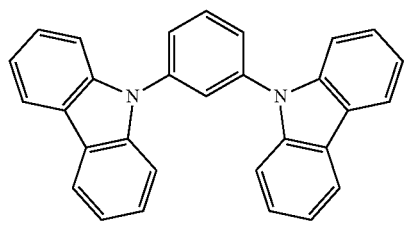 [SMILES: c1cc(-n2c3ccccc3c3ccccc32)cc(-n2c3ccccc3c3ccccc32)c1] | US20030175553 |

TABLE 2-continued
| MATERIAL | EXAMPLES OF MATERIAL | PUBLICATIONS |
|---|---|---|
| Hole injection materials | 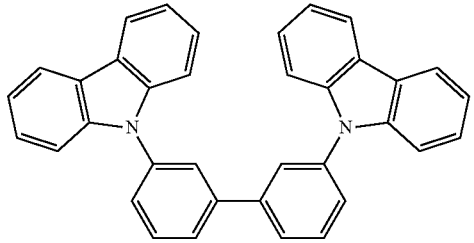 [SMILES: c1cc(-c2cccc(-n3c4ccccc4c4ccccc43)c2)cc(-n2c3ccccc3c3ccccc32)c1] | WO2001039234 |
| Aryltriphenylene compounds | 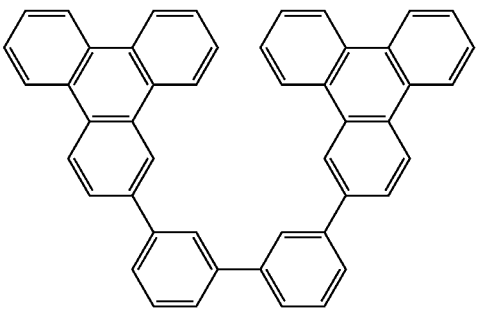 [SMILES: c1cc(-c2cccc(-c3ccc4c5ccccc5c5ccccc5c4c3)c2)cc(-c2ccc3c4ccccc4c4ccccc4c3c2)c1] | US20060280965 |
| | 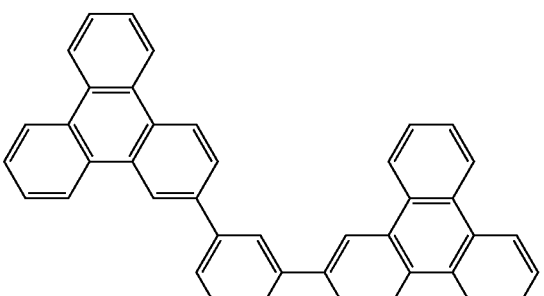 | US20060280965 |
| | 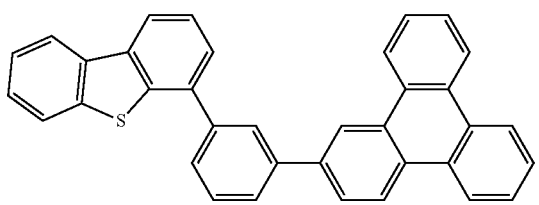 [SMILES: c1cc(-c2ccc3c4ccccc4c4ccccc4c3c2)cc(-c2cccc3c2sc2ccccc23)c1] | WO2009021126 |
| Poly-fused heteroaryl compounds | 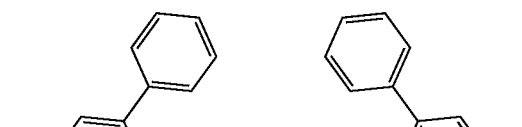 | US20090309488<br>US20090302743<br>US20100012931 |

TABLE 2-continued

| MATERIAL | EXAMPLES OF MATERIAL | PUBLICATIONS |
| --- | --- | --- |
| Hole injection materials | | |
| Donor acceptor type molecules | | WO2008056746 |
| | | WO2010107244 |
| Aza-carbazole/DBT/ DBF | | JP2008074939 |
| | | US20100187984 |

TABLE 2-continued
| MATERIAL | EXAMPLES OF MATERIAL | PUBLICATIONS |
|---|---|---|
| Hole injection materials | | |
| Polymers (e.g., PVK) | 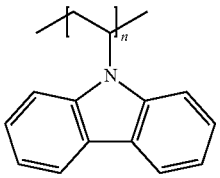 | Appl. Phys. Lett. 77, 2280 (2000) |
| Spirofluorene compounds | 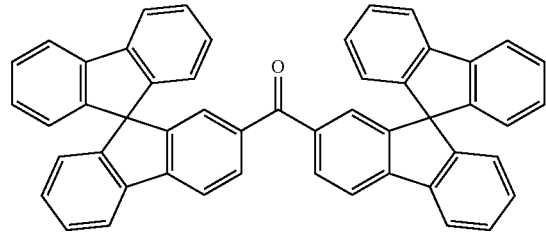 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2] | WO2004093207 |
| Metal phenoxybenzooxazole compounds | 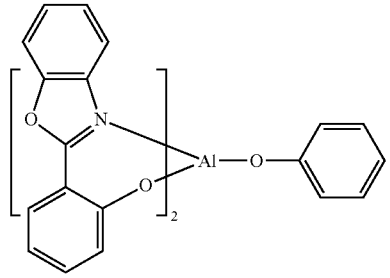 | WO2005089025 |
| | 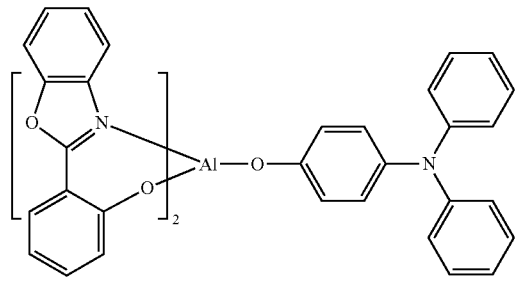 | WO2006132173 |
| | 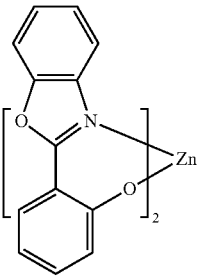 | JP200511610 |

TABLE 2-continued
| MATERIAL | EXAMPLES OF MATERIAL | PUBLICATIONS |
|---|---|---|
| Hole injection materials | | |
| Spirofluorene-carbazole compounds | 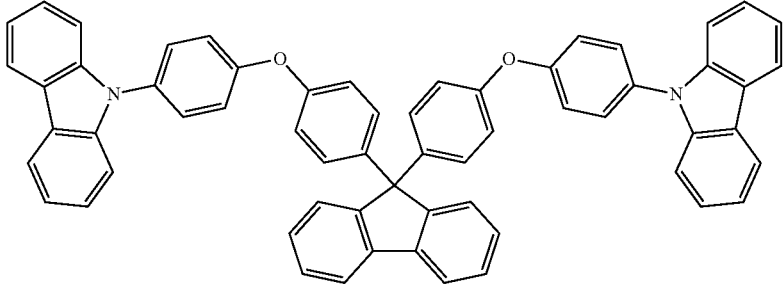 [SMILES: c1ccc2c(c1)-c1ccccc1C2(c1ccc(Oc2ccc(-n3c4ccccc4c4ccccc43)cc2)cc1)c1ccc(Oc2ccc(-n3c4ccccc4c4ccccc43)cc2)cc1] | JP2007254297 |
| | 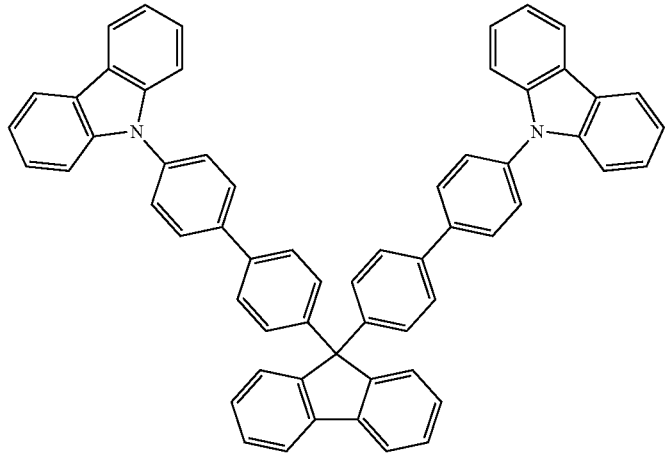 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocabazoles | 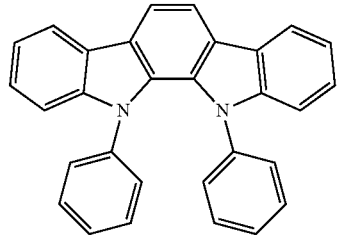 [SMILES: c1ccc(-n2c3ccccc3c3ccc4c5ccccc5n(-c5ccccc5)c4c32)cc1] | WO2007063796 |
| | 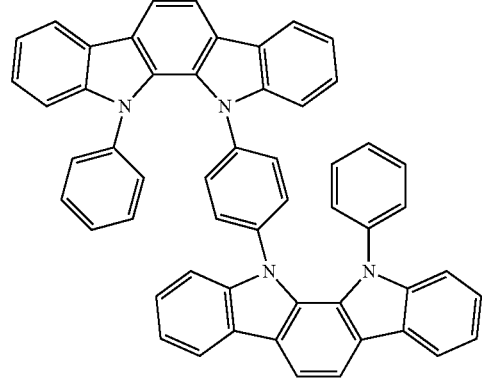 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |

TABLE 2-continued

| MATERIAL | EXAMPLES OF MATERIAL | PUBLICATIONS |
|---|---|---|
| Hole injection materials | | |
| 5-member ring electron deficient heterocycles (e.g., triazole, oxadiazole) | | J. Appl. Phys. 90, 5048 (2001) |
| | | WO2004107822 |
| Tetraphenylene complexes | | US20050112407 |
| Metal phenoxypyridine compounds | | WO2005030900 |
| Metal coordination complexes (e.g., Zn, Al with N^N ligands) | | US20040137268, US20040137267 |

TABLE 2-continued
| MATERIAL | EXAMPLES OF MATERIAL | PUBLICATIONS |
|---|---|---|
| Hole injection materials | | |
| Blue hosts | | |
| Arylcarbazoles | 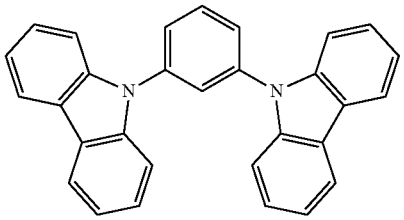 [SMILES: c1cc(-n2c3ccccc3c3ccccc32)cc(-n2c3ccccc3c3ccccc32)c1] | Appl. Phys. Lett, 82, 2422 (2003) |
| | 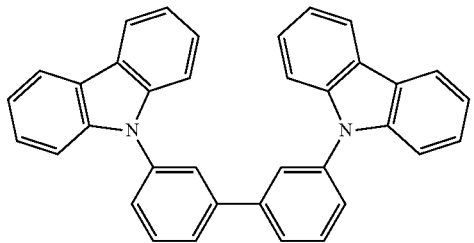 [SMILES: c1cc(-c2cccc(-n3c4ccccc4c4ccccc43)c2)cc(-n2c3ccccc3c3ccccc32)c1] | US20070190359 |
| Dibenzothiophene/Dibenzofuran-carbazole compounds | 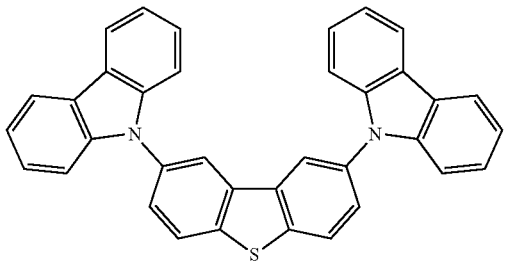 [SMILES: c1ccc2c(c1)c1ccccc1n2-c1ccc2sc3ccc(-n4c5ccccc5c5ccccc54)cc3c2c1] | WO2006114966, US20090167162 |
| | 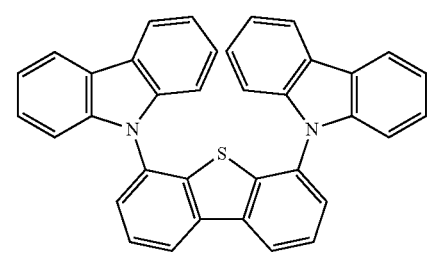 [SMILES: c1cc(-n2c3ccccc3c3ccccc32)c2sc3c(-n4c5ccccc5c5ccccc54)cccc3c2c1] | US20090167162 |
| | 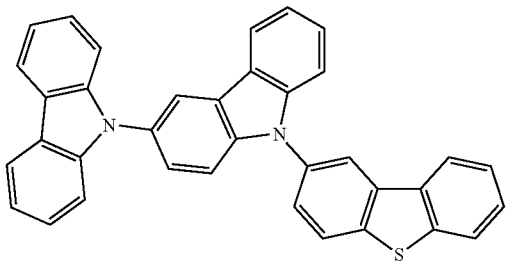 [SMILES: c1ccc2c(c1)sc1ccc(-n3c4ccccc4c4cc(-n5c6ccccc6c6ccccc65)ccc43)cc12] | WO2009086028 |
| | 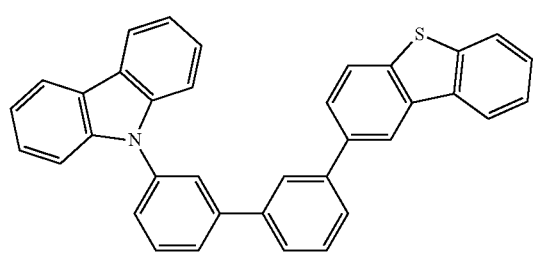 [SMILES: c1cc(-c2cccc(-n3c4ccccc4c4ccccc43)c2)cc(-c2ccc3sc4ccccc4c3c2)c1] | US20090030202, US20090017330 |

TABLE 2-continued

| MATERIAL | EXAMPLES OF MATERIAL | PUBLICATIONS |
|---|---|---|
| Hole injection materials | | |
| | | US20100084966 |
| Silicon aryl compounds | | US20050238919 |
| | | WO2009003898 |
| Silicon/Germanium aryl compounds | | EP2034538A |
| Aryl benzoyl ester | | WO2006100298 |

TABLE 2-continued
| MATERIAL | EXAMPLES OF MATERIAL | PUBLICATIONS |
|---|---|---|
| Hole injection materials | | |
| Carbazole linked by non-conjugated groups | 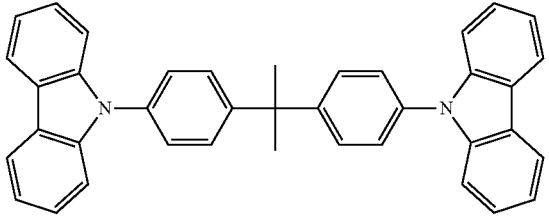 [SMILES: CC(C)(c1ccc(-n2c3ccccc3c3ccccc32)cc1)c1ccc(-n2c3ccccc3c3ccccc32)cc1] | US20040115476 |
| Aza-carbazoles | 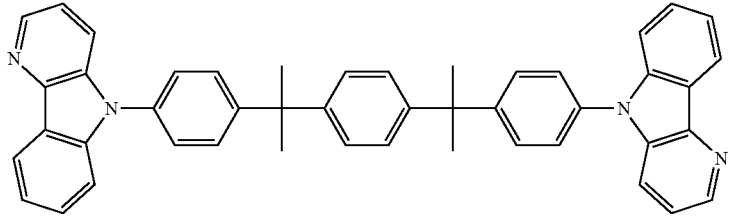 [SMILES: CC(C)(c1ccc(-n2c3ccccc3c3ncccc32)cc1)c1ccc(C(C)(C)c2ccc(-n3c4ccccc4c4ncccc43)cc2)cc1] | US20060121308 |
| High triplet metal organometallic complex | 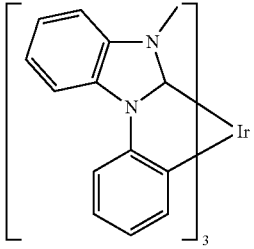 | US7154114 |
| Phosphorescent dopants | | |
| Red dopants | | |
| Heavy metal porphyrins (e.g., PtOEP) | 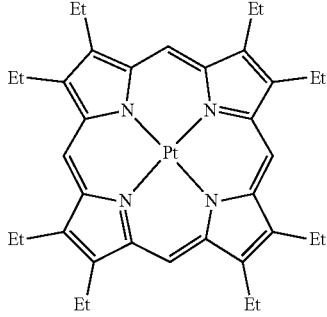 | Nature 395, 151 (1998) |
| Iridium (III) organometallic complexes | 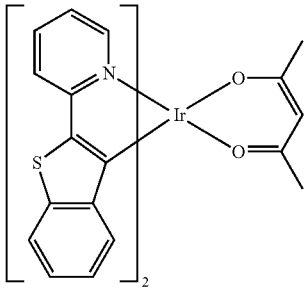 | Appl. Phys. Lett. 78, 1622 (2001) |

TABLE 2-continued

| MATERIAL | EXAMPLES OF MATERIAL | PUBLICATIONS |
|---|---|---|
| Hole injection materials | | |
| | (structure) | US2006835469 |
| | (structure) | US2006835469 |
| | (structure) | US20060202194 |
| | (structure) | US20060202194 |
| | (structure) | US20070087321 |

TABLE 2-continued

| MATERIAL | EXAMPLES OF MATERIAL | PUBLICATIONS |
|---|---|---|
| Hole injection materials | | |
| | (structure) | US20080261076<br>US20100090591 |
| | (structure) | US20070087321 |
| | (structure) | Adv. Mater. 19, 739 (2007) |
| | (structure) | WO2009100991 |
| | (structure) | WO2008101842 |

TABLE 2-continued
| MATERIAL | EXAMPLES OF MATERIAL | PUBLICATIONS |
|---|---|---|
| Hole injection materials | | |
| | 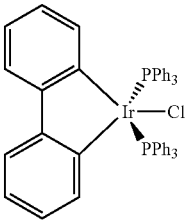 | US7232618 |
| Platinum (II) organometallic complexes | 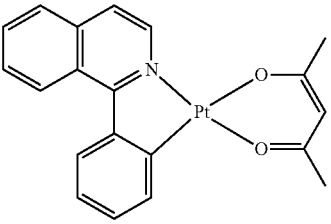 | WO2003040257 |
| | 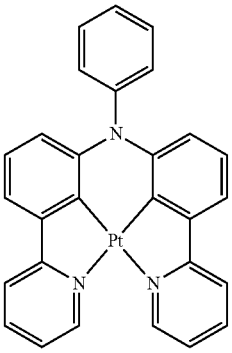 | US20070103060 |
| Osminum (III) complexes | 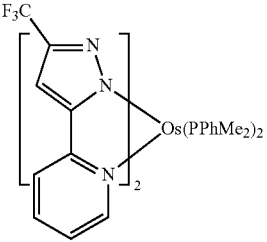 | Chem. Mater. 17, 3532 (2005) |
| Ruthenium (II) complexes | 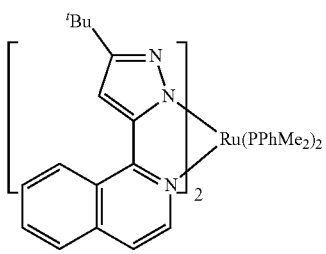 | Adv. Mater. 17, 1059 (2005) |
| Rhenium (I), (II), and (III) complexes | 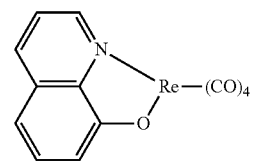 | US20050244673 |

TABLE 2-continued
| MATERIAL | EXAMPLES OF MATERIAL | PUBLICATIONS |
|---|---|---|
| Hole injection materials | | |
| Green dopants | | |
| Iridium (III) organometallic complexes | 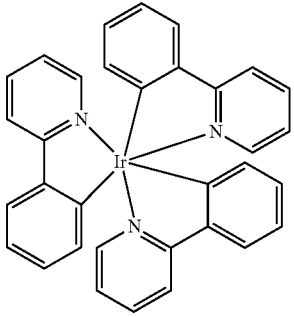<br>and its derivatives | Inorg. Chem. 40, 1704 (2001) |
| | 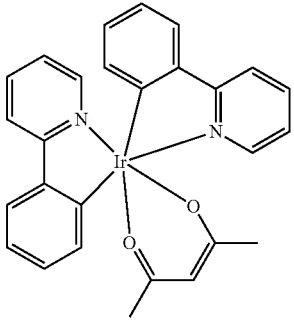 | US20020034656 |
| | 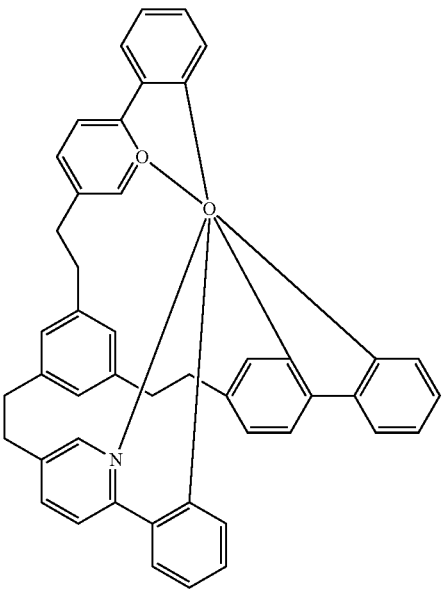 | US7332232 |

TABLE 2-continued
| MATERIAL | EXAMPLES OF MATERIAL | PUBLICATIONS |
|---|---|---|
| Hole injection materials | | |
| | 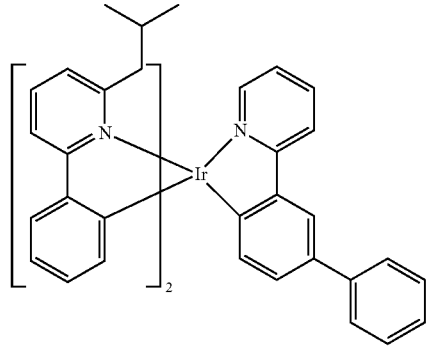 | US20090108737 |
| | 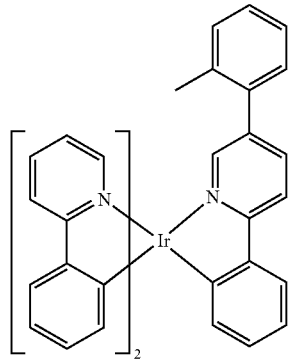 | WO2010028151 |
| | 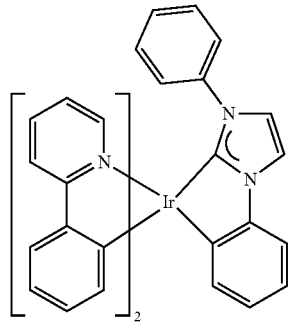 | EP1841834B |
| | 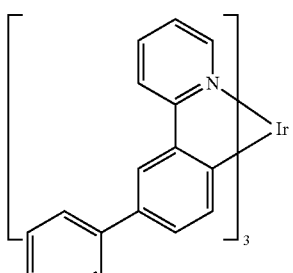 | US20060127696 |

TABLE 2-continued

| MATERIAL | EXAMPLES OF MATERIAL | PUBLICATIONS |
|---|---|---|
| Hole injection materials | | |
| | [Ir complex with pyrimidine-isoquinoline ligand]$_3$ | US20090039776 |
| | [Ir complex with pyridine-dibenzothiophene ligand]$_3$ | US6921915 |
| | [Ir(phenylpyridine)$_2$(dibenzothiophene-pyridine)] | US20100244004 |
| | [Ir(phenyl-benzimidazole)$_2$(acac)] | US6687266 |
| | [Ir(phenyl-benzimidazole)]$_3$ | Chem. Mater. 16, 2480 (2004) |

TABLE 2-continued

| MATERIAL | EXAMPLES OF MATERIAL | PUBLICATIONS |
|---|---|---|
| Hole injection materials | | US20070190359 |
| | | US 20060008670<br>JP2007123392 |
| | | WO2010086089,<br>WO2011044988 |
| | | Adv. Mater. 16, 2003<br>(2004) |
| | | Angew. Chem. Int. Ed.<br>2006, 45, 7800 |
| | | WO2009050290 |

TABLE 2-continued

| MATERIAL | EXAMPLES OF MATERIAL | PUBLICATIONS |
|---|---|---|
| Hole injection materials | | |
| | [Ir complex structure] | US20090165846 |
| | [Ir complex structure] | US20080015355 |
| | [Ir(PF$_6$)$_3$ complex structure] | US20010015432 |
| | [Ir-B-N complex structure] | US20100295032 |
| Monomer for polymeric metal organometallic compounds | [Ir complex structure with vinylphenyl] | US7250226, US7396598 |

TABLE 2-continued
| MATERIAL | EXAMPLES OF MATERIAL | PUBLICATIONS |
|---|---|---|
| Hole injection materials | | |
| Pt (II) organometallic complexes, including polydentated ligands | 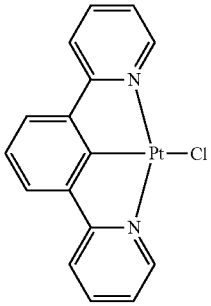 | Appl. Phys. Lett. 86, 153505 (2005) |
| | 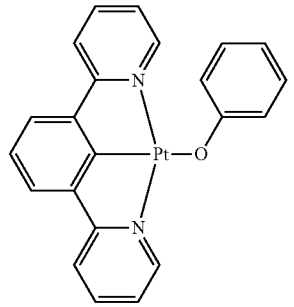 | Appl. Phys. Lett. 86, 153505 (2005) |
| | 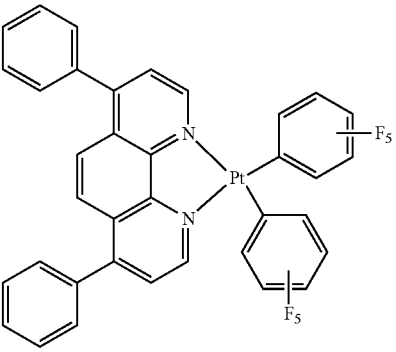 | Chem. Lett. 34, 592 (2005) |
| | 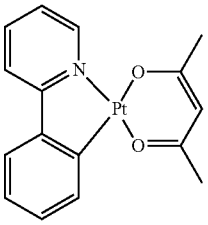 | WO2002015645 |
| | 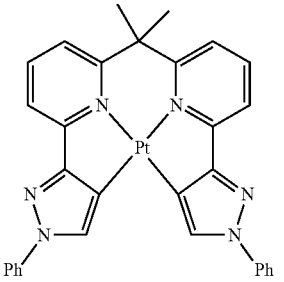 | US20060263635 |

TABLE 2-continued

| MATERIAL | EXAMPLES OF MATERIAL | PUBLICATIONS |
| --- | --- | --- |
| Hole injection materials | | |
| | | US20060182992<br>US20070103060 |
| Cu complexes | | WO2009000673 |
| | | US20070111026 |
| Gold complexes | | Chem. Commun. 2906 (2005) |

TABLE 2-continued

| MATERIAL | EXAMPLES OF MATERIAL | PUBLICATIONS |
|---|---|---|
| Hole injection materials | | |
| Rhenium (III) complexes | | Inorg. Chem. 42, 1248 (2003) |
| Osmium (II) complexes | | US7279704 |
| Deuterated organometallic complexes | | US20030138657 |
| Organometallic complexes with two or more metal centers | | US20030152802 |

TABLE 2-continued
| MATERIAL | EXAMPLES OF MATERIAL | PUBLICATIONS |
|---|---|---|
| Hole injection materials | 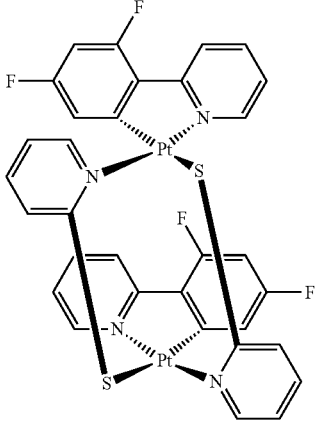 | US7090928 |
| Blue dopants | | |
| Iridium (III) organometallic complexes | 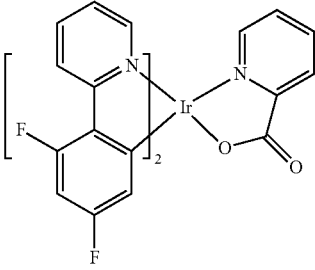 | WO2002002714 |
| | 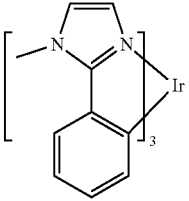 | WO2006009024 |
| | 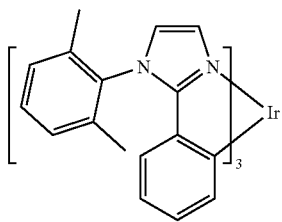 | US20060251923<br>US20110057559<br>US20110204333 |
| | 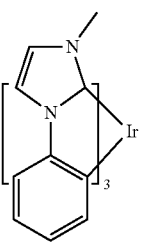 | US7393599,<br>WO2006056418,<br>US20050260441,<br>WO2005019373 |

TABLE 2-continued

| MATERIAL | EXAMPLES OF MATERIAL | PUBLICATIONS |
|---|---|---|
| Hole injection materials | | US7534505 |
| | | WO2011051404 |
| | | US7445855 |
| | | US20070190359, US20080297033 US20100148663 |
| | | US7338722 |

TABLE 2-continued

| MATERIAL | EXAMPLES OF MATERIAL | PUBLICATIONS |
|---|---|---|
| Hole injection materials | | |
| | [structure] | US20020134984 |
| | [structure] | Angew. Chem. Int. Ed. 47, 4542 (2008) |
| | [structure] | Chem. Mater. 18, 5119 (2006) |
| | [structure] | Inorg. Chem. 46, 4308 (2007) |
| | [structure] | WO2005123873 |

TABLE 2-continued

| MATERIAL | EXAMPLES OF MATERIAL | PUBLICATIONS |
| --- | --- | --- |
| Hole injection materials | | |
| | | WO2005123873 |
| | | WO2007004380 |
| | | WO2006082742 |
| Osmium (II) complexes | | US7279704 |
| | | Organometallics 23, 3745 (2004) |

TABLE 2-continued

| MATERIAL | EXAMPLES OF MATERIAL | PUBLICATIONS |
| --- | --- | --- |
| Hole injection materials | | |
| Gold complexes | 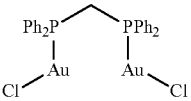 | Appl Phys. Lett. 74, 1361 (1999) |
| Platinum (II) complexes | 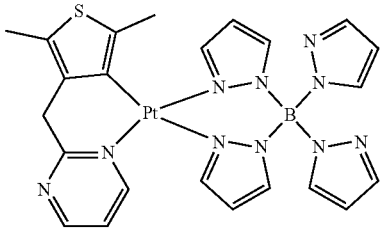 | WO2006098120, WO2006103874 |
| Pt tetradentate complexes with at least one metal-carbene bond | 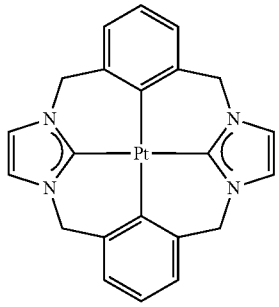 | US7655323 |
| Exciton/hole blocking layer materials | | |
| Bathocuprine compounds (e.g., BCP, BPhen) | 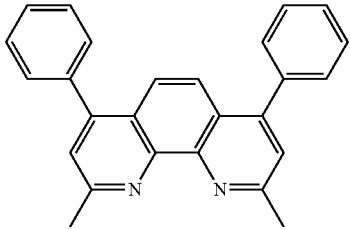 [SMILES: Cc1cc(-c2ccccc2)c2ccc3c(-c4ccccc4)cc(C)nc3c2n1] | Appl. Phys. Lett. 75, 4 (1999) |
| | 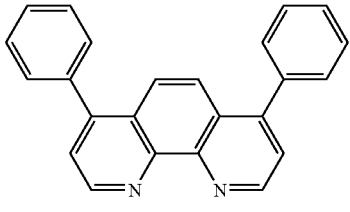 [SMILES: c1ccc(-c2ccnc3c2ccc2c(-c4ccccc4)ccnc23)cc1] | Appl. Phys. Lett. 79, 449 (2001) |
| Metal 8-hydroxyquinolates (e.g., BAlq) | 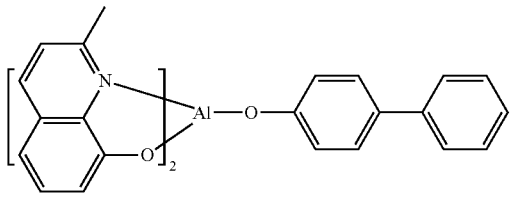 | Appl. Phys. Lett. 81, 162 (2002) |

TABLE 2-continued

| MATERIAL | EXAMPLES OF MATERIAL | PUBLICATIONS |
|---|---|---|
| Hole injection materials | | |
| 5-member ring electron deficient heterocycles such as triazole, oxadiazole, imidazole, benzoimidazole | | Appl. Phys. Lett. 81, 162 (2002) |
| Triphenylene compounds | | US20050025993 |
| Fluorinated aromatic compounds | | Appl. Phys. Lett. 79, 156 (2001) |

TABLE 2-continued

| MATERIAL | EXAMPLES OF MATERIAL | PUBLICATIONS |
|---|---|---|
| Hole injection materials | | |
| Phenothiazine-S-oxide | | WO2008132085 |
| Silylated five-membered nitrogen, oxygen, sulfur or phosphorus dibenzoheterocycles | | WO2010079051 |
| Aza-carbazoles | | US20060121308 |
| Electron transporting materials | | |
| Anthracene-benzoimidazole compounds | | WO2003060956 |

TABLE 2-continued

| MATERIAL | EXAMPLES OF MATERIAL | PUBLICATIONS |
|---|---|---|
| Hole injection materials | | |
| | | US20090179554 |
| Aza triphenylene derivatives | | US20090115316 |
| Antracene-benzothiazole compounds | | Appl. Phys. Lett. 89, 063504 (2006) |
| Metal 8-hydroxyquinolates (e.g., Alq$_3$, Zrq$_4$) | | Appl. Phys. Lett. 51, 913 (1987)<br>US7230107 |
| Metal hydroxybenoquinolates | | Chem. Lett. 5, 905 (1993) |
| Bathocuprine compounds such as BCP, BPhen, etc | | Appl. Phys. Lett. 91, 263503 (2007) |

TABLE 2-continued

| MATERIAL | EXAMPLES OF MATERIAL | PUBLICATIONS |
|---|---|---|
| Hole injection materials | | Appl. Phys. Lett. 79, 449 (2001) |
| 5-member ring electron deficient heterocycles (e.g., triazole, oxadiazole, imidazole, benzoimidazole) | | Appl. Phys. Lett. 74, 865 (1999) |
| | | Appl. Phys. Lett. 55, 1489 (1989) |
| | | Jpn. J. Apply. Phys. 32, L917 (1993) |
| Silole compounds | | Org. Electron. 4, 113 (2003) |
| Arylborane compounds | | J. Am. Chem. Soc. 120, 9714 (1998) |

TABLE 2-continued

| MATERIAL | EXAMPLES OF MATERIAL | PUBLICATIONS |
| --- | --- | --- |
| Hole injection materials | | |
| Fluorinated aromatic compounds | [fluorinated aromatic compound structure] | J. Am. Chem. Soc. 122, 1832 (2000) |
| Fullerene (e.g., C60) | [C60 fullerene structure] | US20090101870 |
| Triazine complexes | [triazine complex structure] | US20040036077 |
| Zn (N^N) complexes | [Zn(N^N) complex structure] | US6528187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A method of making an osmium(II) complex having Formula I

L$^1$-Os-L$^2$, wherein L$^1$ and L$^2$ are independently a biscarbene tridentate ligand, wherein L$^1$ and L$^2$ can be same or different, said method comprising:
(a) reacting a precursor of ligand L$^1$ with an osmium precursor to form an intermediate product, wherein the osmium precursor having the formula OsH$_x$(PR$_3$)$_y$, wherein x is an integer from 2 to 6 and y is an integer from 2 to 5, and R is selected from the group consisting of aryl, alkyl and cycloalkyl; and
(b) reacting a precursor of ligand L$^2$ with said intermediate product wherein (i) R is alkyl or cycloalkyl, (ii) y is 2, 4, or 5, (iii) x is 2, 3, 5, or 6, or (iv) a combination of conditions (i), (ii) and (iii).

2. The method of claim 1, wherein L$^1$ and L$^2$ are monoanionic ligands.

3. The method of claim 1, wherein L¹ and L² are independently selected from ligands having Formula II:

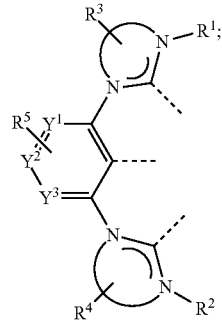

wherein Y¹, Y² and Y³ comprise C or N;

wherein R³ and R⁴ may represent mono-, or di-substitutions, or no substitution;

wherein R⁵ may represent mono-, di-, or tri-substitutions, or no substitution;

wherein R¹, R², R³, R⁴ and R⁵ are independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof;

wherein any two adjacent substituents of R¹, R², R³, R⁴ and R⁵ are optionally joined to form a ring; and wherein the dash lines show the connection points to osmium.

4. The method of claim 3, wherein Y¹, Y² and Y³ comprise C.

5. The method of claim 3, wherein Y¹ and Y³ comprise C, and Y² is N.

6. The method of claim 3, wherein Y¹ and Y³ are N, and Y² comprise C.

7. The method of claim 3, wherein R¹ and R² are independently selected from the group consisting of alkyl, cycloalkyl, aryl, heteroaryl, and partially or fully deuterated variants thereof.

8. The method of claim 3, wherein R¹ and R² are independently selected from the group consisting of methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, cyclopentyl, cyclohexyl, partially or fully deuterated variants thereof, and combinations thereof.

9. The method of claim 1, wherein R is selected from the group consisting of methyl, ethyl, propyl, 1-methylethyl, butyl, 1-methylpropyl, 2-methylpropyl, 1,1-dimethylethyl, cyclohexyl, phenyl, 2,6-dimethylphenyl, and 2-methylphenyl.

10. The method of claim 1, wherein R is 1-methylethyl.

11. The method of claim 3, wherein the ligands having Formula II are selected from the group consisting of:

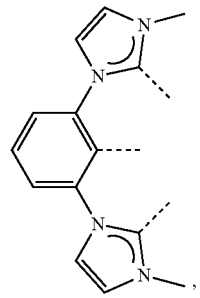 L¹⁰¹

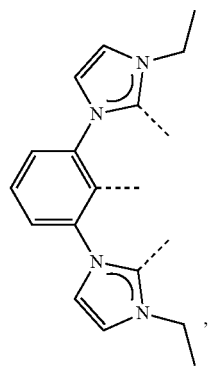 L¹⁰²

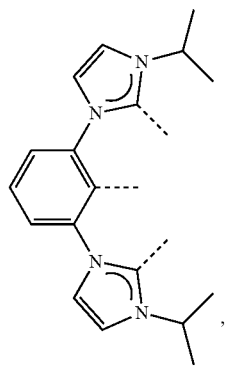 L¹⁰³

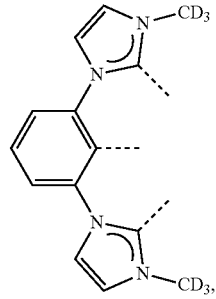 L¹⁰⁴

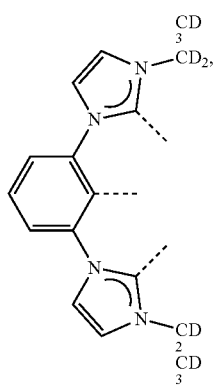
L105
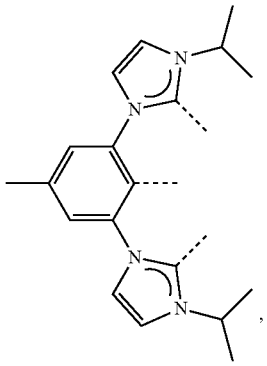
L109
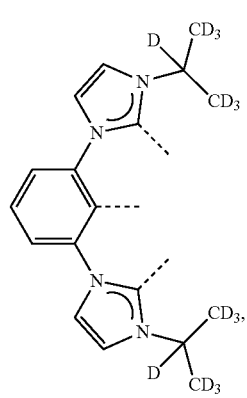
L106
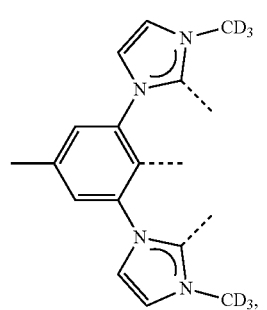
L110
L107
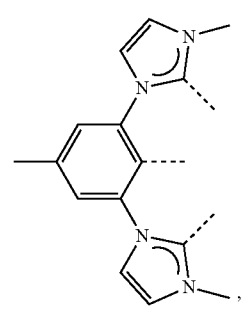
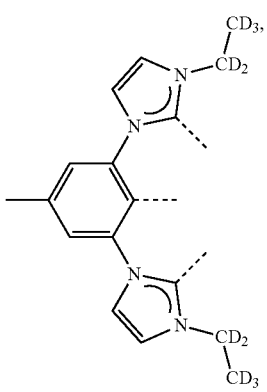
L111
L108
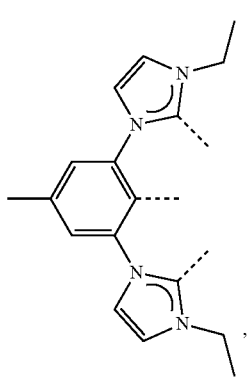
L112

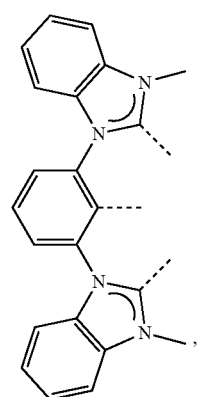 L¹¹³
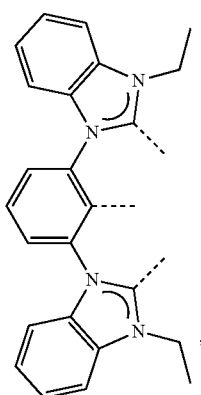 L¹¹⁴
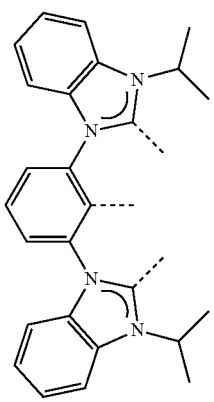 L¹¹⁵
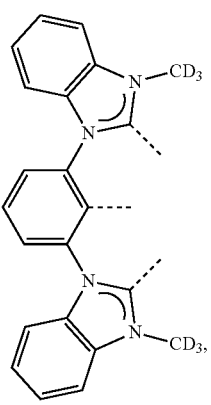 L¹¹⁶
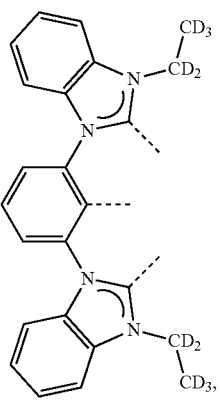 L¹¹⁷
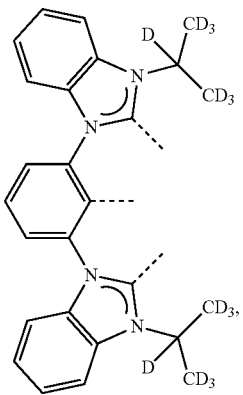 L¹¹⁸
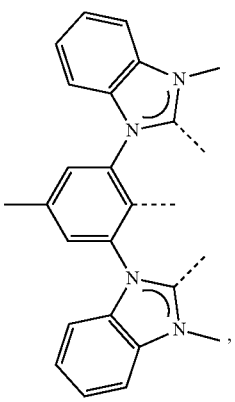 L¹¹⁹
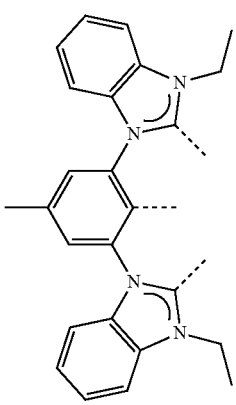 L¹²⁰

L121 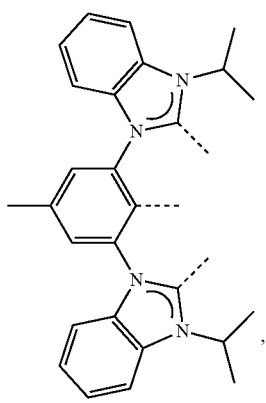
L122 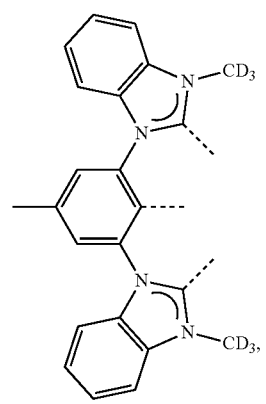
L123 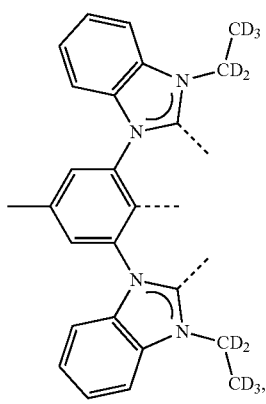
L124 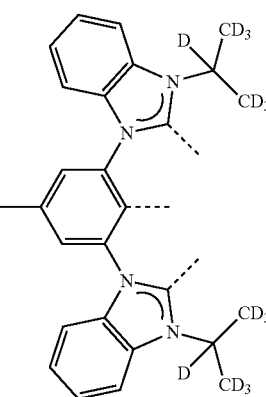
L125 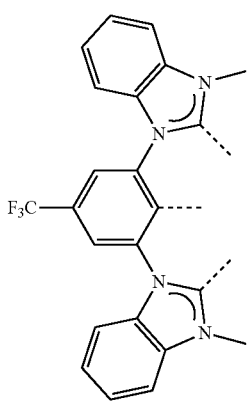
L126 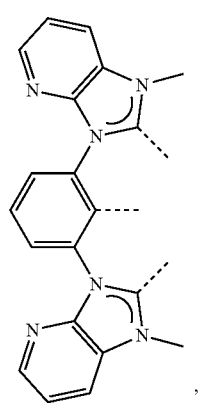
L127 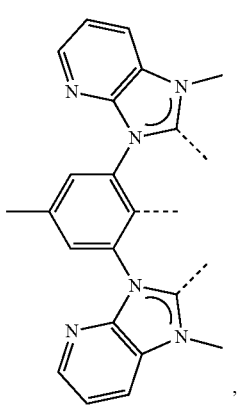
L128 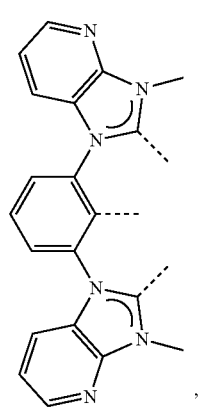

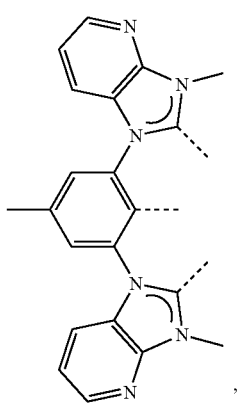 L129
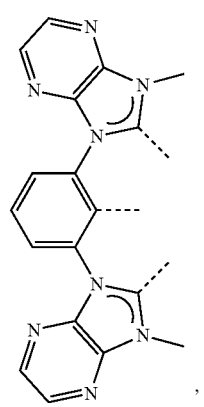 L130
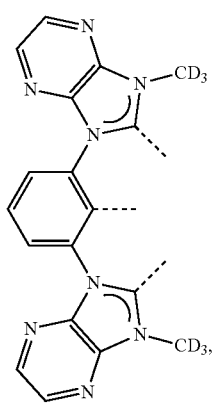 L131
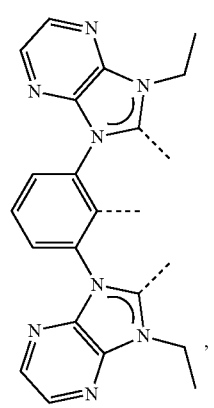 L132
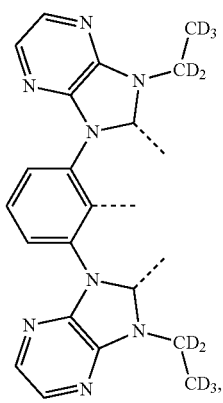 L133
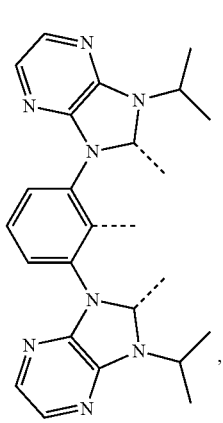 L134
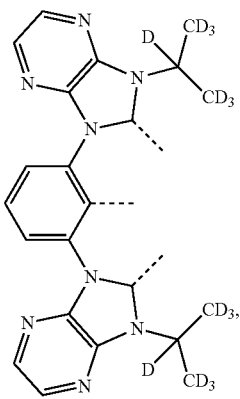 L135
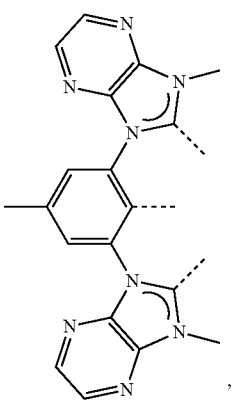 L136

-continued
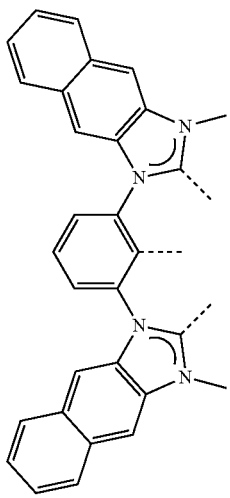
L137
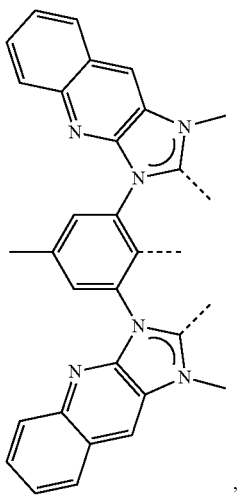
L140
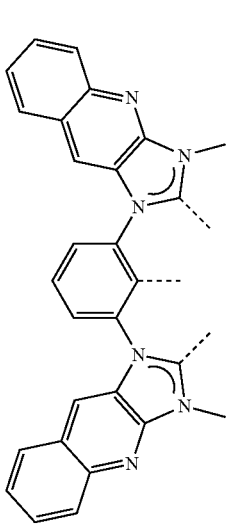
L141
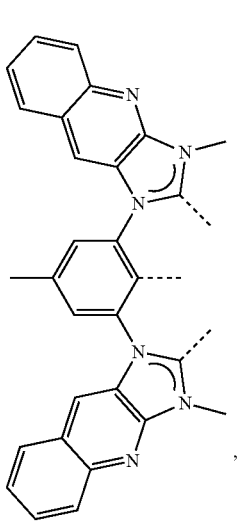
L142

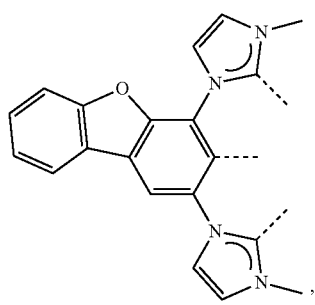 $L^{143}$
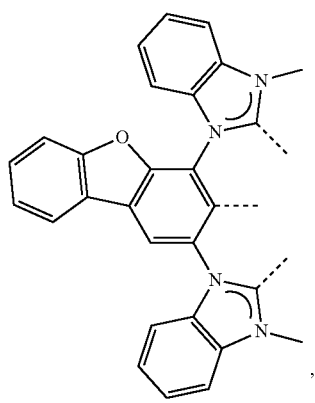 $L^{144}$
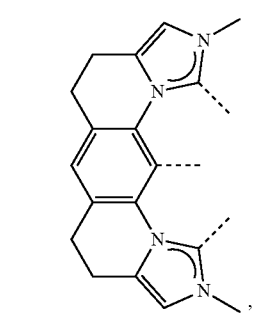 $L^{145}$
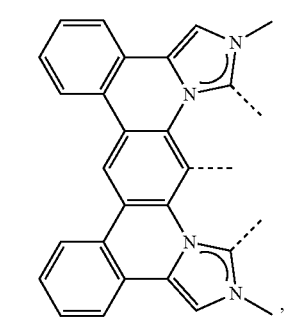 $L^{146}$
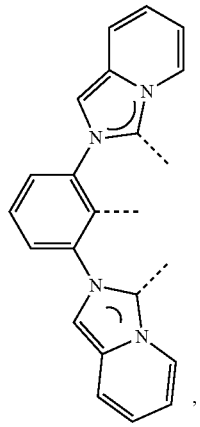 $L^{147}$
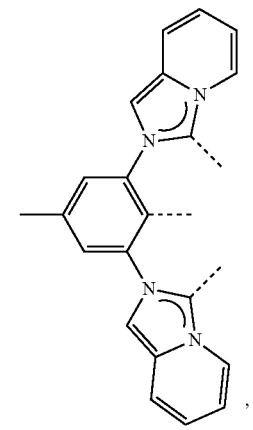 $L^{148}$
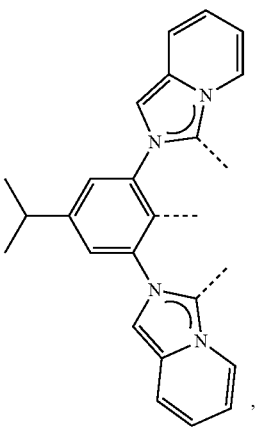 $L^{149}$

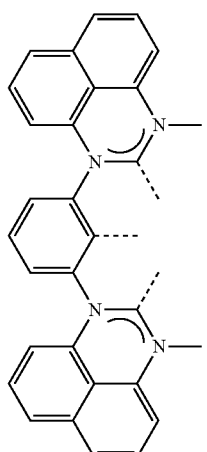 L¹⁵⁰
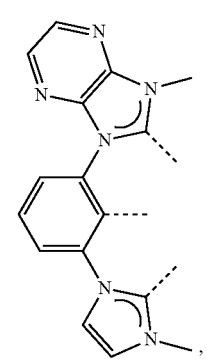 L¹⁵¹
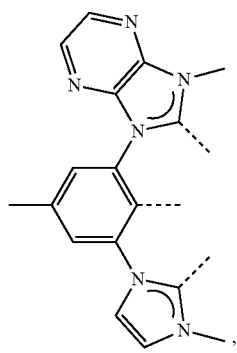 L¹⁵²
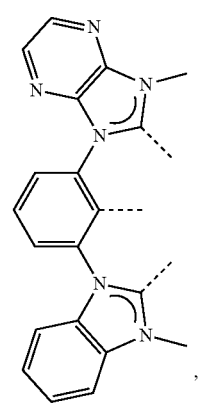 L¹⁵³
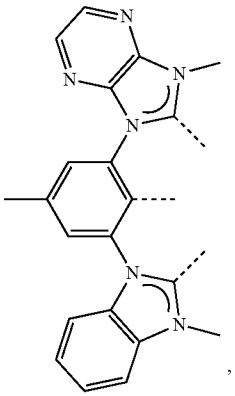 L¹⁵⁴
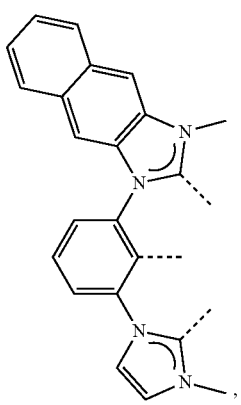 L¹⁵⁵
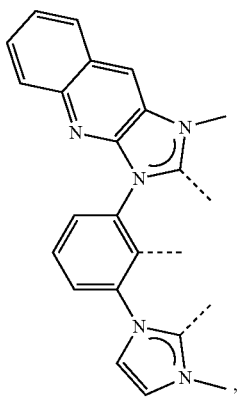 L¹⁵⁶
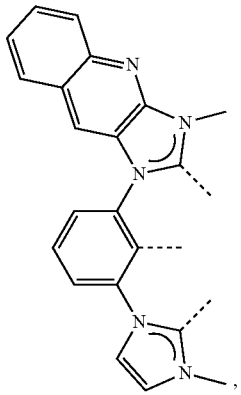 L¹⁵⁷

-continued

L[158]

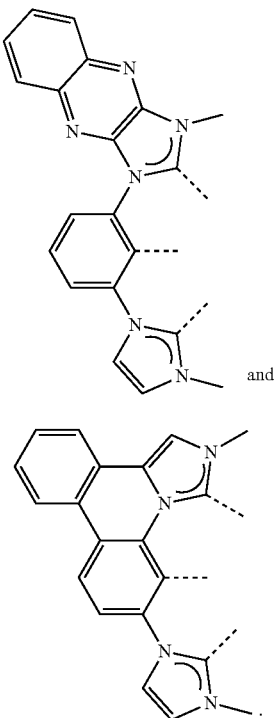

and

L[159]

12. The method of claim 11, wherein the compound is selected from the group consisting of Compounds 1 to 1150 defined in the table below:

| Compound Number | L[1] | L[2] |
|---|---|---|
| 1. | L[10] | L[102] |
| 2. | L[10] | L[103] |
| 3. | L[10] | L[104] |
| 4. | L[10] | L[105] |
| 5. | L[10] | L[106] |
| 6. | L[10] | L[107] |
| 7. | L[10] | L[108] |
| 8. | L[10] | L[109] |
| 9. | L[10] | L[110] |
| 10. | L[10] | L[111] |
| 11. | L[10] | L[112] |
| 12. | L[10] | L[113] |
| 13. | L[10] | L[114] |
| 14. | L[10] | L[115] |
| 15. | L[10] | L[116] |
| 16. | L[10] | L[117] |
| 17. | L[10] | L[118] |
| 18. | L[10] | L[119] |
| 19. | L[10] | L[120] |
| 20. | L[10] | L[121] |
| 21. | L[10] | L[122] |
| 22. | L[10] | L[123] |
| 23. | L[10] | L[124] |
| 24. | L[10] | L[125] |
| 25. | L[10] | L[126] |
| 26. | L[10] | L[127] |
| 27. | L[10] | L[128] |
| 28. | L[10] | L[129] |
| 29. | L[10] | L[130] |
| 30. | L[10] | L[131] |
| 31. | L[10] | L[132] |
| 32. | L[10] | L[133] |
| 33. | L[10] | L[134] |
| 34. | L[10] | L[135] |
| 35. | L[10] | L[136] |

-continued

| Compound Number | L[1] | L[2] |
|---|---|---|
| 36. | L[10] | L[137] |
| 37. | L[10] | L[138] |
| 38. | L[10] | L[139] |
| 39. | L[10] | L[140] |
| 40. | L[10] | L[141] |
| 41. | L[10] | L[142] |
| 42. | L[10] | L[143] |
| 43. | L[10] | L[144] |
| 44. | L[10] | L[145] |
| 45. | L[10] | L[146] |
| 46. | L[10] | L[147] |
| 47. | L[10] | L[148] |
| 48. | L[10] | L[149] |
| 49. | L[10] | L[150] |
| 50. | L[10] | L[151] |
| 51. | L[10] | L[152] |
| 52. | L[10] | L[153] |
| 53. | L[10] | L[154] |
| 54. | L[10] | L[155] |
| 55. | L[10] | L[156] |
| 56. | L[10] | L[157] |
| 57. | L[10] | L[158] |
| 58. | L[10] | L[159] |
| 59. | L[10] | L[103] |
| 60. | L[10] | L[104] |
| 61. | L[10] | L[105] |
| 62. | L[10] | L[106] |
| 63. | L[10] | L[107] |
| 64. | L[10] | L[108] |
| 65. | L[10] | L[109] |
| 66. | L[10] | L[110] |
| 67. | L[10] | L[111] |
| 68. | L[10] | L[112] |
| 69. | L[10] | L[113] |
| 70. | L[10] | L[114] |
| 71. | L[10] | L[115] |
| 72. | L[10] | L[116] |
| 73. | L[10] | L[117] |
| 74. | L[10] | L[118] |
| 75. | L[10] | L[119] |
| 76. | L[10] | L[120] |
| 77. | L[10] | L[121] |
| 78. | L[10] | L[122] |
| 79. | L[10] | L[123] |
| 80. | L[10] | L[124] |
| 81. | L[10] | L[125] |
| 82. | L[10] | L[126] |
| 83. | L[10] | L[127] |
| 84. | L[10] | L[128] |
| 85. | L[10] | L[129] |
| 86. | L[10] | L[130] |
| 87. | L[10] | L[131] |
| 88. | L[10] | L[132] |
| 89. | L[10] | L[133] |
| 90 | L[10] | L[134] |
| 91. | L[10] | L[135] |
| 92. | L[10] | L[136] |
| 93. | L[10] | L[137] |
| 94. | L[10] | L[138] |
| 95. | L[10] | L[139] |
| 96. | L[10] | L[140] |
| 97. | L[10] | L[141] |
| 98. | L[10] | L[142] |
| 99. | L[10] | L[143] |
| 100. | L[10] | L[144] |
| 101. | L[10] | L[145] |
| 102. | L[10] | L[146] |
| 103. | L[10] | L[147] |
| 104. | L[10] | L[148] |
| 105. | L[10] | L[149] |
| 106. | L[10] | L[150] |
| 107. | L[10] | L[151] |
| 108. | L[10] | L[152] |
| 109. | L[10] | L[153] |
| 110. | L[10] | L[154] |
| 111. | L[10] | L[155] |

| Compound Number | $L^1$ | $L^2$ |
|---|---|---|
| 112. | $L^{10}$ | $L^{156}$ |
| 113. | $L^{10}$ | $L^{157}$ |
| 114. | $L^{10}$ | $L^{158}$ |
| 115. | $L^{10}$ | $L^{159}$ |
| 116. | $L^{10}$ | $L^{104}$ |
| 117. | $L^{10}$ | $L^{105}$ |
| 118. | $L^{10}$ | $L^{106}$ |
| 119. | $L^{10}$ | $L^{107}$ |
| 120. | $L^{10}$ | $L^{108}$ |
| 121. | $L^{10}$ | $L^{109}$ |
| 122. | $L^{10}$ | $L^{110}$ |
| 123. | $L^{10}$ | $L^{111}$ |
| 124. | $L^{10}$ | $L^{112}$ |
| 125. | $L^{10}$ | $L^{113}$ |
| 126. | $L^{10}$ | $L^{114}$ |
| 127. | $L^{10}$ | $L^{115}$ |
| 128. | $L^{10}$ | $L^{116}$ |
| 129. | $L^{10}$ | $L^{117}$ |
| 130. | $L^{10}$ | $L^{118}$ |
| 131. | $L^{10}$ | $L^{119}$ |
| 132. | $L^{10}$ | $L^{120}$ |
| 133. | $L^{10}$ | $L^{121}$ |
| 134. | $L^{10}$ | $L^{122}$ |
| 135. | $L^{10}$ | $L^{123}$ |
| 136. | $L^{10}$ | $L^{124}$ |
| 137. | $L^{10}$ | $L^{125}$ |
| 138. | $L^{10}$ | $L^{126}$ |
| 139. | $L^{10}$ | $L^{127}$ |
| 140. | $L^{10}$ | $L^{128}$ |
| 141. | $L^{10}$ | $L^{129}$ |
| 142. | $L^{10}$ | $L^{130}$ |
| 143. | $L^{10}$ | $L^{131}$ |
| 144. | $L^{10}$ | $L^{132}$ |
| 145. | $L^{10}$ | $L^{133}$ |
| 146. | $L^{10}$ | $L^{134}$ |
| 147. | $L^{10}$ | $L^{135}$ |
| 148. | $L^{10}$ | $L^{136}$ |
| 149. | $L^{10}$ | $L^{137}$ |
| 150. | $L^{10}$ | $L^{138}$ |
| 151. | $L^{10}$ | $L^{139}$ |
| 152. | $L^{10}$ | $L^{140}$ |
| 153. | $L^{10}$ | $L^{141}$ |
| 154. | $L^{10}$ | $L^{142}$ |
| 155. | $L^{10}$ | $L^{143}$ |
| 156. | $L^{10}$ | $L^{144}$ |
| 157. | $L^{10}$ | $L^{145}$ |
| 158. | $L^{10}$ | $L^{146}$ |
| 159. | $L^{10}$ | $L^{147}$ |
| 160. | $L^{10}$ | $L^{148}$ |
| 161. | $L^{10}$ | $L^{149}$ |
| 162. | $L^{10}$ | $L^{150}$ |
| 163. | $L^{10}$ | $L^{151}$ |
| 164. | $L^{10}$ | $L^{152}$ |
| 165. | $L^{10}$ | $L^{153}$ |
| 166. | $L^{10}$ | $L^{154}$ |
| 167. | $L^{10}$ | $L^{155}$ |
| 168. | $L^{10}$ | $L^{156}$ |
| 169. | $L^{10}$ | $L^{157}$ |
| 170. | $L^{10}$ | $L^{158}$ |
| 171. | $L^{10}$ | $L^{159}$ |
| 172. | $L^{10}$ | $L^{105}$ |
| 173. | $L^{10}$ | $L^{106}$ |
| 174. | $L^{10}$ | $L^{107}$ |
| 175. | $L^{10}$ | $L^{108}$ |
| 176. | $L^{10}$ | $L^{109}$ |
| 177. | $L^{10}$ | $L^{110}$ |
| 178. | $L^{10}$ | $L^{111}$ |
| 179. | $L^{10}$ | $L^{112}$ |
| 180. | $L^{10}$ | $L^{113}$ |
| 181. | $L^{10}$ | $L^{114}$ |
| 182. | $L^{10}$ | $L^{115}$ |
| 183. | $L^{10}$ | $L^{116}$ |
| 184. | $L^{10}$ | $L^{117}$ |
| 185. | $L^{10}$ | $L^{118}$ |
| 186. | $L^{10}$ | $L^{119}$ |
| 187. | $L^{10}$ | $L^{120}$ |
| 188. | $L^{10}$ | $L^{121}$ |
| 189. | $L^{10}$ | $L^{122}$ |
| 190. | $L^{10}$ | $L^{123}$ |
| 191. | $L^{10}$ | $L^{124}$ |
| 192. | $L^{10}$ | $L^{125}$ |
| 193. | $L^{10}$ | $L^{126}$ |
| 194. | $L^{10}$ | $L^{127}$ |
| 195. | $L^{10}$ | $L^{128}$ |
| 196. | $L^{10}$ | $L^{129}$ |
| 197. | $L^{10}$ | $L^{130}$ |
| 198. | $L^{10}$ | $L^{131}$ |
| 199. | $L^{10}$ | $L^{132}$ |
| 200. | $L^{10}$ | $L^{133}$ |
| 201. | $L^{10}$ | $L^{134}$ |
| 202. | $L^{10}$ | $L^{135}$ |
| 203. | $L^{10}$ | $L^{136}$ |
| 204. | $L^{10}$ | $L^{137}$ |
| 205. | $L^{10}$ | $L^{138}$ |
| 206. | $L^{10}$ | $L^{139}$ |
| 207. | $L^{10}$ | $L^{140}$ |
| 208. | $L^{10}$ | $L^{141}$ |
| 209. | $L^{10}$ | $L^{142}$ |
| 210. | $L^{10}$ | $L^{143}$ |
| 211. | $L^{10}$ | $L^{144}$ |
| 212. | $L^{10}$ | $L^{145}$ |
| 213. | $L^{10}$ | $L^{146}$ |
| 214. | $L^{10}$ | $L^{147}$ |
| 215. | $L^{10}$ | $L^{148}$ |
| 216. | $L^{10}$ | $L^{149}$ |
| 217. | $L^{10}$ | $L^{150}$ |
| 218. | $L^{10}$ | $L^{151}$ |
| 219. | $L^{10}$ | $L^{152}$ |
| 220. | $L^{10}$ | $L^{153}$ |
| 221. | $L^{10}$ | $L^{154}$ |
| 222. | $L^{10}$ | $L^{155}$ |
| 223. | $L^{10}$ | $L^{156}$ |
| 224. | $L^{10}$ | $L^{157}$ |
| 225. | $L^{10}$ | $L^{158}$ |
| 226. | $L^{10}$ | $L^{159}$ |
| 227. | $L^{10}$ | $L^{106}$ |
| 228. | $L^{10}$ | $L^{107}$ |
| 229. | $L^{10}$ | $L^{108}$ |
| 230. | $L^{10}$ | $L^{109}$ |
| 231. | $L^{10}$ | $L^{110}$ |
| 232. | $L^{10}$ | $L^{111}$ |
| 233. | $L^{10}$ | $L^{112}$ |
| 234. | $L^{10}$ | $L^{113}$ |
| 235. | $L^{10}$ | $L^{114}$ |
| 236. | $L^{10}$ | $L^{115}$ |
| 237. | $L^{10}$ | $L^{116}$ |
| 238. | $L^{10}$ | $L^{117}$ |
| 239. | $L^{10}$ | $L^{118}$ |
| 240. | $L^{10}$ | $L^{119}$ |
| 241. | $L^{10}$ | $L^{120}$ |
| 242. | $L^{10}$ | $L^{121}$ |
| 243. | $L^{10}$ | $L^{122}$ |
| 244. | $L^{10}$ | $L^{123}$ |
| 245. | $L^{10}$ | $L^{124}$ |
| 246. | $L^{10}$ | $L^{125}$ |
| 247. | $L^{10}$ | $L^{126}$ |
| 248. | $L^{10}$ | $L^{127}$ |
| 249. | $L^{10}$ | $L^{128}$ |
| 250. | $L^{10}$ | $L^{129}$ |
| 251. | $L^{10}$ | $L^{130}$ |
| 252. | $L^{10}$ | $L^{131}$ |
| 253. | $L^{10}$ | $L^{132}$ |
| 254. | $L^{10}$ | $L^{133}$ |
| 255. | $L^{10}$ | $L^{134}$ |
| 256. | $L^{10}$ | $L^{135}$ |
| 257. | $L^{10}$ | $L^{136}$ |
| 258. | $L^{10}$ | $L^{137}$ |
| 259. | $L^{10}$ | $L^{138}$ |
| 260. | $L^{10}$ | $L^{139}$ |
| 261. | $L^{10}$ | $L^{140}$ |
| 262. | $L^{10}$ | $L^{141}$ |
| 263. | $L^{10}$ | $L^{142}$ |

| Compound Number | $L^1$ | $L^2$ |
| --- | --- | --- |
| 264. | $L^{10}$ | $L^{143}$ |
| 265. | $L^{10}$ | $L^{144}$ |
| 266. | $L^{10}$ | $L^{145}$ |
| 267. | $L^{10}$ | $L^{146}$ |
| 268. | $L^{10}$ | $L^{147}$ |
| 269. | $L^{10}$ | $L^{148}$ |
| 270. | $L^{10}$ | $L^{149}$ |
| 271. | $L^{10}$ | $L^{150}$ |
| 272. | $L^{10}$ | $L^{151}$ |
| 273. | $L^{10}$ | $L^{152}$ |
| 274. | $L^{10}$ | $L^{153}$ |
| 275. | $L^{10}$ | $L^{154}$ |
| 276. | $L^{10}$ | $L^{155}$ |
| 277. | $L^{10}$ | $L^{156}$ |
| 278. | $L^{10}$ | $L^{157}$ |
| 279. | $L^{10}$ | $L^{158}$ |
| 280. | $L^{10}$ | $L^{159}$ |
| 281. | $L^{10}$ | $L^{107}$ |
| 282. | $L^{10}$ | $L^{108}$ |
| 283. | $L^{10}$ | $L^{109}$ |
| 284. | $L^{10}$ | $L^{110}$ |
| 285. | $L^{10}$ | $L^{111}$ |
| 286. | $L^{10}$ | $L^{112}$ |
| 287. | $L^{10}$ | $L^{113}$ |
| 288. | $L^{10}$ | $L^{114}$ |
| 289. | $L^{10}$ | $L^{115}$ |
| 290. | $L^{10}$ | $L^{116}$ |
| 291. | $L^{10}$ | $L^{117}$ |
| 292. | $L^{10}$ | $L^{118}$ |
| 293. | $L^{10}$ | $L^{119}$ |
| 294. | $L^{10}$ | $L^{120}$ |
| 295. | $L^{10}$ | $L^{121}$ |
| 296. | $L^{10}$ | $L^{122}$ |
| 297. | $L^{10}$ | $L^{123}$ |
| 298. | $L^{10}$ | $L^{124}$ |
| 299. | $L^{10}$ | $L^{125}$ |
| 300. | $L^{10}$ | $L^{126}$ |
| 301. | $L^{10}$ | $L^{127}$ |
| 302. | $L^{10}$ | $L^{128}$ |
| 303. | $L^{10}$ | $L^{129}$ |
| 304. | $L^{10}$ | $L^{130}$ |
| 305. | $L^{10}$ | $L^{131}$ |
| 306. | $L^{10}$ | $L^{132}$ |
| 307. | $L^{10}$ | $L^{133}$ |
| 308. | $L^{10}$ | $L^{134}$ |
| 309. | $L^{10}$ | $L^{135}$ |
| 310. | $L^{10}$ | $L^{136}$ |
| 311. | $L^{10}$ | $L^{137}$ |
| 312. | $L^{10}$ | $L^{138}$ |
| 313. | $L^{10}$ | $L^{139}$ |
| 314. | $L^{10}$ | $L^{140}$ |
| 315. | $L^{10}$ | $L^{141}$ |
| 316. | $L^{10}$ | $L^{142}$ |
| 317. | $L^{10}$ | $L^{143}$ |
| 318. | $L^{10}$ | $L^{144}$ |
| 319. | $L^{10}$ | $L^{145}$ |
| 320. | $L^{10}$ | $L^{146}$ |
| 321. | $L^{10}$ | $L^{147}$ |
| 322. | $L^{10}$ | $L^{148}$ |
| 323. | $L^{10}$ | $L^{149}$ |
| 324. | $L^{10}$ | $L^{150}$ |
| 325. | $L^{10}$ | $L^{151}$ |
| 326. | $L^{10}$ | $L^{152}$ |
| 327. | $L^{10}$ | $L^{153}$ |
| 328. | $L^{10}$ | $L^{154}$ |
| 329. | $L^{10}$ | $L^{155}$ |
| 330. | $L^{10}$ | $L^{156}$ |
| 331. | $L^{10}$ | $L^{157}$ |
| 332. | $L^{10}$ | $L^{158}$ |
| 333. | $L^{10}$ | $L^{159}$ |
| 334. | $L^{10}$ | $L^{108}$ |
| 335. | $L^{10}$ | $L^{109}$ |
| 336. | $L^{10}$ | $L^{110}$ |
| 337. | $L^{10}$ | $L^{111}$ |
| 338. | $L^{10}$ | $L^{112}$ |
| 339. | $L^{10}$ | $L^{113}$ |
| 340. | $L^{10}$ | $L^{114}$ |
| 341. | $L^{10}$ | $L^{115}$ |
| 342. | $L^{10}$ | $L^{116}$ |
| 343. | $L^{10}$ | $L^{117}$ |
| 344. | $L^{10}$ | $L^{118}$ |
| 345. | $L^{10}$ | $L^{119}$ |
| 346. | $L^{10}$ | $L^{120}$ |
| 347. | $L^{10}$ | $L^{121}$ |
| 348. | $L^{10}$ | $L^{122}$ |
| 349. | $L^{10}$ | $L^{123}$ |
| 350. | $L^{10}$ | $L^{124}$ |
| 351. | $L^{10}$ | $L^{125}$ |
| 352. | $L^{10}$ | $L^{126}$ |
| 353. | $L^{10}$ | $L^{127}$ |
| 354. | $L^{10}$ | $L^{128}$ |
| 355. | $L^{10}$ | $L^{129}$ |
| 356. | $L^{10}$ | $L^{130}$ |
| 357. | $L^{10}$ | $L^{131}$ |
| 358. | $L^{10}$ | $L^{132}$ |
| 359. | $L^{10}$ | $L^{133}$ |
| 360. | $L^{10}$ | $L^{134}$ |
| 361. | $L^{10}$ | $L^{135}$ |
| 362. | $L^{10}$ | $L^{136}$ |
| 363. | $L^{10}$ | $L^{137}$ |
| 364. | $L^{10}$ | $L^{138}$ |
| 365. | $L^{10}$ | $L^{139}$ |
| 366. | $L^{10}$ | $L^{140}$ |
| 367. | $L^{10}$ | $L^{141}$ |
| 368. | $L^{10}$ | $L^{142}$ |
| 369. | $L^{10}$ | $L^{143}$ |
| 370. | $L^{10}$ | $L^{144}$ |
| 371. | $L^{10}$ | $L^{145}$ |
| 372. | $L^{10}$ | $L^{146}$ |
| 373. | $L^{10}$ | $L^{147}$ |
| 374. | $L^{10}$ | $L^{148}$ |
| 375. | $L^{10}$ | $L^{149}$ |
| 376. | $L^{10}$ | $L^{150}$ |
| 377. | $L^{10}$ | $L^{151}$ |
| 378. | $L^{10}$ | $L^{152}$ |
| 379. | $L^{10}$ | $L^{153}$ |
| 380. | $L^{10}$ | $L^{154}$ |
| 381. | $L^{10}$ | $L^{155}$ |
| 382. | $L^{10}$ | $L^{156}$ |
| 383. | $L^{10}$ | $L^{157}$ |
| 384. | $L^{10}$ | $L^{158}$ |
| 385. | $L^{107}$ | $L^{159}$ |
| 386. | $L^{108}$ | $L^{109}$ |
| 387. | $L^{108}$ | $L^{110}$ |
| 388. | $L^{108}$ | $L^{111}$ |
| 389. | $L^{108}$ | $L^{112}$ |
| 390. | $L^{108}$ | $L^{113}$ |
| 391. | $L^{108}$ | $L^{114}$ |
| 392. | $L^{108}$ | $L^{115}$ |
| 393. | $L^{108}$ | $L^{116}$ |
| 394. | $L^{108}$ | $L^{117}$ |
| 395. | $L^{108}$ | $L^{118}$ |
| 396. | $L^{108}$ | $L^{119}$ |
| 397. | $L^{108}$ | $L^{120}$ |
| 398. | $L^{108}$ | $L^{121}$ |
| 399. | $L^{108}$ | $L^{122}$ |
| 400. | $L^{108}$ | $L^{123}$ |
| 401. | $L^{108}$ | $L^{124}$ |
| 402. | $L^{108}$ | $L^{125}$ |
| 403. | $L^{108}$ | $L^{126}$ |
| 404. | $L^{108}$ | $L^{127}$ |
| 405. | $L^{108}$ | $L^{128}$ |
| 406. | $L^{108}$ | $L^{129}$ |
| 407. | $L^{108}$ | $L^{130}$ |
| 408. | $L^{108}$ | $L^{131}$ |
| 409. | $L^{108}$ | $L^{132}$ |
| 410. | $L^{108}$ | $L^{133}$ |
| 411. | $L^{108}$ | $L^{134}$ |
| 412. | $L^{108}$ | $L^{135}$ |
| 413. | $L^{108}$ | $L^{136}$ |
| 414. | $L^{108}$ | $L^{137}$ |
| 415. | $L^{108}$ | $L^{138}$ |

| Compound Number | $L^1$ | $L^2$ |
|---|---|---|
| 416. | $L^{108}$ | $L^{139}$ |
| 417. | $L^{108}$ | $L^{140}$ |
| 418. | $L^{108}$ | $L^{141}$ |
| 419. | $L^{108}$ | $L^{142}$ |
| 420. | $L^{108}$ | $L^{143}$ |
| 421. | $L^{108}$ | $L^{144}$ |
| 422. | $L^{108}$ | $L^{145}$ |
| 423. | $L^{108}$ | $L^{146}$ |
| 424. | $L^{108}$ | $L^{147}$ |
| 425. | $L^{108}$ | $L^{148}$ |
| 426. | $L^{108}$ | $L^{149}$ |
| 427. | $L^{108}$ | $L^{150}$ |
| 428. | $L^{108}$ | $L^{151}$ |
| 429. | $L^{108}$ | $L^{152}$ |
| 430. | $L^{108}$ | $L^{153}$ |
| 431. | $L^{108}$ | $L^{154}$ |
| 432. | $L^{108}$ | $L^{155}$ |
| 433. | $L^{108}$ | $L^{156}$ |
| 434. | $L^{108}$ | $L^{157}$ |
| 435. | $L^{108}$ | $L^{158}$ |
| 436. | $L^{108}$ | $L^{159}$ |
| 437. | $L^{109}$ | $L^{110}$ |
| 438. | $L^{109}$ | $L^{111}$ |
| 439. | $L^{109}$ | $L^{112}$ |
| 440. | $L^{109}$ | $L^{113}$ |
| 441. | $L^{109}$ | $L^{114}$ |
| 442. | $L^{109}$ | $L^{115}$ |
| 443. | $L^{109}$ | $L^{116}$ |
| 444. | $L^{109}$ | $L^{117}$ |
| 445. | $L^{109}$ | $L^{118}$ |
| 446. | $L^{109}$ | $L^{119}$ |
| 447. | $L^{109}$ | $L^{120}$ |
| 449. | $L^{109}$ | $L^{121}$ |
| 449. | $L^{109}$ | $L^{122}$ |
| 450. | $L^{109}$ | $L^{123}$ |
| 451. | $L^{109}$ | $L^{124}$ |
| 452. | $L^{109}$ | $L^{125}$ |
| 453. | $L^{109}$ | $L^{126}$ |
| 454. | $L^{109}$ | $L^{127}$ |
| 455. | $L^{109}$ | $L^{128}$ |
| 456. | $L^{109}$ | $L^{129}$ |
| 457. | $L^{109}$ | $L^{130}$ |
| 458. | $L^{109}$ | $L^{131}$ |
| 459. | $L^{109}$ | $L^{132}$ |
| 460. | $L^{109}$ | $L^{133}$ |
| 461. | $L^{109}$ | $L^{134}$ |
| 462. | $L^{109}$ | $L^{135}$ |
| 463. | $L^{109}$ | $L^{136}$ |
| 464. | $L^{109}$ | $L^{137}$ |
| 465. | $L^{109}$ | $L^{138}$ |
| 466. | $L^{109}$ | $L^{139}$ |
| 467. | $L^{109}$ | $L^{140}$ |
| 468. | $L^{109}$ | $L^{141}$ |
| 469. | $L^{109}$ | $L^{142}$ |
| 470. | $L^{109}$ | $L^{143}$ |
| 471. | $L^{109}$ | $L^{144}$ |
| 472. | $L^{109}$ | $L^{145}$ |
| 473. | $L^{109}$ | $L^{146}$ |
| 474. | $L^{109}$ | $L^{147}$ |
| 475. | $L^{109}$ | $L^{148}$ |
| 476. | $L^{109}$ | $L^{149}$ |
| 477. | $L^{109}$ | $L^{150}$ |
| 478. | $L^{109}$ | $L^{151}$ |
| 479. | $L^{109}$ | $L^{152}$ |
| 480. | $L^{109}$ | $L^{153}$ |
| 481. | $L^{109}$ | $L^{154}$ |
| 482. | $L^{109}$ | $L^{155}$ |
| 483. | $L^{109}$ | $L^{156}$ |
| 484. | $L^{109}$ | $L^{157}$ |
| 485. | $L^{109}$ | $L^{158}$ |
| 486. | $L^{109}$ | $L^{159}$ |
| 487. | $L^{110}$ | $L^{111}$ |
| 488 | $L^{110}$ | $L^{112}$ |
| 489. | $L^{110}$ | $L^{113}$ |
| 490. | $L^{110}$ | $L^{114}$ |
| 491. | $L^{110}$ | $L^{115}$ |
| 492. | $L^{110}$ | $L^{116}$ |
| 493. | $L^{110}$ | $L^{117}$ |
| 494. | $L^{110}$ | $L^{118}$ |
| 495. | $L^{110}$ | $L^{119}$ |
| 496. | $L^{110}$ | $L^{120}$ |
| 497. | $L^{110}$ | $L^{121}$ |
| 498. | $L^{110}$ | $L^{122}$ |
| 499. | $L^{110}$ | $L^{123}$ |
| 500. | $L^{110}$ | $L^{124}$ |
| 501. | $L^{110}$ | $L^{125}$ |
| 502. | $L^{110}$ | $L^{126}$ |
| 503. | $L^{110}$ | $L^{127}$ |
| 504. | $L^{110}$ | $L^{128}$ |
| 505. | $L^{110}$ | $L^{129}$ |
| 506. | $L^{110}$ | $L^{130}$ |
| 507. | $L^{110}$ | $L^{131}$ |
| 508. | $L^{110}$ | $L^{132}$ |
| 509. | $L^{110}$ | $L^{133}$ |
| 510. | $L^{110}$ | $L^{134}$ |
| 511. | $L^{110}$ | $L^{135}$ |
| 512. | $L^{110}$ | $L^{136}$ |
| 513. | $L^{110}$ | $L^{137}$ |
| 514. | $L^{110}$ | $L^{138}$ |
| 515. | $L^{110}$ | $L^{139}$ |
| 516. | $L^{110}$ | $L^{140}$ |
| 517. | $L^{110}$ | $L^{141}$ |
| 518. | $L^{110}$ | $L^{142}$ |
| 519. | $L^{110}$ | $L^{143}$ |
| 520. | $L^{110}$ | $L^{144}$ |
| 521. | $L^{110}$ | $L^{145}$ |
| 522. | $L^{110}$ | $L^{146}$ |
| 523. | $L^{110}$ | $L^{147}$ |
| 524. | $L^{110}$ | $L^{148}$ |
| 525. | $L^{110}$ | $L^{149}$ |
| 526. | $L^{110}$ | $L^{150}$ |
| 527. | $L^{110}$ | $L^{151}$ |
| 528. | $L^{110}$ | $L^{152}$ |
| 529. | $L^{110}$ | $L^{153}$ |
| 530. | $L^{110}$ | $L^{154}$ |
| 531. | $L^{110}$ | $L^{155}$ |
| 532. | $L^{110}$ | $L^{156}$ |
| 533. | $L^{110}$ | $L^{157}$ |
| 534. | $L^{110}$ | $L^{158}$ |
| 535. | $L^{110}$ | $L^{159}$ |
| 536. | $L^{111}$ | $L^{112}$ |
| 537. | $L^{111}$ | $L^{113}$ |
| 538. | $L^{111}$ | $L^{114}$ |
| 539. | $L^{111}$ | $L^{115}$ |
| 540. | $L^{111}$ | $L^{116}$ |
| 541. | $L^{111}$ | $L^{117}$ |
| 542. | $L^{111}$ | $L^{118}$ |
| 543. | $L^{111}$ | $L^{119}$ |
| 544. | $L^{111}$ | $L^{120}$ |
| 545. | $L^{111}$ | $L^{121}$ |
| 546. | $L^{111}$ | $L^{122}$ |
| 547. | $L^{111}$ | $L^{123}$ |
| 548. | $L^{111}$ | $L^{124}$ |
| 549. | $L^{111}$ | $L^{125}$ |
| 550. | $L^{111}$ | $L^{126}$ |
| 551. | $L^{111}$ | $L^{127}$ |
| 552. | $L^{111}$ | $L^{128}$ |
| 553. | $L^{111}$ | $L^{129}$ |
| 554. | $L^{111}$ | $L^{130}$ |
| 555. | $L^{111}$ | $L^{131}$ |
| 556. | $L^{111}$ | $L^{132}$ |
| 557. | $L^{111}$ | $L^{133}$ |
| 558. | $L^{111}$ | $L^{134}$ |
| 559. | $L^{111}$ | $L^{135}$ |
| 560. | $L^{111}$ | $L^{136}$ |
| 561. | $L^{111}$ | $L^{137}$ |
| 562. | $L^{111}$ | $L^{138}$ |
| 563. | $L^{111}$ | $L^{139}$ |
| 564. | $L^{111}$ | $L^{140}$ |
| 565. | $L^{111}$ | $L^{141}$ |
| 566. | $L^{111}$ | $L^{142}$ |
| 567. | $L^{111}$ | $L^{143}$ |

| Compound Number | L¹ | L² |
|---|---|---|
| 568. | $L^{111}$ | $L^{144}$ |
| 569. | $L^{111}$ | $L^{145}$ |
| 570. | $L^{111}$ | $L^{146}$ |
| 571. | $L^{111}$ | $L^{147}$ |
| 572. | $L^{111}$ | $L^{148}$ |
| 573. | $L^{111}$ | $L^{149}$ |
| 574. | $L^{111}$ | $L^{150}$ |
| 575. | $L^{111}$ | $L^{151}$ |
| 576. | $L^{111}$ | $L^{152}$ |
| 577. | $L^{111}$ | $L^{153}$ |
| 578. | $L^{111}$ | $L^{154}$ |
| 579. | $L^{111}$ | $L^{155}$ |
| 580. | $L^{111}$ | $L^{156}$ |
| 581. | $L^{111}$ | $L^{157}$ |
| 582. | $L^{111}$ | $L^{158}$ |
| 583. | $L^{111}$ | $L^{159}$ |
| 584. | $L^{112}$ | $L^{113}$ |
| 585. | $L^{112}$ | $L^{114}$ |
| 586. | $L^{112}$ | $L^{115}$ |
| 587. | $L^{112}$ | $L^{116}$ |
| 588. | $L^{112}$ | $L^{117}$ |
| 589. | $L^{112}$ | $L^{118}$ |
| 590. | $L^{112}$ | $L^{119}$ |
| 591. | $L^{112}$ | $L^{120}$ |
| 592. | $L^{112}$ | $L^{121}$ |
| 593. | $L^{112}$ | $L^{122}$ |
| 594. | $L^{112}$ | $L^{123}$ |
| 595. | $L^{112}$ | $L^{124}$ |
| 596. | $L^{112}$ | $L^{125}$ |
| 597. | $L^{112}$ | $L^{126}$ |
| 598. | $L^{112}$ | $L^{127}$ |
| 599. | $L^{112}$ | $L^{128}$ |
| 600. | $L^{112}$ | $L^{129}$ |
| 601. | $L^{112}$ | $L^{130}$ |
| 602. | $L^{112}$ | $L^{131}$ |
| 603. | $L^{112}$ | $L^{132}$ |
| 604. | $L^{112}$ | $L^{133}$ |
| 605. | $L^{112}$ | $L^{134}$ |
| 606. | $L^{112}$ | $L^{135}$ |
| 607. | $L^{112}$ | $L^{136}$ |
| 608. | $L^{112}$ | $L^{137}$ |
| 609. | $L^{112}$ | $L^{138}$ |
| 610. | $L^{112}$ | $L^{139}$ |
| 611. | $L^{112}$ | $L^{140}$ |
| 612. | $L^{112}$ | $L^{141}$ |
| 613. | $L^{112}$ | $L^{142}$ |
| 614. | $L^{112}$ | $L^{143}$ |
| 615. | $L^{112}$ | $L^{144}$ |
| 616. | $L^{112}$ | $L^{145}$ |
| 617. | $L^{112}$ | $L^{146}$ |
| 618. | $L^{112}$ | $L^{147}$ |
| 619. | $L^{112}$ | $L^{148}$ |
| 620. | $L^{112}$ | $L^{149}$ |
| 621. | $L^{112}$ | $L^{150}$ |
| 622. | $L^{112}$ | $L^{151}$ |
| 623. | $L^{112}$ | $L^{152}$ |
| 624. | $L^{112}$ | $L^{153}$ |
| 625. | $L^{112}$ | $L^{154}$ |
| 626. | $L^{112}$ | $L^{155}$ |
| 627. | $L^{112}$ | $L^{156}$ |
| 628. | $L^{112}$ | $L^{157}$ |
| 629. | $L^{112}$ | $L^{158}$ |
| 630. | $L^{112}$ | $L^{159}$ |
| 631. | $L^{113}$ | $L^{114}$ |
| 632. | $L^{113}$ | $L^{115}$ |
| 633. | $L^{113}$ | $L^{116}$ |
| 634. | $L^{113}$ | $L^{117}$ |
| 635. | $L^{113}$ | $L^{118}$ |
| 636. | $L^{113}$ | $L^{119}$ |
| 637. | $L^{113}$ | $L^{120}$ |
| 638. | $L^{113}$ | $L^{121}$ |
| 639. | $L^{113}$ | $L^{122}$ |
| 640. | $L^{113}$ | $L^{123}$ |
| 641. | $L^{113}$ | $L^{124}$ |
| 642. | $L^{113}$ | $L^{125}$ |
| 643. | $L^{113}$ | $L^{126}$ |
| 644. | $L^{113}$ | $L^{127}$ |
| 645. | $L^{113}$ | $L^{128}$ |
| 646. | $L^{113}$ | $L^{129}$ |
| 647. | $L^{113}$ | $L^{130}$ |
| 648. | $L^{113}$ | $L^{131}$ |
| 649. | $L^{113}$ | $L^{132}$ |
| 650. | $L^{113}$ | $L^{133}$ |
| 651. | $L^{113}$ | $L^{134}$ |
| 652. | $L^{113}$ | $L^{135}$ |
| 653. | $L^{113}$ | $L^{136}$ |
| 654. | $L^{113}$ | $L^{137}$ |
| 655. | $L^{113}$ | $L^{138}$ |
| 656. | $L^{113}$ | $L^{139}$ |
| 657. | $L^{113}$ | $L^{140}$ |
| 658. | $L^{113}$ | $L^{141}$ |
| 659. | $L^{113}$ | $L^{142}$ |
| 660. | $L^{113}$ | $L^{143}$ |
| 661. | $L^{113}$ | $L^{144}$ |
| 662. | $L^{113}$ | $L^{145}$ |
| 663. | $L^{113}$ | $L^{146}$ |
| 664. | $L^{113}$ | $L^{147}$ |
| 665. | $L^{113}$ | $L^{148}$ |
| 666. | $L^{113}$ | $L^{149}$ |
| 667. | $L^{113}$ | $L^{150}$ |
| 668. | $L^{113}$ | $L^{151}$ |
| 669. | $L^{113}$ | $L^{152}$ |
| 670. | $L^{113}$ | $L^{153}$ |
| 671. | $L^{113}$ | $L^{154}$ |
| 672. | $L^{113}$ | $L^{155}$ |
| 673. | $L^{113}$ | $L^{156}$ |
| 674. | $L^{113}$ | $L^{157}$ |
| 675. | $L^{113}$ | $L^{158}$ |
| 676. | $L^{113}$ | $L^{159}$ |
| 677. | $L^{114}$ | $L^{115}$ |
| 678. | $L^{114}$ | $L^{116}$ |
| 679. | $L^{114}$ | $L^{117}$ |
| 680. | $L^{114}$ | $L^{118}$ |
| 681. | $L^{114}$ | $L^{119}$ |
| 682. | $L^{114}$ | $L^{120}$ |
| 683. | $L^{114}$ | $L^{121}$ |
| 684. | $L^{114}$ | $L^{122}$ |
| 685. | $L^{114}$ | $L^{123}$ |
| 686. | $L^{114}$ | $L^{124}$ |
| 687. | $L^{114}$ | $L^{125}$ |
| 688. | $L^{114}$ | $L^{126}$ |
| 689. | $L^{114}$ | $L^{127}$ |
| 690. | $L^{114}$ | $L^{128}$ |
| 691. | $L^{114}$ | $L^{129}$ |
| 692. | $L^{114}$ | $L^{130}$ |
| 693. | $L^{114}$ | $L^{131}$ |
| 694. | $L^{114}$ | $L^{132}$ |
| 695. | $L^{114}$ | $L^{133}$ |
| 696. | $L^{114}$ | $L^{134}$ |
| 697. | $L^{114}$ | $L^{135}$ |
| 698. | $L^{114}$ | $L^{136}$ |
| 699. | $L^{114}$ | $L^{137}$ |
| 700. | $L^{114}$ | $L^{138}$ |
| 701. | $L^{114}$ | $L^{139}$ |
| 702. | $L^{114}$ | $L^{140}$ |
| 703. | $L^{114}$ | $L^{141}$ |
| 704. | $L^{114}$ | $L^{142}$ |
| 705. | $L^{114}$ | $L^{143}$ |
| 706. | $L^{114}$ | $L^{144}$ |
| 707. | $L^{114}$ | $L^{145}$ |
| 708. | $L^{114}$ | $L^{146}$ |
| 709. | $L^{114}$ | $L^{147}$ |
| 710. | $L^{114}$ | $L^{148}$ |
| 711. | $L^{114}$ | $L^{149}$ |
| 712. | $L^{114}$ | $L^{150}$ |
| 713. | $L^{114}$ | $L^{151}$ |
| 714. | $L^{114}$ | $L^{152}$ |
| 715. | $L^{114}$ | $L^{153}$ |
| 716. | $L^{114}$ | $L^{154}$ |
| 717. | $L^{114}$ | $L^{155}$ |
| 718. | $L^{114}$ | $L^{156}$ |
| 719. | $L^{114}$ | $L^{157}$ |

| Compound Number | L¹ | L² |
| --- | --- | --- |
| 720. | $L^{114}$ | $L^{158}$ |
| 721. | $L^{114}$ | $L^{159}$ |
| 722. | $L^{115}$ | $L^{116}$ |
| 723. | $L^{115}$ | $L^{117}$ |
| 724. | $L^{115}$ | $L^{118}$ |
| 725. | $L^{115}$ | $L^{119}$ |
| 726. | $L^{115}$ | $L^{120}$ |
| 727. | $L^{115}$ | $L^{121}$ |
| 728. | $L^{115}$ | $L^{122}$ |
| 729. | $L^{115}$ | $L^{123}$ |
| 730. | $L^{115}$ | $L^{124}$ |
| 731. | $L^{115}$ | $L^{125}$ |
| 732. | $L^{115}$ | $L^{126}$ |
| 733. | $L^{115}$ | $L^{127}$ |
| 734. | $L^{115}$ | $L^{128}$ |
| 735. | $L^{115}$ | $L^{129}$ |
| 736. | $L^{115}$ | $L^{130}$ |
| 737. | $L^{115}$ | $L^{131}$ |
| 738. | $L^{115}$ | $L^{132}$ |
| 739. | $L^{115}$ | $L^{133}$ |
| 740. | $L^{115}$ | $L^{134}$ |
| 741. | $L^{115}$ | $L^{135}$ |
| 742. | $L^{115}$ | $L^{136}$ |
| 743. | $L^{115}$ | $L^{137}$ |
| 744. | $L^{115}$ | $L^{138}$ |
| 745. | $L^{115}$ | $L^{139}$ |
| 746. | $L^{115}$ | $L^{140}$ |
| 747. | $L^{115}$ | $L^{141}$ |
| 748. | $L^{115}$ | $L^{142}$ |
| 749. | $L^{115}$ | $L^{143}$ |
| 750. | $L^{115}$ | $L^{144}$ |
| 751. | $L^{115}$ | $L^{145}$ |
| 752. | $L^{115}$ | $L^{146}$ |
| 753. | $L^{115}$ | $L^{147}$ |
| 754. | $L^{115}$ | $L^{148}$ |
| 755. | $L^{115}$ | $L^{149}$ |
| 756. | $L^{115}$ | $L^{150}$ |
| 757. | $L^{115}$ | $L^{151}$ |
| 758. | $L^{115}$ | $L^{152}$ |
| 759. | $L^{115}$ | $L^{153}$ |
| 760. | $L^{115}$ | $L^{154}$ |
| 761. | $L^{115}$ | $L^{155}$ |
| 762. | $L^{115}$ | $L^{156}$ |
| 763. | $L^{115}$ | $L^{157}$ |
| 764. | $L^{115}$ | $L^{158}$ |
| 765. | $L^{115}$ | $L^{159}$ |
| 766. | $L^{116}$ | $L^{117}$ |
| 767. | $L^{116}$ | $L^{118}$ |
| 768. | $L^{116}$ | $L^{119}$ |
| 769. | $L^{11}$ | $L^{120}$ |
| 770. | $L^{11}$ | $L^{121}$ |
| 771. | $L^{11}$ | $L^{122}$ |
| 772. | $L^{11}$ | $L^{123}$ |
| 773. | $L^{11}$ | $L^{124}$ |
| 774. | $L^{11}$ | $L^{125}$ |
| 775. | $L^{11}$ | $L^{126}$ |
| 776. | $L^{11}$ | $L^{127}$ |
| 777. | $L^{11}$ | $L^{128}$ |
| 778. | $L^{11}$ | $L^{129}$ |
| 779. | $L^{11}$ | $L^{130}$ |
| 780. | $L^{11}$ | $L^{131}$ |
| 781. | $L^{11}$ | $L^{132}$ |
| 782. | $L^{11}$ | $L^{133}$ |
| 783. | $L^{11}$ | $L^{134}$ |
| 784. | $L^{11}$ | $L^{135}$ |
| 785. | $L^{11}$ | $L^{136}$ |
| 786. | $L^{11}$ | $L^{137}$ |
| 787. | $L^{11}$ | $L^{138}$ |
| 788. | $L^{11}$ | $L^{139}$ |
| 789. | $L^{11}$ | $L^{140}$ |
| 790. | $L^{11}$ | $L^{141}$ |
| 791. | $L^{11}$ | $L^{142}$ |
| 792. | $L^{11}$ | $L^{143}$ |
| 793. | $L^{11}$ | $L^{144}$ |
| 794. | $L^{11}$ | $L^{145}$ |
| 795. | $L^{11}$ | $L^{146}$ |
| 796. | $L^{11}$ | $L^{147}$ |
| 797. | $L^{11}$ | $L^{148}$ |
| 798. | $L^{11}$ | $L^{149}$ |
| 799. | $L^{11}$ | $L^{150}$ |
| 800. | $L^{11}$ | $L^{151}$ |
| 801. | $L^{11}$ | $L^{152}$ |
| 802. | $L^{11}$ | $L^{153}$ |
| 803. | $L^{11}$ | $L^{154}$ |
| 804. | $L^{11}$ | $L^{155}$ |
| 805. | $L^{11}$ | $L^{156}$ |
| 806. | $L^{11}$ | $L^{157}$ |
| 807. | $L^{11}$ | $L^{158}$ |
| 808. | $L^{11}$ | $L^{159}$ |
| 809. | $L^{11}$ | $L^{118}$ |
| 810. | $L^{11}$ | $L^{119}$ |
| 811. | $L^{11}$ | $L^{120}$ |
| 812. | $L^{11}$ | $L^{121}$ |
| 813. | $L^{11}$ | $L^{122}$ |
| 814. | $L^{11}$ | $L^{123}$ |
| 815. | $L^{11}$ | $L^{124}$ |
| 816. | $L^{11}$ | $L^{125}$ |
| 817. | $L^{11}$ | $L^{126}$ |
| 818. | $L^{11}$ | $L^{127}$ |
| 819. | $L^{11}$ | $L^{128}$ |
| 820. | $L^{11}$ | $L^{129}$ |
| 821. | $L^{11}$ | $L^{130}$ |
| 822. | $L^{11}$ | $L^{131}$ |
| 823. | $L^{11}$ | $L^{132}$ |
| 824. | $L^{11}$ | $L^{133}$ |
| 825. | $L^{11}$ | $L^{134}$ |
| 826. | $L^{11}$ | $L^{135}$ |
| 827. | $L^{11}$ | $L^{136}$ |
| 828. | $L^{11}$ | $L^{137}$ |
| 829. | $L^{11}$ | $L^{138}$ |
| 830. | $L^{11}$ | $L^{139}$ |
| 831. | $L^{11}$ | $L^{140}$ |
| 832. | $L^{11}$ | $L^{141}$ |
| 833. | $L^{11}$ | $L^{142}$ |
| 834. | $L^{11}$ | $L^{143}$ |
| 835. | $L^{11}$ | $L^{144}$ |
| 836. | $L^{11}$ | $L^{145}$ |
| 837. | $L^{11}$ | $L^{146}$ |
| 838. | $L^{11}$ | $L^{147}$ |
| 839. | $L^{11}$ | $L^{148}$ |
| 840. | $L^{11}$ | $L^{149}$ |
| 841. | $L^{11}$ | $L^{150}$ |
| 842. | $L^{11}$ | $L^{151}$ |
| 843. | $L^{11}$ | $L^{152}$ |
| 844. | $L^{11}$ | $L^{153}$ |
| 845. | $L^{11}$ | $L^{154}$ |
| 846. | $L^{11}$ | $L^{155}$ |
| 847. | $L^{11}$ | $L^{156}$ |
| 848. | $L^{11}$ | $L^{157}$ |
| 849. | $L^{11}$ | $L^{158}$ |
| 850. | $L^{11}$ | $L^{159}$ |
| 851. | $L^{11}$ | $L^{119}$ |
| 852. | $L^{11}$ | $L^{120}$ |
| 853. | $L^{11}$ | $L^{121}$ |
| 854. | $L^{11}$ | $L^{122}$ |
| 855. | $L^{11}$ | $L^{123}$ |
| 856. | $L^{11}$ | $L^{124}$ |
| 857. | $L^{11}$ | $L^{125}$ |
| 858. | $L^{11}$ | $L^{126}$ |
| 859. | $L^{11}$ | $L^{127}$ |
| 860. | $L^{11}$ | $L^{128}$ |
| 861. | $L^{11}$ | $L^{129}$ |
| 862. | $L^{11}$ | $L^{130}$ |
| 863. | $L^{11}$ | $L^{131}$ |
| 864. | $L^{11}$ | $L^{132}$ |
| 865. | $L^{11}$ | $L^{133}$ |
| 866. | $L^{11}$ | $L^{134}$ |
| 867. | $L^{11}$ | $L^{135}$ |
| 868. | $L^{11}$ | $L^{136}$ |
| 869. | $L^{11}$ | $L^{137}$ |
| 870. | $L^{11}$ | $L^{138}$ |
| 871. | $L^{11}$ | $L^{139}$ |

| Compound Number | L¹ | L² |
|---|---|---|
| 872. | $L^{11}$ | $L^{140}$ |
| 873. | $L^{11}$ | $L^{141}$ |
| 874. | $L^{11}$ | $L^{142}$ |
| 875. | $L^{11}$ | $L^{143}$ |
| 876. | $L^{11}$ | $L^{144}$ |
| 877. | $L^{11}$ | $L^{145}$ |
| 878. | $L^{11}$ | $L^{146}$ |
| 879. | $L^{11}$ | $L^{147}$ |
| 880. | $L^{11}$ | $L^{148}$ |
| 881. | $L^{11}$ | $L^{149}$ |
| 882. | $L^{11}$ | $L^{150}$ |
| 883. | $L^{11}$ | $L^{151}$ |
| 884. | $L^{11}$ | $L^{152}$ |
| 885. | $L^{11}$ | $L^{153}$ |
| 886. | $L^{11}$ | $L^{154}$ |
| 887. | $L^{11}$ | $L^{155}$ |
| 888. | $L^{11}$ | $L^{156}$ |
| 889. | $L^{11}$ | $L^{157}$ |
| 890. | $L^{11}$ | $L^{158}$ |
| 891. | $L^{11}$ | $L^{159}$ |
| 892. | $L^{11}$ | $L^{120}$ |
| 893. | $L^{11}$ | $L^{121}$ |
| 894. | $L^{11}$ | $L^{122}$ |
| 895. | $L^{11}$ | $L^{123}$ |
| 896. | $L^{11}$ | $L^{124}$ |
| 897. | $L^{11}$ | $L^{125}$ |
| 898. | $L^{11}$ | $L^{126}$ |
| 899. | $L^{11}$ | $L^{127}$ |
| 900. | $L^{11}$ | $L^{128}$ |
| 901. | $L^{11}$ | $L^{129}$ |
| 902. | $L^{11}$ | $L^{130}$ |
| 903. | $L^{11}$ | $L^{131}$ |
| 904. | $L^{11}$ | $L^{132}$ |
| 905. | $L^{11}$ | $L^{133}$ |
| 906. | $L^{11}$ | $L^{134}$ |
| 907. | $L^{11}$ | $L^{135}$ |
| 908. | $L^{11}$ | $L^{136}$ |
| 909. | $L^{11}$ | $L^{137}$ |
| 910. | $L^{11}$ | $L^{138}$ |
| 911. | $L^{11}$ | $L^{139}$ |
| 912. | $L^{11}$ | $L^{140}$ |
| 913. | $L^{11}$ | $L^{141}$ |
| 914. | $L^{11}$ | $L^{142}$ |
| 915. | $L^{11}$ | $L^{143}$ |
| 916. | $L^{11}$ | $L^{144}$ |
| 917. | $L^{11}$ | $L^{145}$ |
| 918. | $L^{11}$ | $L^{146}$ |
| 919. | $L^{11}$ | $L^{147}$ |
| 920. | $L^{11}$ | $L^{148}$ |
| 921. | $L^{11}$ | $L^{149}$ |
| 922. | $L^{11}$ | $L^{150}$ |
| 923. | $L^{11}$ | $L^{151}$ |
| 924. | $L^{11}$ | $L^{152}$ |
| 925. | $L^{11}$ | $L^{153}$ |
| 926. | $L^{11}$ | $L^{154}$ |
| 927. | $L^{11}$ | $L^{155}$ |
| 928. | $L^{11}$ | $L^{156}$ |
| 929. | $L^{11}$ | $L^{157}$ |
| 930. | $L^{11}$ | $L^{158}$ |
| 931. | $L^{11}$ | $L^{159}$ |
| 932. | $L^{12}$ | $L^{121}$ |
| 933. | $L^{12}$ | $L^{122}$ |
| 934. | $L^{12}$ | $L^{123}$ |
| 935. | $L^{12}$ | $L^{124}$ |
| 936. | $L^{12}$ | $L^{125}$ |
| 937. | $L^{12}$ | $L^{126}$ |
| 938. | $L^{12}$ | $L^{127}$ |
| 939. | $L^{12}$ | $L^{128}$ |
| 940. | $L^{12}$ | $L^{129}$ |
| 941. | $L^{12}$ | $L^{130}$ |
| 942. | $L^{12}$ | $L^{131}$ |
| 943. | $L^{12}$ | $L^{132}$ |
| 944. | $L^{12}$ | $L^{133}$ |
| 945. | $L^{12}$ | $L^{134}$ |
| 946. | $L^{12}$ | $L^{135}$ |
| 947. | $L^{12}$ | $L^{136}$ |
| 948. | $L^{12}$ | $L^{137}$ |
| 949. | $L^{12}$ | $L^{138}$ |
| 950. | $L^{12}$ | $L^{139}$ |
| 951. | $L^{12}$ | $L^{140}$ |
| 952. | $L^{12}$ | $L^{141}$ |
| 953. | $L^{12}$ | $L^{142}$ |
| 954. | $L^{12}$ | $L^{143}$ |
| 955. | $L^{12}$ | $L^{144}$ |
| 956. | $L^{12}$ | $L^{145}$ |
| 957. | $L^{12}$ | $L^{146}$ |
| 958. | $L^{12}$ | $L^{147}$ |
| 959. | $L^{12}$ | $L^{148}$ |
| 960. | $L^{12}$ | $L^{149}$ |
| 961. | $L^{12}$ | $L^{150}$ |
| 962. | $L^{12}$ | $L^{151}$ |
| 963. | $L^{12}$ | $L^{152}$ |
| 964. | $L^{12}$ | $L^{153}$ |
| 965. | $L^{12}$ | $L^{154}$ |
| 966. | $L^{12}$ | $L^{155}$ |
| 967. | $L^{12}$ | $L^{156}$ |
| 968. | $L^{12}$ | $L^{157}$ |
| 969. | $L^{12}$ | $L^{158}$ |
| 970. | $L^{12}$ | $L^{159}$ |
| 971. | $L^{12}$ | $L^{122}$ |
| 972. | $L^{12}$ | $L^{123}$ |
| 973. | $L^{12}$ | $L^{124}$ |
| 974. | $L^{12}$ | $L^{125}$ |
| 975. | $L^{12}$ | $L^{126}$ |
| 976. | $L^{12}$ | $L^{127}$ |
| 977. | $L^{12}$ | $L^{128}$ |
| 978. | $L^{12}$ | $L^{129}$ |
| 979. | $L^{12}$ | $L^{130}$ |
| 980. | $L^{12}$ | $L^{131}$ |
| 981. | $L^{12}$ | $L^{132}$ |
| 982. | $L^{12}$ | $L^{133}$ |
| 983. | $L^{12}$ | $L^{134}$ |
| 984. | $L^{12}$ | $L^{135}$ |
| 985. | $L^{12}$ | $L^{136}$ |
| 986. | $L^{12}$ | $L^{137}$ |
| 987. | $L^{12}$ | $L^{138}$ |
| 988. | $L^{12}$ | $L^{139}$ |
| 989. | $L^{12}$ | $L^{140}$ |
| 990. | $L^{12}$ | $L^{141}$ |
| 991. | $L^{12}$ | $L^{142}$ |
| 992. | $L^{12}$ | $L^{143}$ |
| 993. | $L^{12}$ | $L^{144}$ |
| 994. | $L^{12}$ | $L^{145}$ |
| 995. | $L^{12}$ | $L^{146}$ |
| 996. | $L^{12}$ | $L^{147}$ |
| 997. | $L^{12}$ | $L^{148}$ |
| 998. | $L^{12}$ | $L^{149}$ |
| 999. | $L^{12}$ | $L^{150}$ |
| 1000. | $L^{12}$ | $L^{151}$ |
| 1001. | $L^{12}$ | $L^{152}$ |
| 1002. | $L^{12}$ | $L^{153}$ |
| 1003. | $L^{12}$ | $L^{154}$ |
| 1004. | $L^{12}$ | $L^{155}$ |
| 1005. | $L^{12}$ | $L^{156}$ |
| 1006. | $L^{12}$ | $L^{157}$ |
| 1007. | $L^{12}$ | $L^{158}$ |
| 1008. | $L^{12}$ | $L^{159}$ |
| 1009. | $L^{12}$ | $L^{123}$ |
| 1010. | $L^{12}$ | $L^{124}$ |
| 1011. | $L^{12}$ | $L^{125}$ |
| 1012. | $L^{12}$ | $L^{126}$ |
| 1013. | $L^{12}$ | $L^{127}$ |
| 1014. | $L^{12}$ | $L^{128}$ |
| 1015. | $L^{12}$ | $L^{129}$ |
| 1016. | $L^{12}$ | $L^{130}$ |
| 1017. | $L^{12}$ | $L^{131}$ |
| 1018. | $L^{12}$ | $L^{132}$ |
| 1019. | $L^{12}$ | $L^{133}$ |
| 1020. | $L^{12}$ | $L^{134}$ |
| 1021. | $L^{12}$ | $L^{135}$ |
| 1022. | $L^{12}$ | $L^{136}$ |
| 1023. | $L^{12}$ | $L^{137}$ |

| Compound Number | $L^1$ | $L^2$ |
|---|---|---|
| 1024. | $L^{12}$ | $L^{138}$ |
| 1025. | $L^{12}$ | $L^{139}$ |
| 1026. | $L^{12}$ | $L^{140}$ |
| 1027. | $L^{12}$ | $L^{141}$ |
| 1028. | $L^{12}$ | $L^{142}$ |
| 1029. | $L^{12}$ | $L^{143}$ |
| 1030. | $L^{12}$ | $L^{144}$ |
| 1031. | $L^{12}$ | $L^{145}$ |
| 1032. | $L^{12}$ | $L^{146}$ |
| 1033. | $L^{12}$ | $L^{147}$ |
| 1034. | $L^{12}$ | $L^{148}$ |
| 1035. | $L^{12}$ | $L^{149}$ |
| 1036. | $L^{12}$ | $L^{150}$ |
| 1037. | $L^{12}$ | $L^{151}$ |
| 1038. | $L^{12}$ | $L^{152}$ |
| 1039. | $L^{12}$ | $L^{153}$ |
| 1040. | $L^{12}$ | $L^{154}$ |
| 1041. | $L^{12}$ | $L^{155}$ |
| 1042. | $L^{12}$ | $L^{156}$ |
| 1043. | $L^{12}$ | $L^{157}$ |
| 1044. | $L^{12}$ | $L^{158}$ |
| 1045. | $L^{12}$ | $L^{159}$ |
| 1046. | $L^{12}$ | $L^{124}$ |
| 1047. | $L^{12}$ | $L^{125}$ |
| 1048. | $L^{12}$ | $L^{126}$ |
| 1049. | $L^{12}$ | $L^{127}$ |
| 1050. | $L^{12}$ | $L^{128}$ |
| 1051. | $L^{12}$ | $L^{129}$ |
| 1052. | $L^{12}$ | $L^{130}$ |
| 1053. | $L^{12}$ | $L^{131}$ |
| 1054. | $L^{12}$ | $L^{132}$ |
| 1055. | $L^{12}$ | $L^{133}$ |
| 1056. | $L^{12}$ | $L^{134}$ |
| 1057. | $L^{12}$ | $L^{135}$ |
| 1058. | $L^{12}$ | $L^{136}$ |
| 1059. | $L^{12}$ | $L^{137}$ |
| 1060. | $L^{12}$ | $L^{138}$ |
| 1061. | $L^{12}$ | $L^{139}$ |
| 1062. | $L^{12}$ | $L^{140}$ |
| 1063. | $L^{12}$ | $L^{141}$ |
| 1064. | $L^{12}$ | $L^{142}$ |
| 1065. | $L^{12}$ | $L^{143}$ |
| 1066. | $L^{12}$ | $L^{144}$ |
| 1067. | $L^{12}$ | $L^{145}$ |
| 1068. | $L^{12}$ | $L^{146}$ |
| 1069. | $L^{12}$ | $L^{147}$ |
| 1070. | $L^{12}$ | $L^{148}$ |
| 1071. | $L^{12}$ | $L^{149}$ |
| 1072. | $L^{12}$ | $L^{150}$ |
| 1073. | $L^{12}$ | $L^{151}$ |
| 1074. | $L^{12}$ | $L^{152}$ |
| 1075. | $L^{12}$ | $L^{153}$ |
| 1076. | $L^{12}$ | $L^{154}$ |
| 1077. | $L^{12}$ | $L^{155}$ |
| 1078. | $L^{12}$ | $L^{156}$ |
| 1079. | $L^{12}$ | $L^{157}$ |
| 1080. | $L^{12}$ | $L^{158}$ |
| 1081. | $L^{12}$ | $L^{159}$ |
| 1082. | $L^{12}$ | $L^{125}$ |
| 1083. | $L^{12}$ | $L^{126}$ |
| 1084. | $L^{12}$ | $L^{127}$ |
| 1085. | $L^{12}$ | $L^{128}$ |
| 1086. | $L^{12}$ | $L^{129}$ |
| 1087. | $L^{12}$ | $L^{130}$ |
| 1088. | $L^{12}$ | $L^{131}$ |
| 1089. | $L^{12}$ | $L^{132}$ |
| 1090. | $L^{12}$ | $L^{133}$ |
| 1091. | $L^{12}$ | $L^{134}$ |
| 1092. | $L^{12}$ | $L^{135}$ |
| 1093. | $L^{12}$ | $L^{136}$ |
| 1094. | $L^{12}$ | $L^{137}$ |
| 1095. | $L^{12}$ | $L^{138}$ |
| 1096. | $L^{12}$ | $L^{139}$ |
| 1097. | $L^{12}$ | $L^{140}$ |
| 1098. | $L^{12}$ | $L^{141}$ |
| 1099. | $L^{12}$ | $L^{142}$ |
| 1100. | $L^{12}$ | $L^{143}$ |
| 1102. | $L^{12}$ | $L^{144}$ |
| 1103. | $L^{12}$ | $L^{145}$ |
| 1104. | $L^{12}$ | $L^{146}$ |
| 1105. | $L^{12}$ | $L^{147}$ |
| 1106. | $L^{12}$ | $L^{148}$ |
| 1107. | $L^{12}$ | $L^{149}$ |
| 1108. | $L^{12}$ | $L^{150}$ |
| 1109. | $L^{12}$ | $L^{151}$ |
| 1110. | $L^{12}$ | $L^{152}$ |
| 1111. | $L^{12}$ | $L^{153}$ |
| 1112. | $L^{12}$ | $L^{154}$ |
| 1113. | $L^{12}$ | $L^{155}$ |
| 1114. | $L^{12}$ | $L^{156}$ |
| 1115. | $L^{12}$ | $L^{157}$ |
| 1116. | $L^{12}$ | $L^{158}$ |
| 1117. | $L^{12}$ | $L^{159}$ |
| 1118. | $L^{12}$ | $L^{127}$ |
| 1119. | $L^{12}$ | $L^{128}$ |
| 1120. | $L^{12}$ | $L^{129}$ |
| 1121. | $L^{12}$ | $L^{130}$ |
| 1122. | $L^{12}$ | $L^{131}$ |
| 1123. | $L^{12}$ | $L^{132}$ |
| 1124. | $L^{12}$ | $L^{133}$ |
| 1125. | $L^{12}$ | $L^{134}$ |
| 1126. | $L^{12}$ | $L^{135}$ |
| 1127. | $L^{12}$ | $L^{136}$ |
| 1128. | $L^{12}$ | $L^{137}$ |
| 1129. | $L^{12}$ | $L^{138}$ |
| 1130. | $L^{12}$ | $L^{139}$ |
| 1131. | $L^{12}$ | $L^{140}$ |
| 1132. | $L^{12}$ | $L^{141}$ |
| 1133. | $L^{12}$ | $L^{142}$ |
| 1134. | $L^{12}$ | $L^{143}$ |
| 1135. | $L^{12}$ | $L^{144}$ |
| 1136. | $L^{12}$ | $L^{145}$ |
| 1137. | $L^{12}$ | $L^{146}$ |
| 1138. | $L^{12}$ | $L^{147}$ |
| 1139. | $L^{12}$ | $L^{148}$ |
| 1140. | $L^{12}$ | $L^{149}$ |
| 1141. | $L^{12}$ | $L^{150}$ |
| 1142. | $L^{12}$ | $L^{151}$ |
| 1143. | $L^{12}$ | $L^{152}$ |
| 1144. | $L^{12}$ | $L^{153}$ |
| 1145. | $L^{12}$ | $L^{154}$ |
| 1146 | $L^{12}$ | $L^{155}$ |
| 1147. | $L^{12}$ | $L^{156}$ |
| 1148. | $L^{12}$ | $L^{157}$ |
| 1149. | $L^{12}$ | $L^{158}$ |
| 1150. | $L^{12}$ | $L^{159}$. |

13. The method of claim 1, wherein R is selected from the group consisting of methyl, ethyl, propyl, 1-methylethyl, butyl, 1-methylpropyl, 2-methylpropyl, 1,1-dimethylethyl, and cyclohexyl.

14. The method of claim 1, wherein R is alkyl or cycloalkyl.

15. The method of claim 1, wherein y is 2, 4, or 5.

16. The method of claim 1, wherein x is 2, 3, 5, or 6.

* * * * *